(12) United States Patent
Wang et al.

(10) Patent No.: US 11,417,601 B2
(45) Date of Patent: Aug. 16, 2022

(54) SEMICONDUCTOR DEVICE AND MANUFACTURING METHOD THEREOF

(71) Applicants: TAIWAN SEMICONDUCTOR MANUFACTURING CO., LTD., Hsinchu (TW); TSMC NANJING COMPANY LIMITED, Nanjing (CN); TSMC CHINA COMPANY LIMITED, Shanghai (CN)

(72) Inventors: Xin-Yong Wang, Shanghai (CN); Liu Han, Nanjing (CN); Li-Chun Tien, Tainan (TW); Chih-Liang Chen, Hsinchu (TW)

(73) Assignees: TAIWAN SEMICONDUCTOR MANUFACTURING CO., LTD., Hsinchu (TW); TSMC NANJING COMPANY LIMITED, Nanjing (CN); TSMC CHINA COMPANY LIMITED, Shanghai (CN)

(*) Notice: Subject to any disclaimer, the term of this patent is extended or adjusted under 35 U.S.C. 154(b) by 31 days.

(21) Appl. No.: 16/909,968

(22) Filed: Jun. 23, 2020

(65) Prior Publication Data
US 2021/0384128 A1     Dec. 9, 2021

(30) Foreign Application Priority Data
Jun. 5, 2020    (CN) .......................... 202010504218.6

(51) Int. Cl.
*H01L 27/11*    (2006.01)
*H01L 23/528*   (2006.01)
*H01L 21/8234*  (2006.01)
*H01L 23/522*   (2006.01)
*H01L 27/088*   (2006.01)

(52) U.S. Cl.
CPC .. *H01L 23/5286* (2013.01); *H01L 21/823431* (2013.01); *H01L 21/823475* (2013.01); *H01L 21/823481* (2013.01); *H01L 23/5226* (2013.01); *H01L 27/0886* (2013.01)

(58) Field of Classification Search
None
See application file for complete search history.

(56) References Cited

U.S. PATENT DOCUMENTS

| | | |
|---|---|---|
| 9,105,490 B2 | 8/2015 | Wang et al. |
| 9,209,247 B2 | 12/2015 | Colinge et al. |
| 9,236,267 B2 | 1/2016 | De et al. |
| 9,236,300 B2 | 1/2016 | Liaw |
| 9,406,804 B2 | 8/2016 | Huang et al. |
| 9,412,817 B2 | 8/2016 | Yang et al. |
| 9,412,828 B2 | 8/2016 | Ching et al. |

(Continued)

*Primary Examiner* — Joseph C. Nicely
*Assistant Examiner* — Lamont B Koo
(74) *Attorney, Agent, or Firm* — Maschoff Brennan

(57) ABSTRACT

A device includes a transistor, an insulating structure, a buried conductive line, and a buried via. The transistor is above a substrate and includes a source/drain region and a source/drain contact above the source/drain region. The insulating structure is above the substrate and laterally surrounds the transistor. The buried conductive line is in the insulating structure and spaced apart from the transistor. The buried via is in the insulating structure and interconnects the transistor and the buried conductive line. A height of the buried conductive line is greater than a height of the source/drain contact.

20 Claims, 58 Drawing Sheets

(56) References Cited

U.S. PATENT DOCUMENTS

| | | |
|---|---|---|
| 9,443,769 B2 | 9/2016 | Wang et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,548,366 B1 | 1/2017 | Ho et al. |
| 9,570,395 B1 | 2/2017 | Sengupta et al. |
| 9,576,814 B2 | 2/2017 | Wu et al. |
| 9,608,116 B2 | 3/2017 | Ching et al. |
| 9,831,183 B2 | 11/2017 | Lin et al. |
| 9,859,386 B2 | 1/2018 | Ho et al. |
| 2009/0166745 A1* | 7/2009 | Takeuchi ............ H01L 29/4238 257/368 |
| 2012/0276736 A1* | 11/2012 | Idani ................. H01L 21/76816 438/642 |
| 2018/0374791 A1 | 12/2018 | Smith et al. |
| 2019/0139891 A1 | 5/2019 | Ohtou et al. |
| 2020/0083288 A1* | 3/2020 | Kanaya ............... G11C 11/1655 |

\* cited by examiner

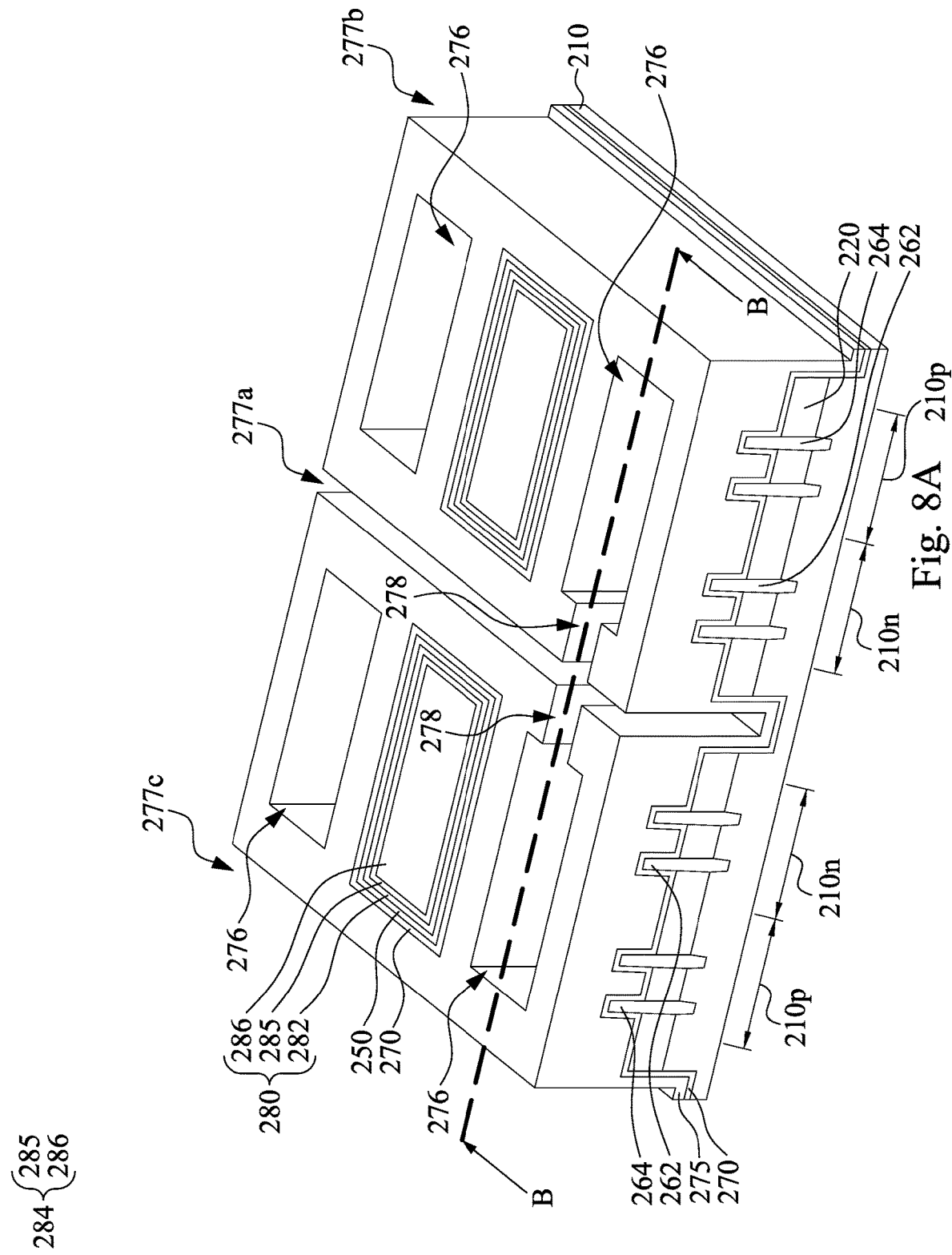

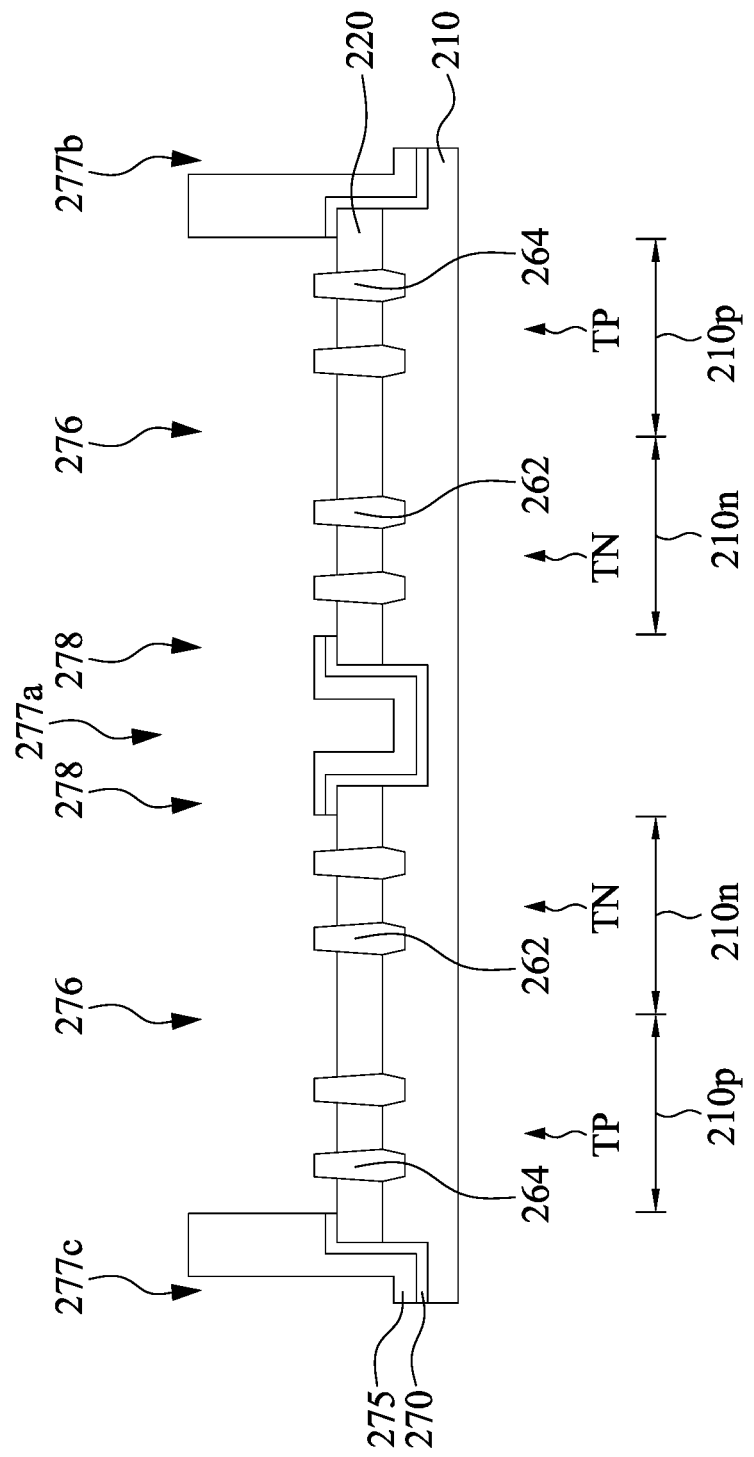

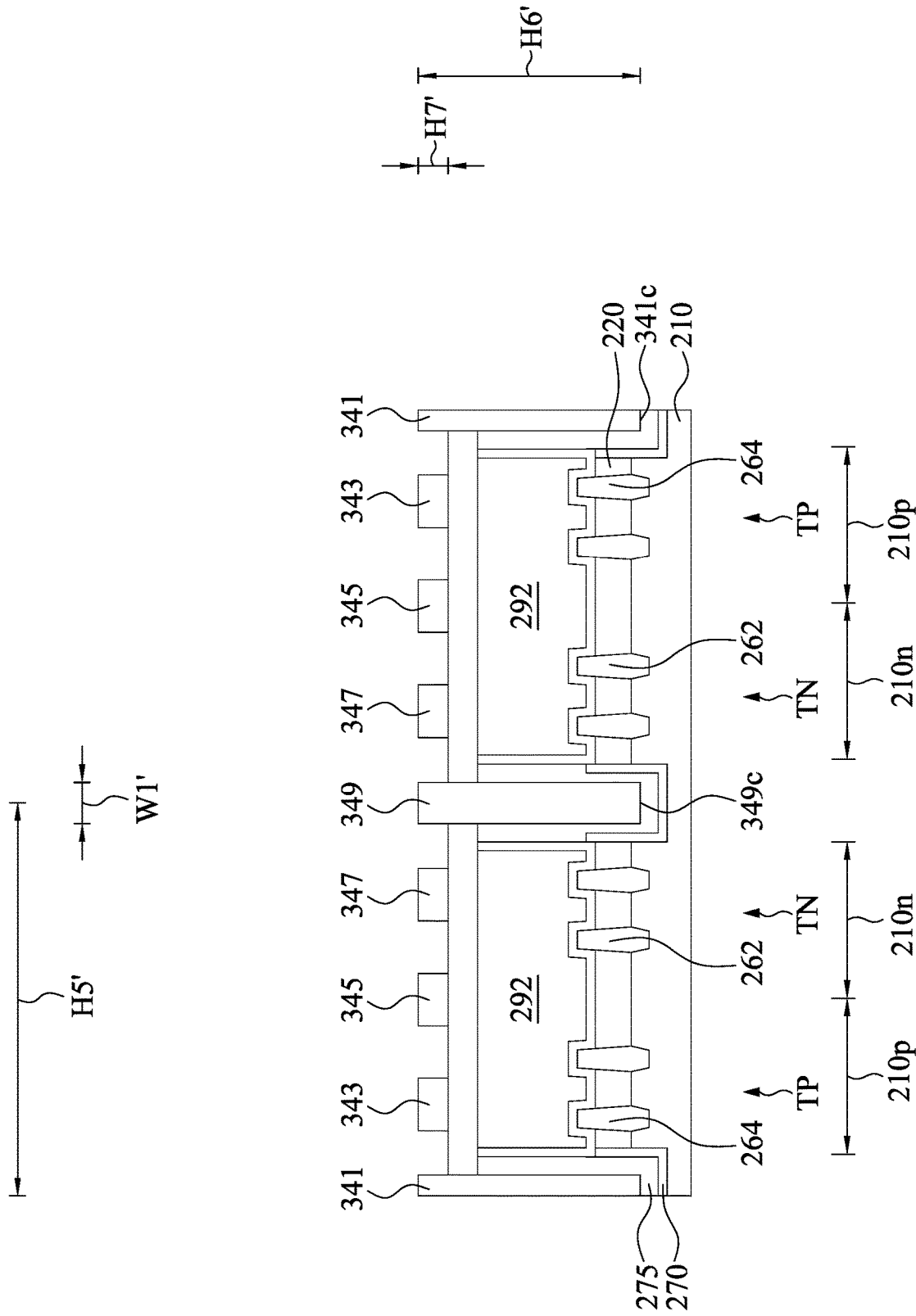

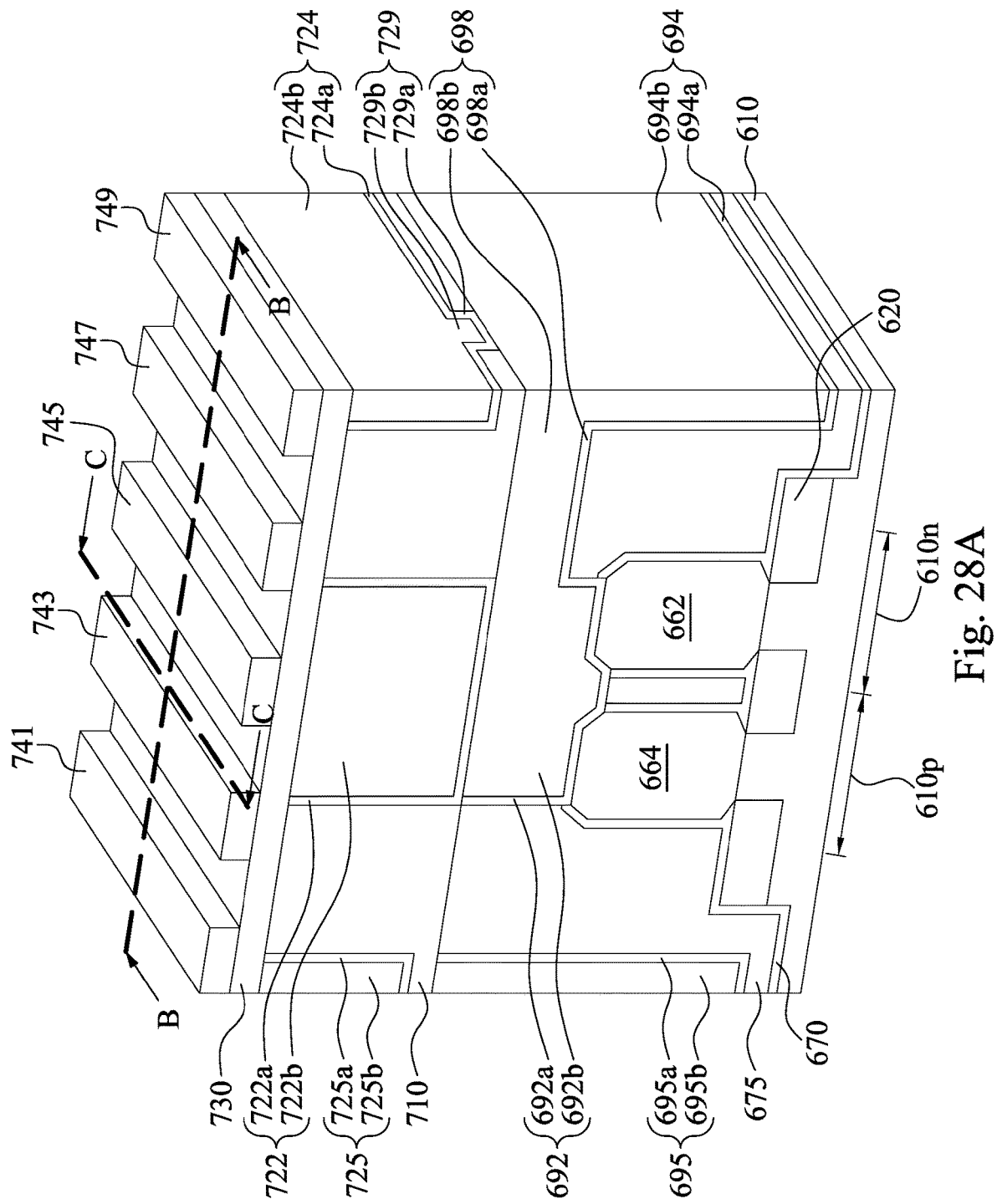

SEMICONDUCTOR DEVICE AND MANUFACTURING METHOD THEREOF

PRIORITY CLAIM AND CROSS-REFERENCE

The present application claims priority to China Application Serial Number 202010504218.6, filed Jun. 5, 2020, which is herein incorporated by reference.

BACKGROUND

In the formation of integrated circuits, standard cells are often used as base elements for building integrated circuits. The standard cells are placed and routed to form functional circuits. In some layouts of standard cells, power rails are laid out on the boundaries of the cells. When a plurality of standard cells are placed as rows, the power rails of the standard cells in the same row are connected with each other to form a long power rail that may expand through, for example, thousands or more standard cells. The power rails in neighboring rows are merged to form a power rail having a width twice as wide as the power rail in a stand-alone standard cell. For example, the VDD power rail of a row is merged with another VDD power rail of a neighboring row, and the VSS power rail of a row is merged with another VSS power rail of a neighboring row. Accordingly, with a circuit including a plurality of rows, the VDD power rails and VSS power rails are placed in an alternating pattern.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-12C illustrate a method for manufacturing a semiconductor device at various stages in accordance with some embodiments of the present disclosure.

FIG. 15B is a cross-sectional view taken along line B-B in FIG. 15A.

DETAILED DESCRIPTION

Figure 1:
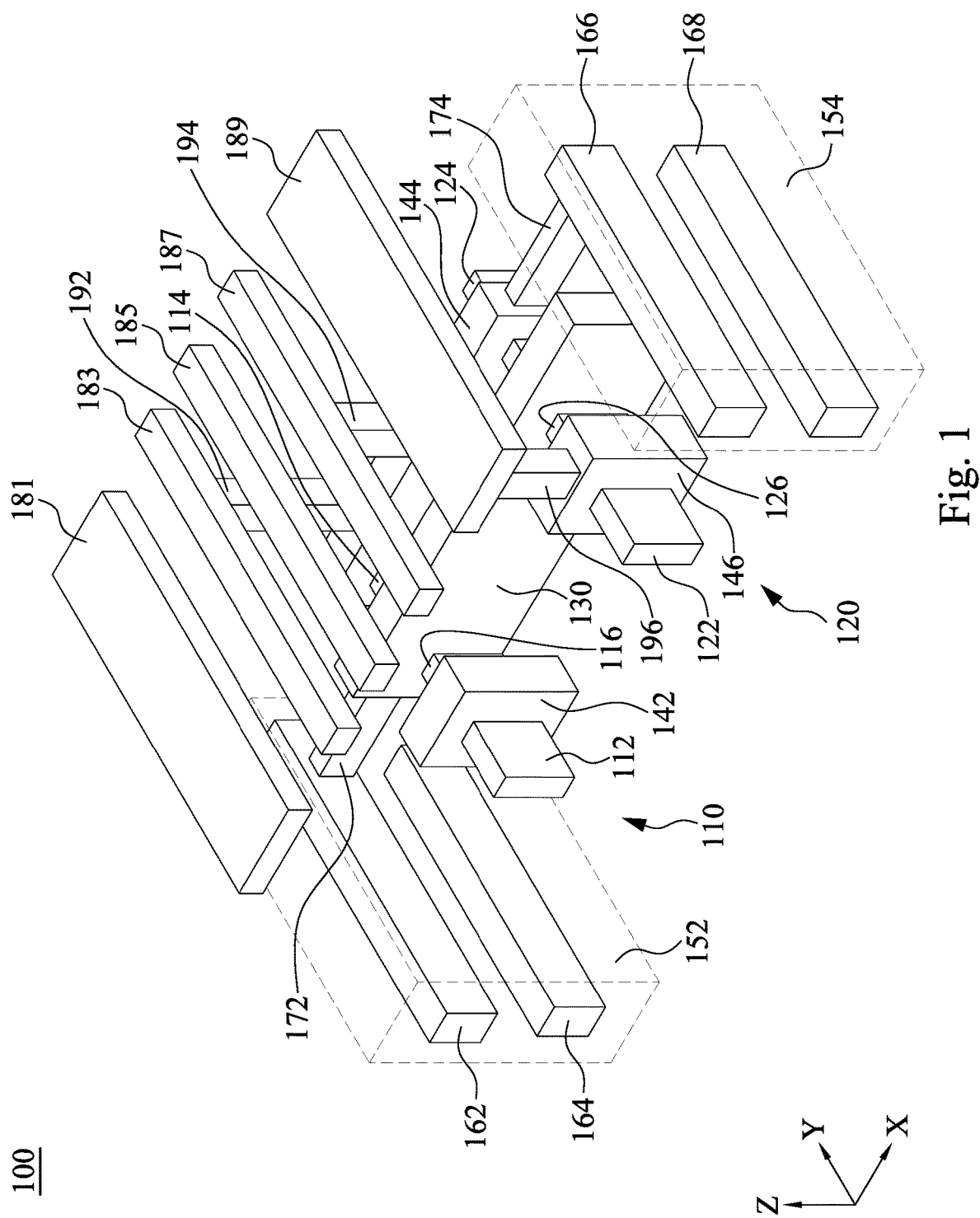
FIG. 1 is a schematic diagram of a perspective view of a layout structure corresponding to a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Some embodiments of the present disclosure relate to semiconductor devices having buried conductive line(s) to reduce the chip size. Although some implementations are illustrated below with regards to FinFETs, it will be appreciated that this concept is not limited to FinFETs, but is also applicable to other types of devices such as MOSFETs, HGAA devices, and the like.

FIG. 1 is a schematic diagram of a perspective view of a layout structure corresponding to a semiconductor device 100 in accordance with some embodiments of the present disclosure. In addition to the semiconductor device 100, FIG. 1 depicts X-axis, Y-axis, and Z-axis directions. FIG. 1 depicts a simplified version of the semiconductor device 100 for the purpose of illustrating the general spatial relationships between the various features; the specific spatial relationships of the various embodiments are discussed below with respect to FIGS. 2-32.

As illustratively shown in FIG. 1, the semiconductor device 100 includes two transistors 110 and 120 with independent sources and drains. The transistors 110 and 120 are adjacent to each other. In some embodiments, the transistors 110 and 120 are disposed on a substrate (not shown) underlying the transistors 110 and 120. In some embodiments, the transistors 110 and 120 are planar structures. In some other embodiments, the transistors 110 and 120 are FinFETs. In still some other embodiments, the transistors 110 and 120 may be formed at two nanosheets or stacks of two more nanosheets (not shown) that are separate from each other along a vertical direction (e.g., along the Z-axis direction). In some embodiments, the transistor 110 is a p-type FET and the transistor 120 is an n-type FET, or vice versa, and thus the FET device 100 is a CFET device. The substrate underlying the transistors 110 and 120 is any substrate suitable for epitaxial growth and/or is formed of any suitable crystalline material including, for example, silicon, silicon-germanium (SiGe), or the like.

In some embodiments, the term "p-type FET" as discussed above is referred to as a FET including a p-type dopant, e.g., boron, in, for example, doped source and drain regions of the p-type FET, and the term "n-type FET" as discussed above is referred to as a FET including an n-type dopant, e.g., phosphorous or arsenic, in, for example, doped source and drain regions of the n-type FET.

The term "nanosheet" refers to a substantially two-dimensional material that is a single monolayer thick or several monolayers thick, thereby having a thickness ranging from about 1 nanometer (nm) to about 100 nm in some embodiments, and has lateral dimensions from, for example, hundreds of nanometers to tens of microns. In some embodiments, a nanosheet or nanosheet stack defines a metal-like defined (MD) segment.

In FIG. 1, the transistor 110 includes a first source/drain 112, a gate 130, and a second source/drain 114 that are arranged along a horizontal direction (e.g., along the Y-axis direction). The gate 130 is arranged between the first source/drain 112 and the second source/drain 114 of the transistor 110 and extends in a predetermined direction (e.g., the X-axis direction). The gate 130 is configured to control a channel 116 between the first source/drain 112 and the second source/drain 114 of the transistor 110. The channel 116 as well as the first source/drain 112 and the second source/drain 114 are implemented by an active area formed with dopants in some embodiments.

The transistor 120 includes a first source/drain 122, the gate 130, and a second source/drain 124 that are arranged along a horizontal direction (e.g., along the Y-axis direction). Alternatively stated, the gate 130 is arranged as a common gate corresponding to the transistors 110 and 120, and the transistors 110 and 120 share the gate 130. Similarly, the gate 130 is arranged between the first source/drain 122 and the second source/drain 124 of the transistor 120. The gate 130 is configured to control a channel 126 between the first source/drain 122 and the second source/drain 124 of the transistor 120. The channel 126 as well as the first source/drain 122 and the second source/drain 124 are implemented by an active area formed with dopants in some embodiments. It is noted that the configuration of the transistors 110 and 120 in FIG. 1 is illustrative, and should not limit the present disclosure. In some other embodiments, the transistors 110 and 120 include individually gates.

In some embodiments, the term "source/drain" is referred to as a region that may be a source region or a drain region. Accordingly, for illustration in FIG. 1, when the first source/drain 112 of the transistor 110 is a source region, the second source/drain 114 of the transistor 110 is a drain region, and vice versa. Correspondingly, when the first source/drain 122 of the transistor 120 is a source region, the second source/drain 124 of the transistor 120 is a drain region, and vice versa.

The semiconductor device 100 further includes source/drain contacts 142, 144, and 146. The source/drain contact 142 is coupled to the first source/drain 112 of the transistor 110, the source/drain contact 144 is coupled to the second source/drains 114 and 124, and the source/drain contact 146 is coupled to the first source/drain 122 of the transistor 120. With the source/drain contact 144, the second source/drain 114 of the transistor 110 is electrically connected to the second source/drain 124 of the transistor 120.

The semiconductor device 100 further includes insulating structures 152 and 154 respectively on opposite sides of the transistors 110 and 120, buried conductive lines 162, 164, 166, and 168, and buried vias 172 and 174. The insulating structures 152 and 154 may be shallow trench isolation (STI) structures, interlayer dielectric (ILD), dielectric materials, or other suitable materials. The buried conductive lines 162 and 164 are embedded in the insulating structure 152, and the buried conductive lines 166 and 168 are embedded in the insulating structure 154. The buried conductive line 162 is above the buried conductive line 164, and the buried conductive line 166 is above the buried conductive line 168. The buried conductive line 162 is coupled to the gate 130 through the buried via 172, and the buried conductive line 166 is coupled to the source/drain contact 144 through the buried via 174. In some embodiments, the buried conductive lines 164 and 168 may be omitted or connected to other elements not shown in FIG. 1.

The semiconductor device 100 further includes conductive lines 181, 183, 185, 187, and 189, and vias 192, 194, and 196. The conductive lines 181, 183, 185, 187, and 189 are above the transistors 110 and 120 and the buried conductive lines 162, 164, 166, and 168. The conductive lines 181 and 189 may be power lines, and the conductive lines 183, 185, and 187 may be signal lines, such that each of the conductive lines 181 and 189 has a width greater than that of each of the conductive lines 183, 185, and 187. In some embodiments, the conductive line 183 is coupled to the source/drain contact 144 through the via 192, the conductive line 187 is coupled to the gate 130 through the via 194, and the conductive line 189 is coupled to the source/drain contact 146 through the via 196.

The structures of the semiconductor device 100 as discussed above are given for illustrative purposes. Various structures of the semiconductor device 100 are within the contemplated scope of the present disclosure. For example, in various embodiments, the structures of the semiconductor device 100 are extended to omit some of the conductive lines and/or the buried conductive lines. The interconnection among the (buried) conductive lines and the transistors can be adjusted according to different layout designs.

With the structures of the semiconductor device 100 as discussed above, buried conductive lines 162, 164, 166, and/or 168 are able to be formed in the insulating structures 152 and 154 adjacent the transistors 110 and 120 as shown in FIG. 1. This reduces the chip area of the semiconductor device 100. Moreover, a standard cell which implements the semiconductor device 100 is able to be scaled down because of the buried conductive lines 162, 164, 166, and/or 168 shown in FIG. 1.

The structure in FIG. 1 may be applied to various types of devices to save the chip area. FIGS. 2-12C illustrate a method for manufacturing a semiconductor device at various stages in accordance with some embodiments of the present disclosure. In some embodiments, the semiconductor device shown in FIGS. 2-12C may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 2:
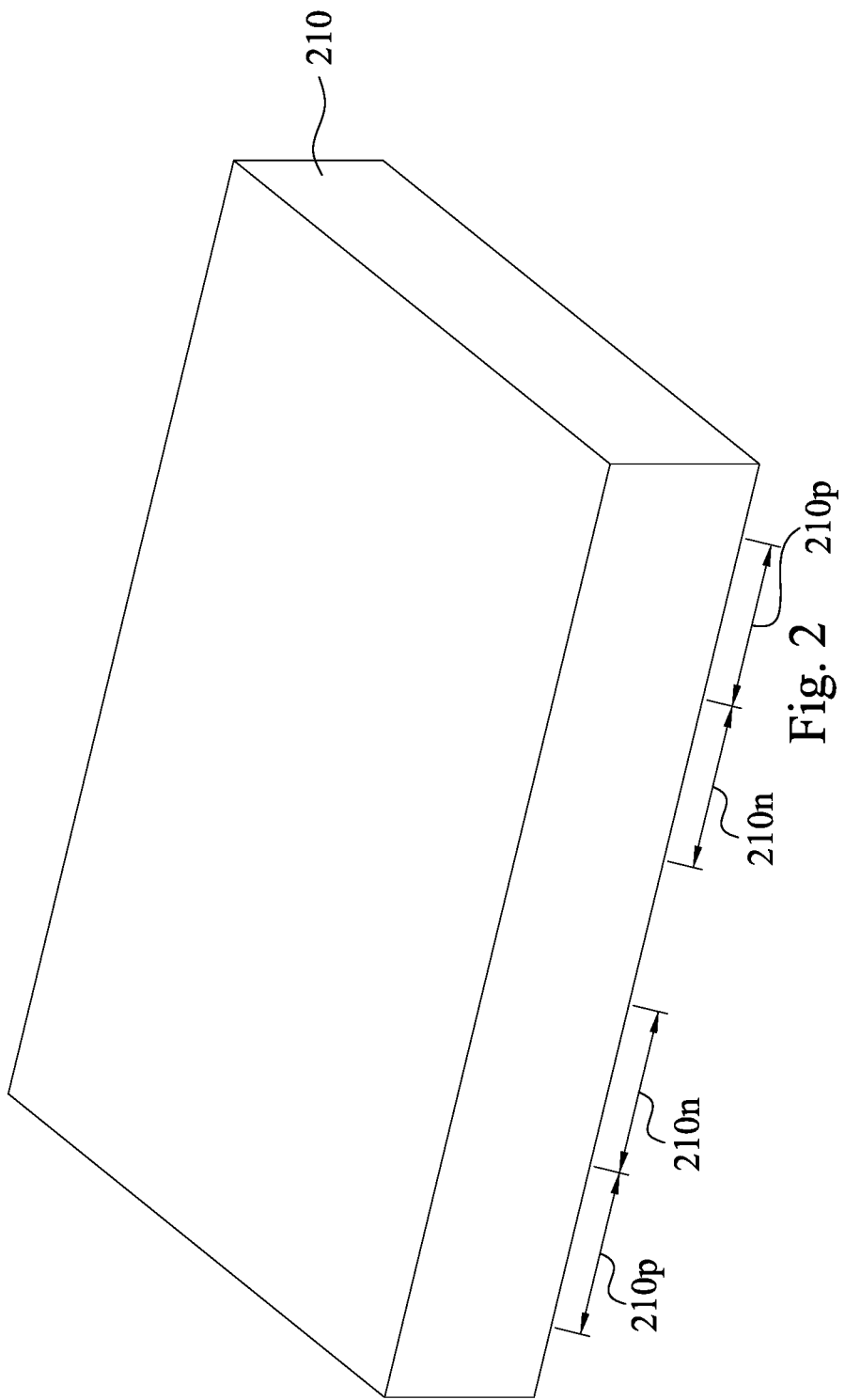

Reference is made to FIG. 2. A substrate 210 is provided. The substrate 210 includes at least one N-type region 210*n* and at least one P-type region 210*p*. At least one N-type device will be formed on the N-type region 210*n*, and at least one P-type device will be formed on the P-type region 210*p*. For ease of explanation, it is assumed that in FIGS. 2-12C, the substrate 210 includes two N-type regions 210*n* and two P-type regions 210*p* adjacent the N-type regions 210*n*. In some embodiments, the substrate 210 may include silicon (Si). Alternatively, the substrate 210 may include germanium (Ge), silicon germanium (SiGe), gallium arsenide (GaAs) or other appropriate semiconductor materials. In some embodiments, the substrate 210 may include a semiconductor-on-insulator (SOI) structure such as a buried dielectric layer. Also alternatively, the substrate 210 may include a buried dielectric layer such as a buried oxide (BOX) layer, such as that formed by a method referred to as separation by implantation of oxygen (SIMOX) technology, wafer bonding, SEG, or another appropriate method. In various embodiments, the substrate 210 may include any of a variety of substrate structures and materials.

Figure 3:
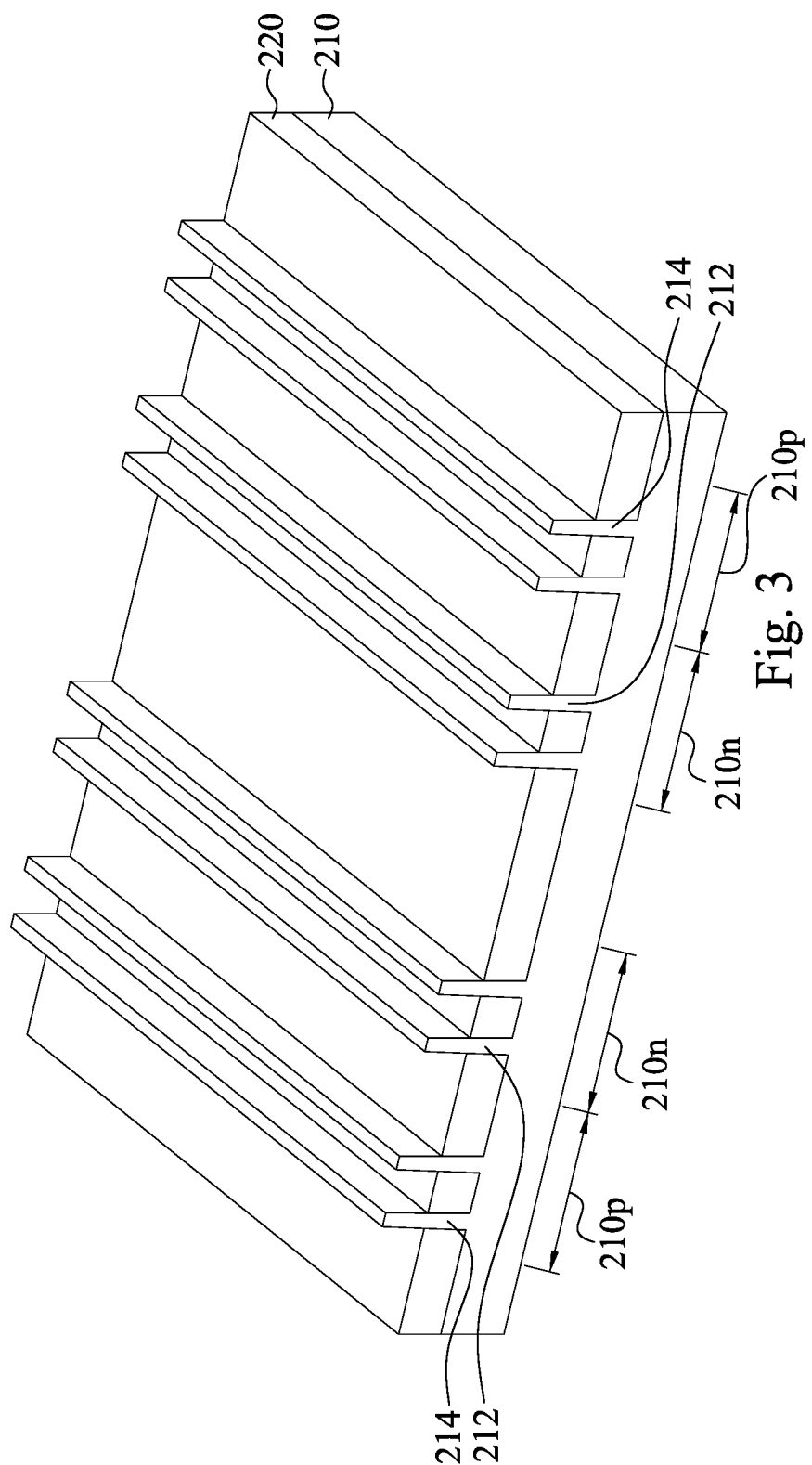

Reference is made to FIG. 3. A plurality of semiconductor fins 212 and a plurality of semiconductor fins 214 are respectively formed over the N-type regions 210*n* and the P-type regions 210*p* of the substrate 210. The semiconductor fins 212 and 214 may serve as channels and source/drain features of transistors. It is noted that the numbers of the semiconductor fins 212 and 214 in FIG. 3 are illustrative, and should not limit the claimed scope of the present disclosure. In addition, one or more dummy fins may be disposed adjacent both sides of the semiconductor fins 212 and/or the semiconductor fins 214 to improve pattern fidelity in patterning processes.

The semiconductor fins 212 and 214 may be formed, for example, by patterning and etching the substrate 210 using photolithography techniques. In some embodiments, a layer of photoresist material (not shown) is deposited over the substrate 210. The layer of photoresist material is irradiated (exposed) in accordance with a desired pattern (the semiconductor fins 212 and 214 in this case) and developed to remove a portion of the photoresist material. The remaining photoresist material protects the underlying material from subsequent processing operations, such as etching. It should be noted that other masks, such as an oxide or silicon nitride mask, may also be used in the etching process. The semiconductor fins 212 and 214 may be made of the same material as the substrate 210 and may continuously extend or protrude from the substrate 210. The semiconductor fins 212 and 214 may be intrinsic, or appropriately doped with an n-type impurity or a p-type impurity.

In some other embodiments, the semiconductor fins 212 and 214 may be epitaxially grown. For example, exposed portions of an underlying material, such as an exposed portion of the substrate 210, may be used in an epitaxial process to form the semiconductor fins 212 and 214. A mask may be used to control the shape of the semiconductor fins 212 and 214 during the epitaxial growth process.

A plurality of isolation structures 220, such as shallow trench isolation (STI), are formed in the substrate 210 to separate various devices. The formation of the isolation structures 220 may include etching trenches in the substrate 210 and filling the trench by an insulator material such as silicon oxide, silicon nitride, or silicon oxynitride. The filled trench may have a multi-layer structure such as a thermal oxide liner layer with silicon nitride filling the trench. In some embodiments, the isolation structures 220 may be created using a process sequence such as: growing a pad oxide, forming a low pressure chemical vapor deposition (LPCVD) nitride layer, patterning an STI opening using photoresist and masking, etching a trench in the substrate 210 (to form the semiconductor fins 212 and 214), optionally growing a thermal oxide trench liner to improve the trench interface, filling the trench with oxide, using chemical mechanical planarization (CMP) to remove the excessive oxide, and recessing the thermal oxide trench liner and the oxide to form the isolation structures 220 such that top portions of the semiconductor fins 212 and 214 protrude from top surfaces of the isolation structures 220.

Figure 4:
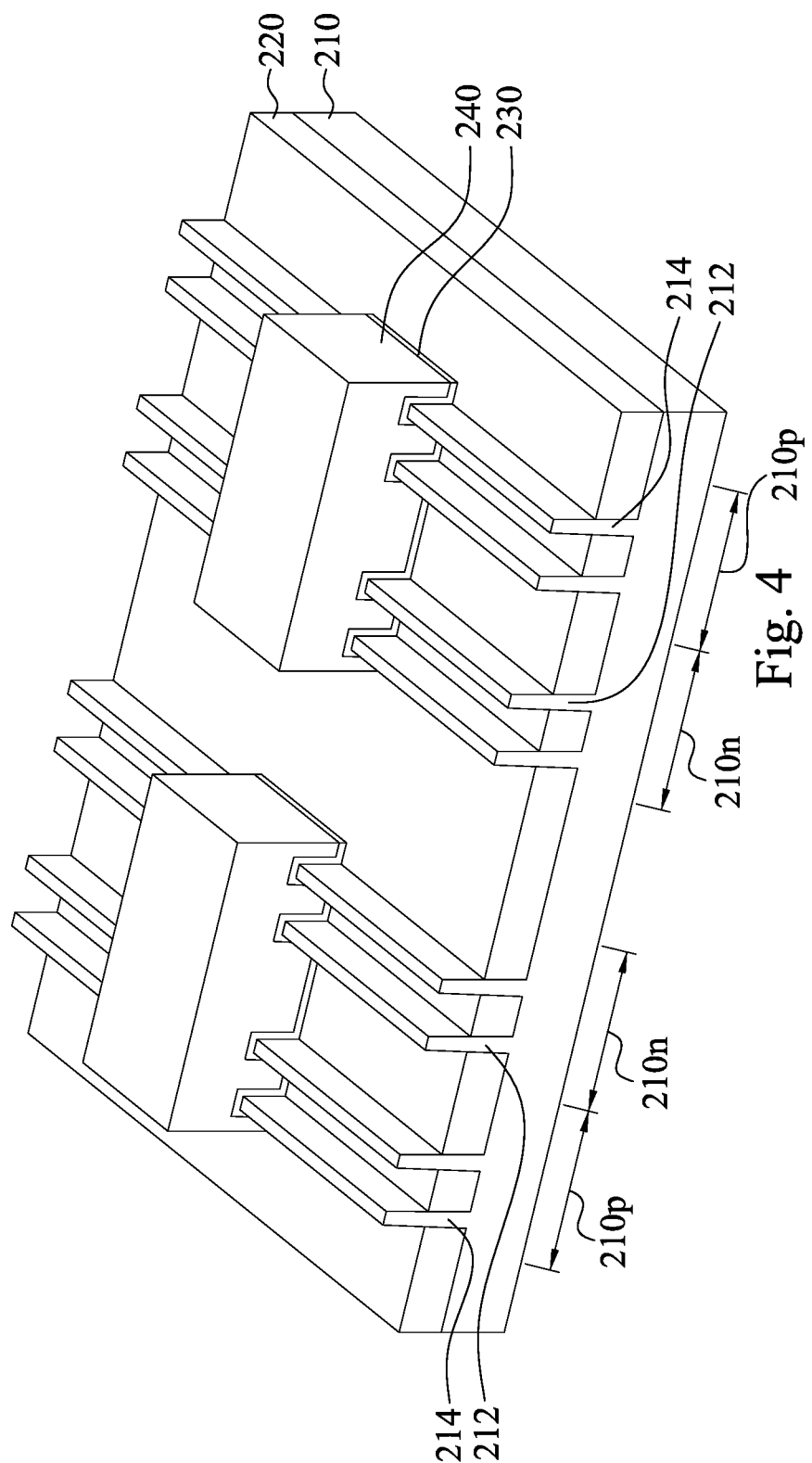

Reference is made to FIG. 4. An interfacial layer 230 is conformally formed to cover the semiconductor fins 212, 214, and the isolation structures 220. In some embodiments, the interfacial layer 230 may include silicon dioxide, silicon nitride, a high-κ dielectric material, or other suitable material. In various examples, the interfacial layer 230 may be deposited by an ALD process, a CVD process, a subatmospheric CVD (SACVD) process, a flowable CVD process, a PVD process, or other suitable process. By way of example, the interfacial layer 230 may be used to prevent damage to the semiconductor fins 212 and 214 by subsequent processing (e.g., subsequent formation of the dummy gate structure).

Gate structures 240 are formed over the interfacial layer 230, the semiconductor fins 212, 214, and the isolation structures 220. In some embodiments, a gate layer (not shown) may be formed over the interfacial layer 230, and is then patterned to form the gate electrode 240. In some embodiments, the gate electrode 240 may be made of polycrystalline-silicon (poly-Si), poly-crystalline silicon-germanium (poly-SiGe), or other suitable materials. If a gate-first technology is employed, the gate structure 240 and the interfacial layer 230 are used as a gate electrode and a gate dielectric layer. Subsequently, portions of the interfacial layer 230 uncovered by the gate structure 240 are removed to expose portions of the semiconductor fins 212 and 214 as shown in FIG. 4.

Figure 5:
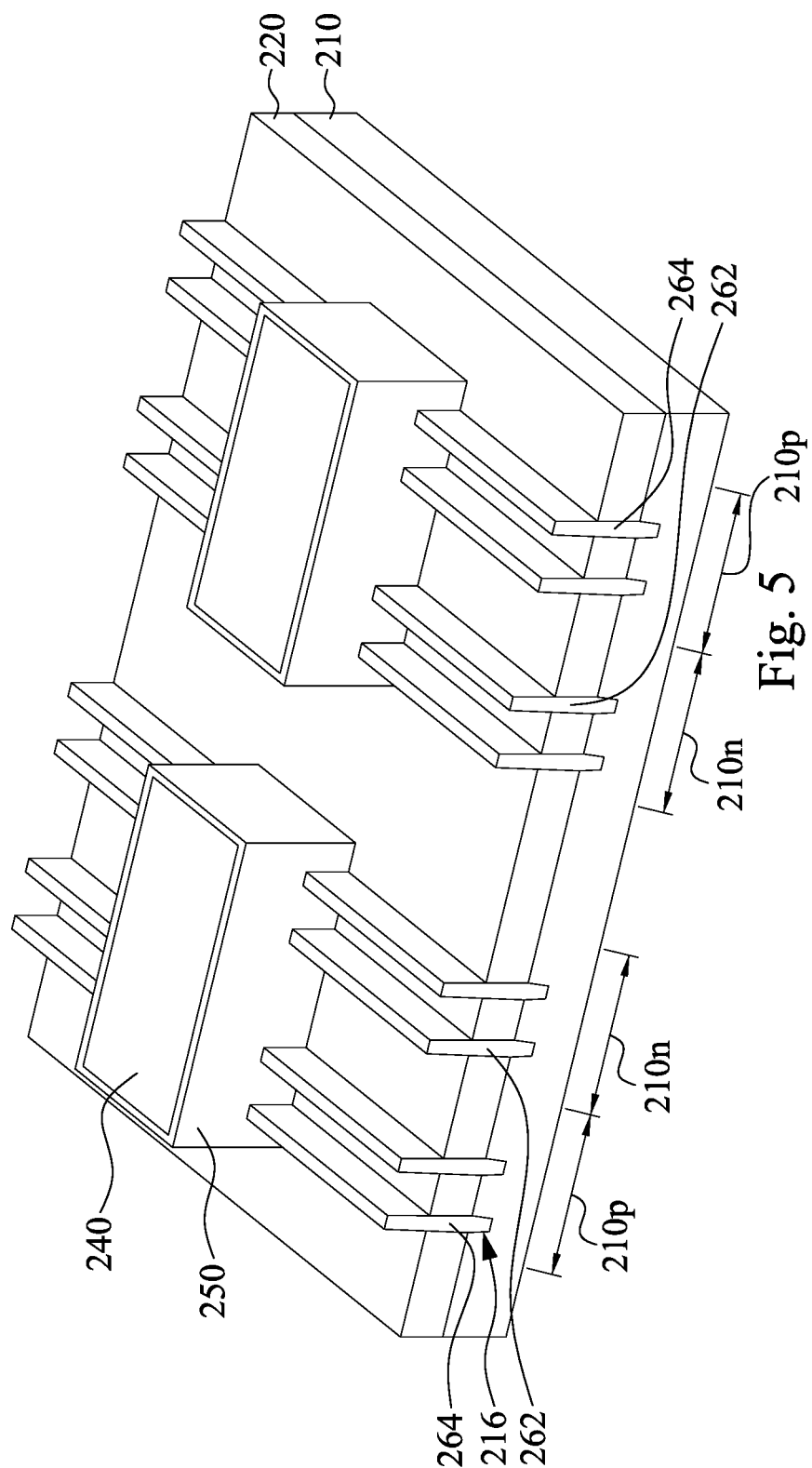

Reference is made to FIG. 5. Spacer structures 250 are at least formed on opposite sides of the gate structure 240 and the interfacial layer 230. The spacer structures 250 may include a seal spacer and a main spacer (not shown). The spacer structures 250 include one or more dielectric materials, such as silicon oxide, silicon nitride, silicon oxynitride, SiCN, $SiC_xO_yN_z$, or combinations thereof. The seal spacers are formed on sidewalls of the gate structure 240 and the main spacers are formed on the seal spacers. The spacer structures 250 can be formed using a deposition method, such as plasma enhanced chemical vapor deposition (PECVD), low-pressure chemical vapor deposition (LPCVD), sub-atmospheric chemical vapor deposition (SACVD), or the like. The formation of the spacer structures 250 may include blanket forming spacer layers and then performing etching operations to remove the horizontal portions of the spacer layers. The remaining vertical portions of the spacer layers form the spacer structures 250.

Subsequently, a plurality of recesses 216 are formed at opposite sides of the gate structure 240 by etching the semiconductor fins 212 and 214 (see FIG. 4). The gate structure 240 and the gate spacers 250 act as etching masks in the formation of the recesses 216. The etching process includes a dry etching process, a wet etching process, or combinations thereof.

Semiconductor materials are then deposited in the recesses 216 to form epitaxial structures 262 and 264 which are referred to as source/drain regions. The epitaxial structures 262 are respectively form above the N-type regions 210n, and the epitaxial structures 264 are respectively form above the P-type regions 210p. The epitaxial structures 262 and 264 may alternatively be referred to as raised source and drain regions. The semiconductor materials include a single element semiconductor material, such as germanium (Ge) or silicon (Si), compound semiconductor materials, such as gallium arsenide (GaAs) or aluminum gallium arsenide (AlGaAs), or a semiconductor alloy, such as silicon germanium (SiGe) or gallium arsenide phosphide (GaAsP). The epitaxial structures 262 and 264 have suitable crystallographic orientations (e.g., a (100), (110), or (111) crystallographic orientation). In some embodiments, the epitaxial structures 262 and 264 include source/drain epitaxial structures. In some embodiments, where an N-type device is desired, the epitaxial structures 262 may include an epitaxially grown silicon phosphorus (SiP) or silicon carbon (SiC). In some embodiments, where a P-type device is desired, the epitaxial structures 264 may include an epitaxially grown silicon germanium (SiGe). The epitaxial processes include CVD deposition techniques (e.g., vapor-phase epitaxy (VPE) and/or ultra-high vacuum CVD (UHV-CVD)), molecular beam epitaxy, and/or other suitable processes. Desired p-type or n-type impurities may be, or may not be, doped while the epitaxial process. The doping may be achieved by an ion implantation process, plasma immersion ion implantation (PIII) process, gas and/or solid source diffusion process, other suitable process, or combinations thereof.

Figure 6:
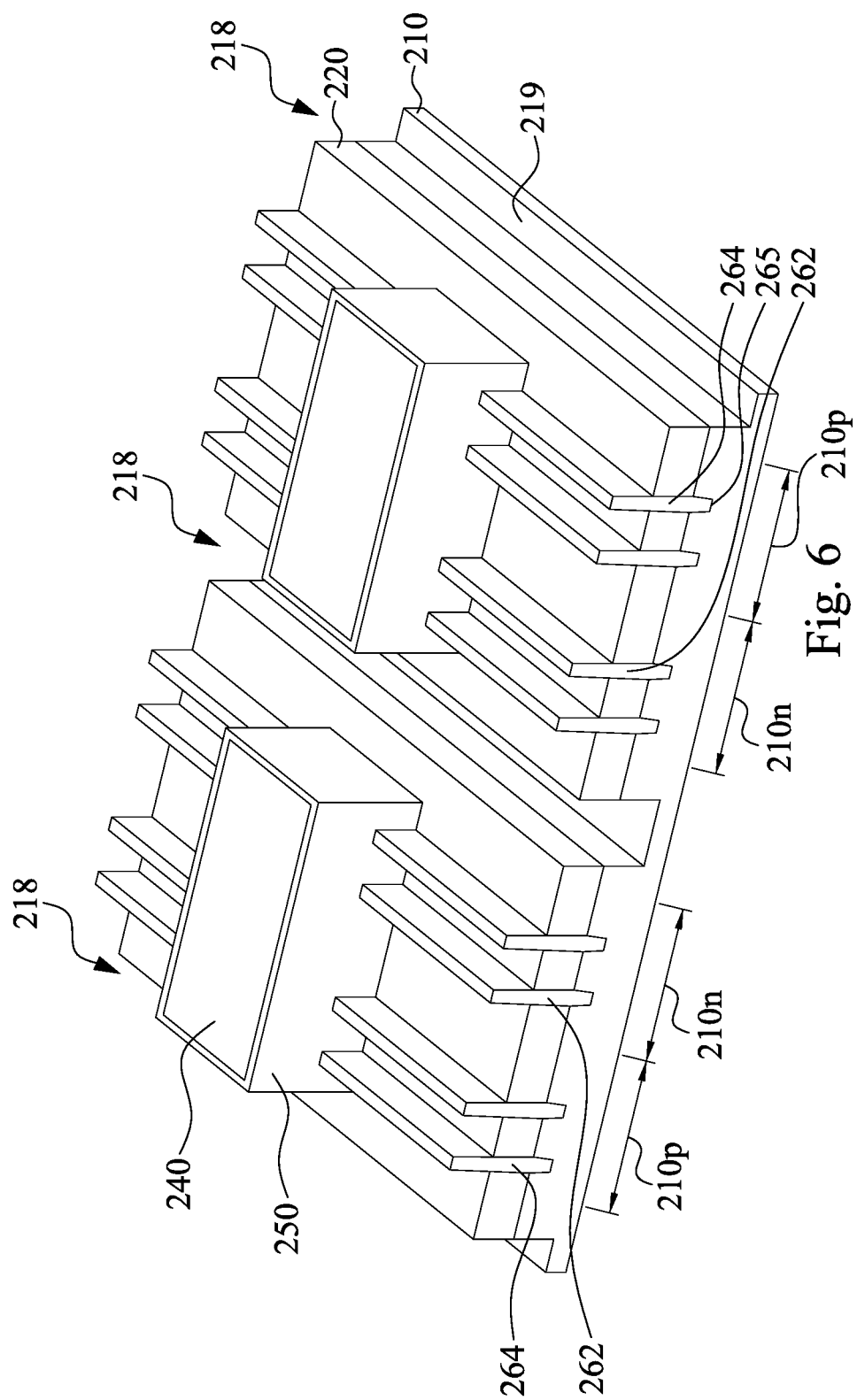

Reference is made to FIG. 6. A plurality of trenches 218 are formed in the isolation structures 220 and the substrate 210. For example, the trenches 218 are formed between the gate structures 240 and substantially parallel to the semiconductor fins 212 and 214. In some embodiments, a mask layer is formed above the structure in FIG. 5, and the mask layer is patterned to expose portions of the isolation structures 220 between the gate structures 240. The portions of the isolation structures 220 are then removed to expose portions of the substrate 210, and the exposed portions of the substrate are recessed to form trenches 218 therein. In some embodiments, bottom surfaces 219 of the trenches 218 are lower than bottom surfaces 265 of the epitaxial structures 262 and/or 264. In some other embodiments, the bottom surfaces 219 of the trenches 218 are higher than or substantially level with the bottom surfaces 265 of the epitaxial structures 262 and/or 264.

Figure 7A:
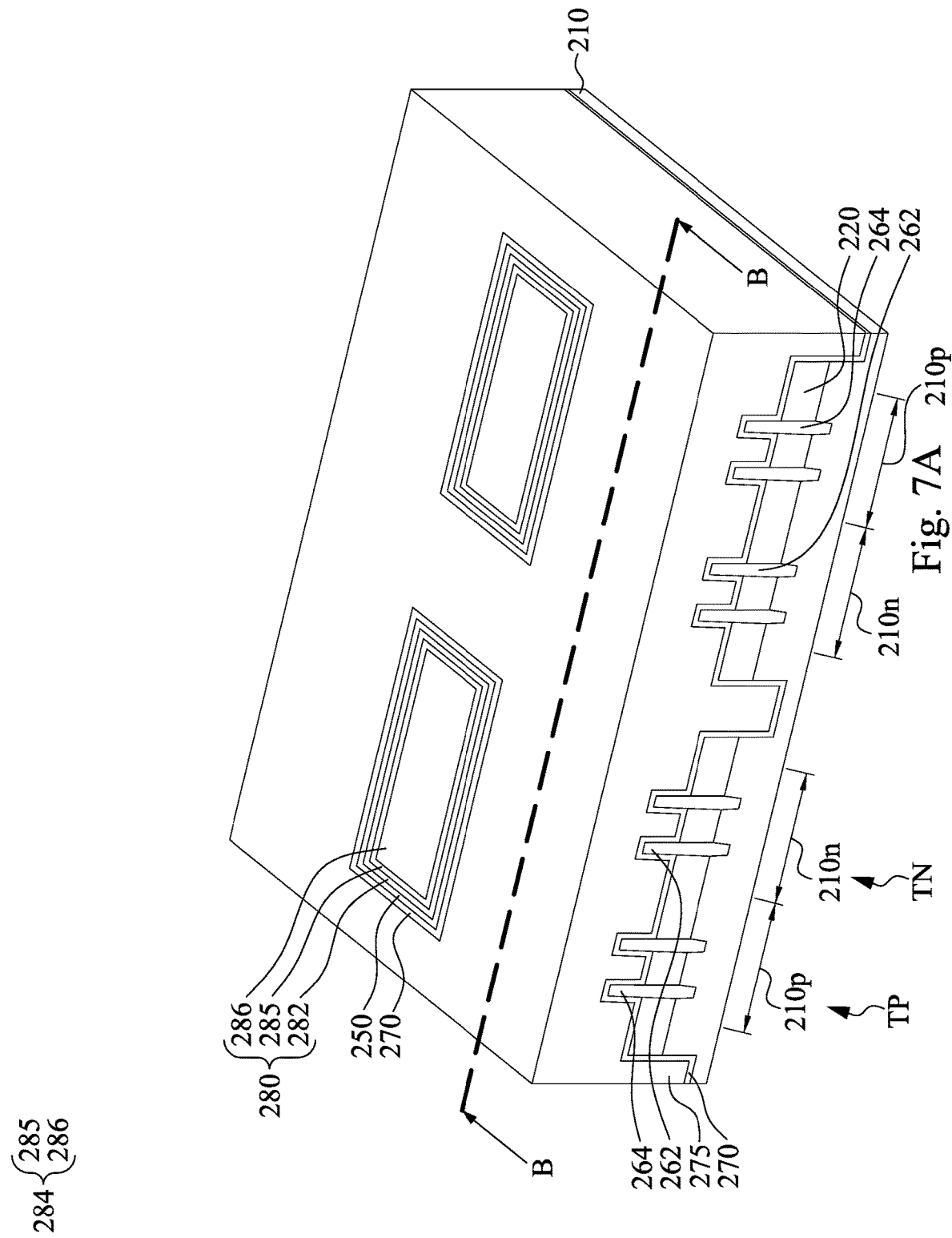
Figure 7B:
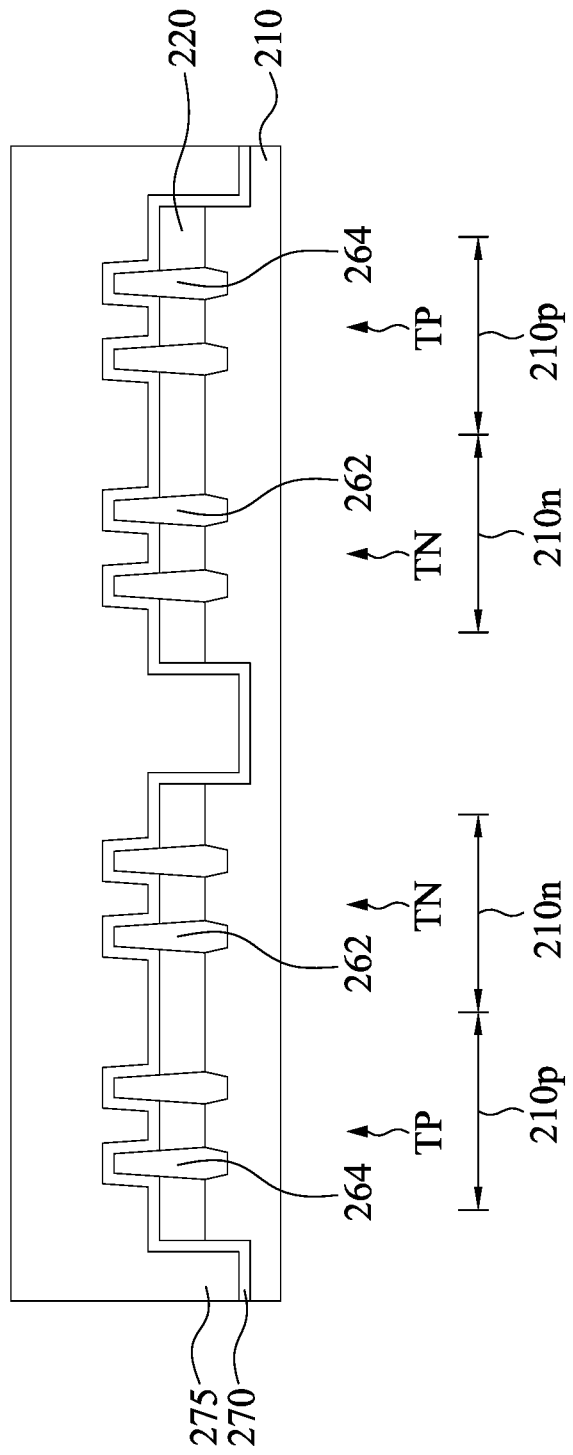

Reference is made to FIGS. 7A and 7B, where FIG. 7B is a cross-sectional view taken along line B-B in FIG. 7A. A contact etch stop layer (CESL) 270 is conformally formed over the structure of FIG. 6. In some embodiments, the CESL 270 can be a stressed layer or layers. In some embodiments, the CESL 270 has a tensile stress and is formed of $Si_3N_4$. In some other embodiments, the CESL 270 includes materials such as oxynitrides. In yet some other embodiments, the CESL 270 may have a composite structure including a plurality of layers, such as a silicon nitride layer overlying a silicon oxide layer. The CESL 270 can be formed using plasma enhanced CVD (PECVD), however, other suitable methods, such as low pressure CVD (LPCVD), atomic layer deposition (ALD), and the like, can also be used.

A first interlayer dielectric (ILD) 275 is then formed on the CESL 270. The first ILD 275 may be formed by chemical vapor deposition (CVD), high-density plasma CVD, spin-on, sputtering, or other suitable methods. In some embodiments, the first ILD 275 includes silicon oxide. In some other embodiments, the first ILD 275 may include silicon oxy-nitride, silicon nitride, or a low-k material. Portions of the first ILD 275 are formed in the trenches 218 (see FIG. 6).

Subsequently and optionally, a replacement gate (RPG) process scheme is optionally employed. In the RPG process scheme, a dummy polysilicon gate (the gate structures 240 in FIG. 6 in this case) is formed in advance and is replaced later by a metal gate. In some embodiments, the gate structures 240 are removed to form opening with the spacer structures 250 as its sidewalls. In some other embodiments, the interfacial layers 230 (see FIG. 4) are removed as well. The gate structures 240 (and the interfacial layers 230) may be removed by dry etching, wet etching, or a combination of dry and wet etching.

A gate dielectric layer 282 is formed in the openings, and at least one metal layer is formed in the opening and on the gate dielectric layer 282. Subsequently, a chemical mechanical planarization (CMP) process is performed to planarize the metal layer and the gate dielectric layer 282 to form a metal gate structure 280 in the opening. The metal gate structures 280 cross over the semiconductor fins 212 and 214. The metal gate structure 280 includes the gate dielectric layer 282 and a metal gate electrode 284 over the gate dielectric layer 282. The metal gate electrode 284 may include metal layers 285, e.g., work function metal layer(s) and capping layer(s), a fill layer(s) 286, and/or other suitable layers that are desirable in a metal gate stack. The work function metal layer 285 may include an n-type and/or a p-type work function metal. Exemplary n-type work function metals include Ti, Ag, TaAl, TaAlC, TiAlN, TaC, TaCN, TaSiN, Mn, Zr, other suitable n-type work function materials, or combinations thereof. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. The work function metal layer 285 may have multiple layers. The work function metal layer(s) 285 may be deposited by CVD, PVD, electroplating and/or other suitable processes. In some embodiments, the capping layer may include refractory metals and their nitrides (e.g., TiN, TaN, $W_2N$, TiSiN, and TaSiN). The capping layer may be deposited by PVD, CVD, metal-organic chemical vapor deposition (MOCVD) ALD, or the like. In some embodiments, the fill layer 286 may include tungsten (W). The fill layer 286 may be deposited by ALD, PVD, CVD, or another suitable process.

In FIGS. 7A and 7B, a plurality of devices are formed above the substrate 210. For example, the epitaxial structures 262, the semiconductor fins 212 (see FIG. 3), and the metal gate structures 280 form N-type devices (transistors) TN, and the epitaxial structures 264, the semiconductor fins 214 (see FIG. 3), and the metal gate structures 280 form P-type devices (transistors) TP.

Reference is made to FIGS. 8A and 8B, where FIG. 8B is a cross-sectional view taken along line B-B in FIG. 8A. The first ILD 275 is etched to form a plurality of contact openings 276, a plurality of trenches 277a, 277b, 277c, and a plurality of interconnection openings 278 by various methods, including a dry etch, a wet etch, or a combination of dry etch and wet etch. The contact openings 276 extend substantially vertically through the first ILD 275 to expose the epitaxial structures 262 and 264. The trenches 277a, 277b, 277c extend substantially vertically through the first ILD 275 but not extend to the bottommost surface of the first ILD 275. The trenches 277a, 277b, 277c do not expose the metal gate structures 280 and the epitaxial structures 262 and 264. The interconnection openings 278 extend from the trench 277a to the corresponding contact openings 276. In some embodiments, top portions of the epitaxial structures 262 and 264 may be removed during the formation of the contact openings 276 and/or the interconnection openings 278. Multiple patterning processes may be performed to form the contact openings 276, the trenches 277a, 277b, 277c, and the interconnection openings 278. For example, different mask layers are used to respectively pattern the contact openings 276, the trenches 277a, 277b, 277c, and the interconnection openings 278.

Figure 9A:
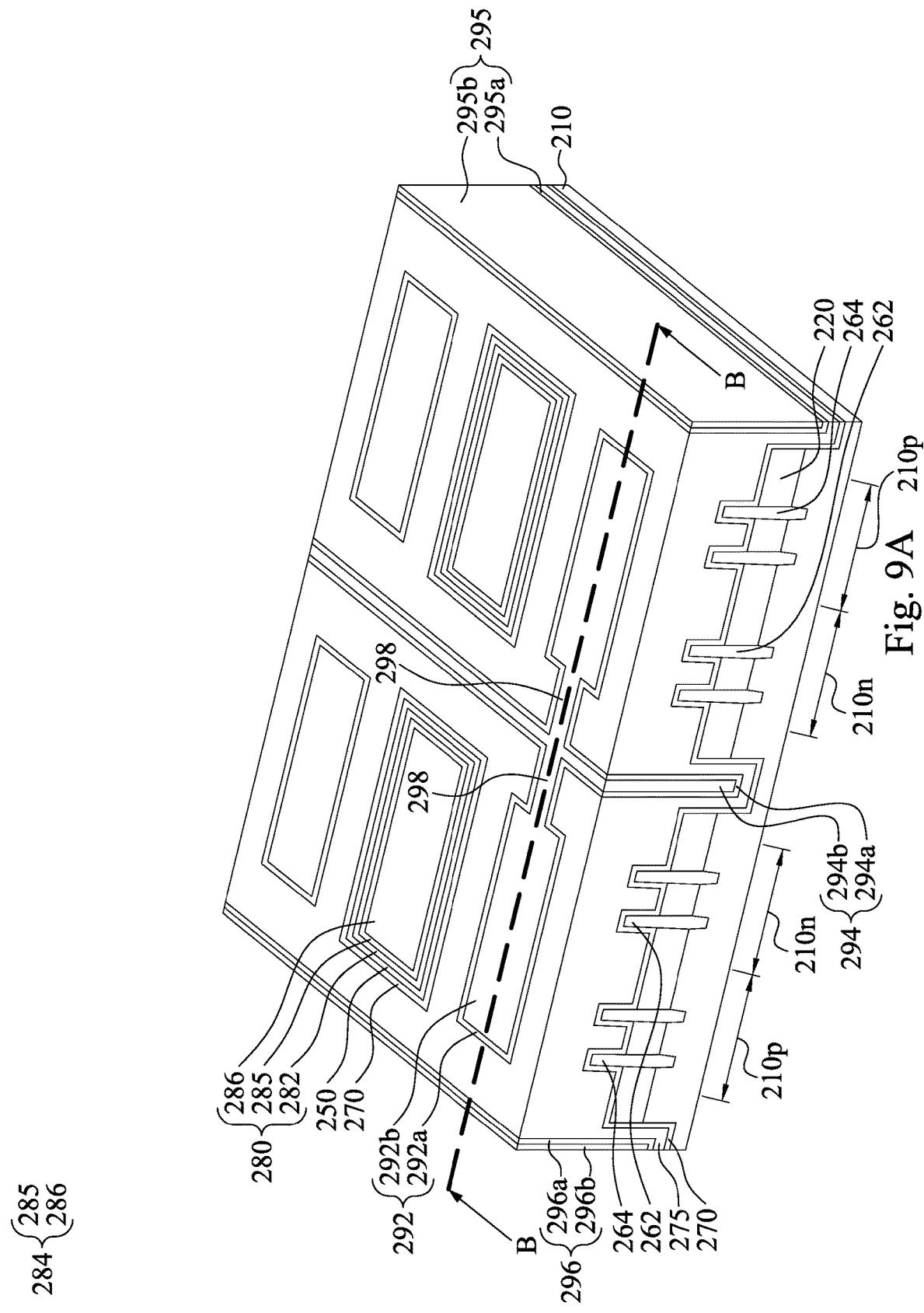
Figure 9B:
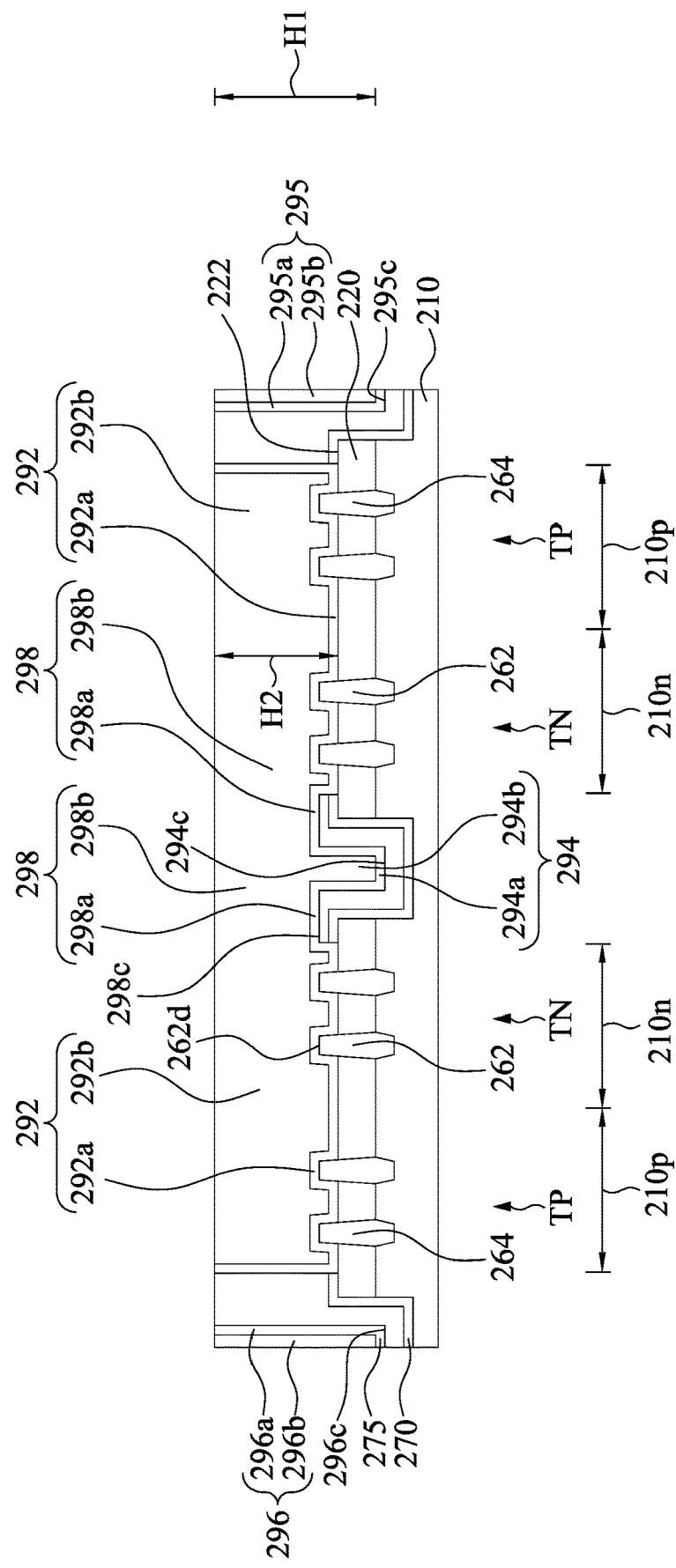

Reference is made to FIGS. 9A and 9B, where FIG. 9B is a cross-sectional view taken along line B-B in FIG. 9A. Source/drain contacts 292, bottom buried conductive lines 294, 295, 296, and buried vias 298 are respectively formed in the contact openings 276, the trenches 277a, 277b, 277c, and the interconnection openings 278 (see FIGS. 8A-8B). Each of the source/drain contacts 292, bottom buried conductive lines 294, 295, 296, and buried vias 298 includes an optional barrier layer 292a, 294a, 295a, 296a, and 298a and a filling material 292b, 294b, 295b, 296b, and 298b.

In some embodiments, the barrier layers 292a, 294a, 295a, 296a, and 298a are respectively formed in the contact openings 276, the trenches 277a, 277b, 277c, and the interconnection openings 278 (see FIGS. 8A and 8B). The barrier layers 292a, 294a, 295a, 296a, and 298a can improve the adhesion between the epitaxial structures 262/264 and a material formed thereon (such as the filling materials). The barrier layers 292a, 294a, 295a, 296a, and 298a may include metal nitride materials. For example, the barrier layers 292a, 294a, 295a, 296a, and 298a include Ti, TiN, or combination thereof. In some embodiments, the barrier layers 292a, 294a, 295a, 296a, and 298a include a single layer or multiple layers. For a multiple-layer configuration, the layers include different compositions of metal nitride from each other. For example, the barrier layers 292a, 294a, 295a, 296a, and 298a have a first metal nitride layer including Ti and a second metal nitride layer including TiN.

Filling material 292b, 294b, 295b, 296b, and 298b are formed in the contact openings 276, the trenches 277a, 277b, 277c, and the interconnection openings 278 and over the barrier layers 292a, 294a, 295a, 296a, and 298a. The filling materials 292b are electrically connected to the epitaxial structures 262 and 264. In some embodiments, metal materials can be filled in the openings, and excessive portions of the metal materials and the barrier layer are removed by performing a planarization (e.g., CMP) process to form the filling materials 292b, 294b, 295b, 296b, and 298b and the barrier layers 292a, 294a, 295a, 296a, and 298a. The filling materials 292b, 294b, 295b, 296b, and 298b can be made of tungsten, aluminum, copper, or other suitable materials.

In FIGS. 9A and 9B, the N-type devices (transistors) TN and the P-type devices (transistors) TP are respectively formed above the N-type regions 210n and P-type regions 210p of the substrate 210. The source/drain contacts 292 are above the epitaxial structures 262 and 264 to interconnect the epitaxial structures 262 and 264. The bottom buried conductive line 294 is between the N-type devices TN, and the N-type devices TN and P-type devices TP are between the buried conductive lines 294 and 295 (or 296). The buried vias 298 interconnect the bottom buried conductive line 294 and two of the source/drain contacts 292, such that the bottom buried conductive line 294 is electrically connected to some of the epitaxial structures 262 and 264 of the N-type devices TN and the P-type devices TP. The first ILD 275 and the isolation structures 220 are referred to as an insulating structure. The bottom buried conductive lines 294, 295, and 296 and buried vias 298 are embedded in the insulating structure (i.e., the first ILD 275 and the isolation structures 220).

In FIG. 9B, because of the planarization process mentioned above, the top surfaces of the source/drain contacts 292, bottom buried conductive lines 294, 295, 296, buried vias 298, and the first ILD 275 are substantially coplanar. In some embodiments, a bottom surface 294c of the bottom buried conductive line 294 is lower than a top surface 222 of the isolation structure 220. Also, bottom surfaces 295c and 296c of the bottom buried conductive lines 295 and 296 are lower than the top surface 222 of the isolation structure 220 in some embodiments. A height H1 of each of the bottom buried conductive lines 294, 295, and 296 is greater than a height H2 of each of the source/drain contacts 292 (the metal gate structure 280 may have the height H2 as well). A bottom surface 298c of each of the buried vias 298 and top surfaces 262d of the epitaxial structures 262 (and/or top surfaces of the epitaxial structures 264) may be substantially coplanar. In FIG. 9B, the barrier layers 292a, 294a, and 298a are connected to each other, and the filling materials 292b, 294b, and 298b are connected to each other, such that the source/drain contacts 292, the bottom buried conductive line 294, and the buried vias 298 shown in FIG. 9B are electrically connected to each other.

It is noted that the source/drain contacts 292, bottom buried conductive lines 294, 295, 296, buried vias 298 may be formed in different processes. For example, the source/drain contacts 292 may be formed before the formation of the bottom buried conductive lines 294, 295, 296. Alternatively, the buried vias 298 may be formed after the formations of the source/drain contacts 292 and the bottom buried conductive lines 294, 295, 296.

Figure 10A:
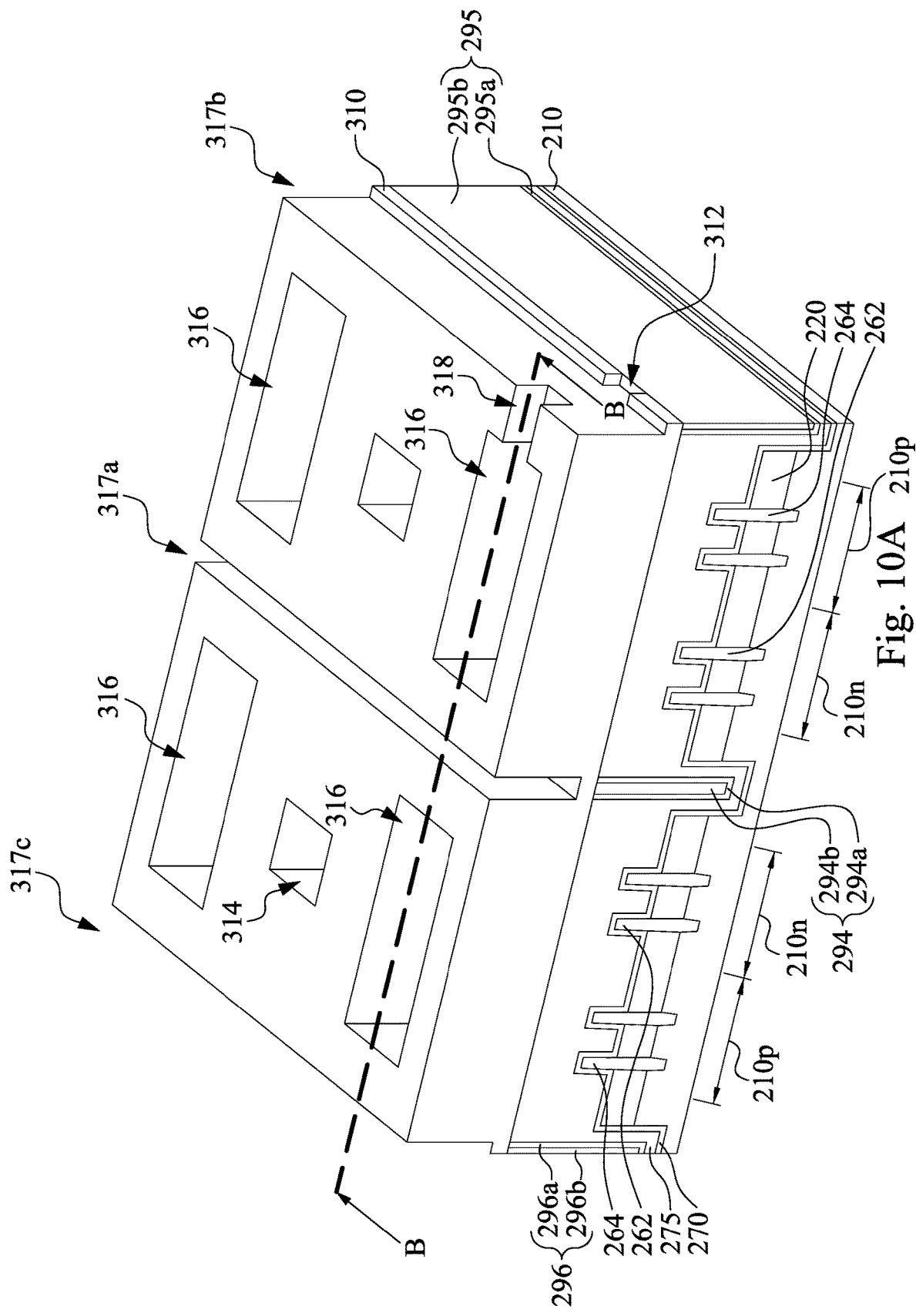
Figure 10B:
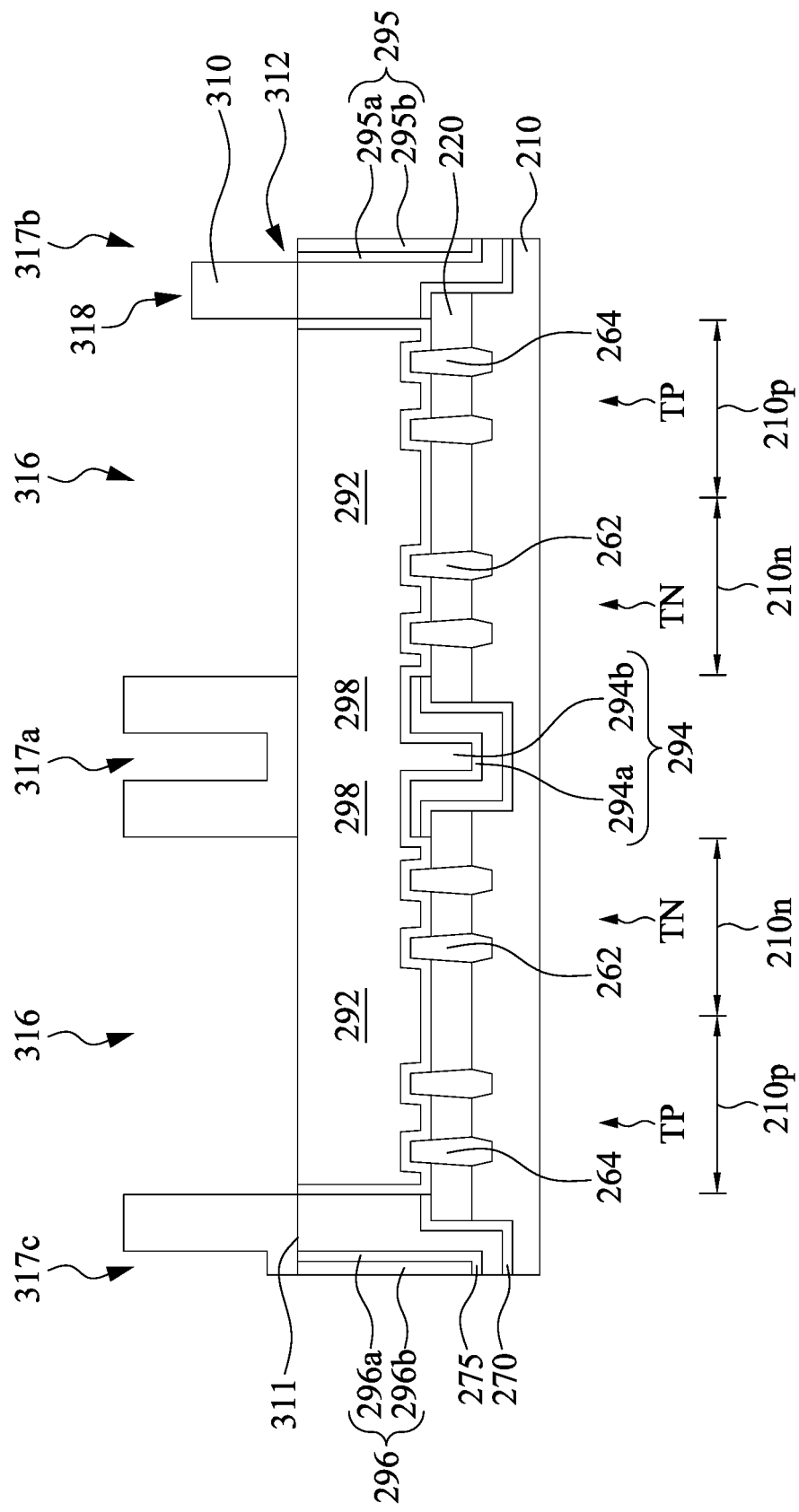

Reference is made to FIGS. 10A and 10B, where FIG. 10B is a cross-sectional view taken along line B-B in FIG. 10A. A second interlayer dielectric (ILD) 310 is then formed on the structure of FIG. 9A. The second ILD 310 may be formed by chemical vapor deposition (CVD), high-density plasma CVD, spin-on, sputtering, or other suitable methods. In some embodiments, the second ILD 310 includes silicon oxide. In some other embodiments, the second ILD 310 may include silicon oxy-nitride, silicon nitride, or a low-k material.

Subsequently, the second ILD 310 is etched to form a plurality of gate openings 314, a plurality of contact openings 316, a plurality of trenches 317a, 317b, 317c, and a plurality of interconnection openings 318, 312 by various methods, including a dry etch, a wet etch, or a combination of dry etch and wet etch. The gate openings 314 extend substantially vertically through the second ILD 310 to respectively expose the metal gate structures 280. The contact openings 316 extend substantially vertically through the second ILD 310 to respectively expose the source/drain contacts 292. The trenches 317a, 317b, 317c extend substantially vertically through the second ILD 310 but not extend to the bottommost surface 311 of the second ILD 310. The trenches 317a, 317b, 317c may be right above the bottom buried conductive lines 294, 295, and 296. The interconnection opening 318 extends from the trench 317b to the corresponding contact opening 316, and the interconnection opening 312 is under the trench 317b and exposes the buried conductive line 295. Multiple patterning processes may be performed to form the gate openings 314, the contact openings 316, the trenches 317a, 317b, 317c, and the interconnection openings 312, 318. For example, different mask layers are used to respectively pattern the gate openings 314, the contact openings 316, the trenches 317a, 317b, 317c, and the interconnection openings 312, 318.

Figure 11A:
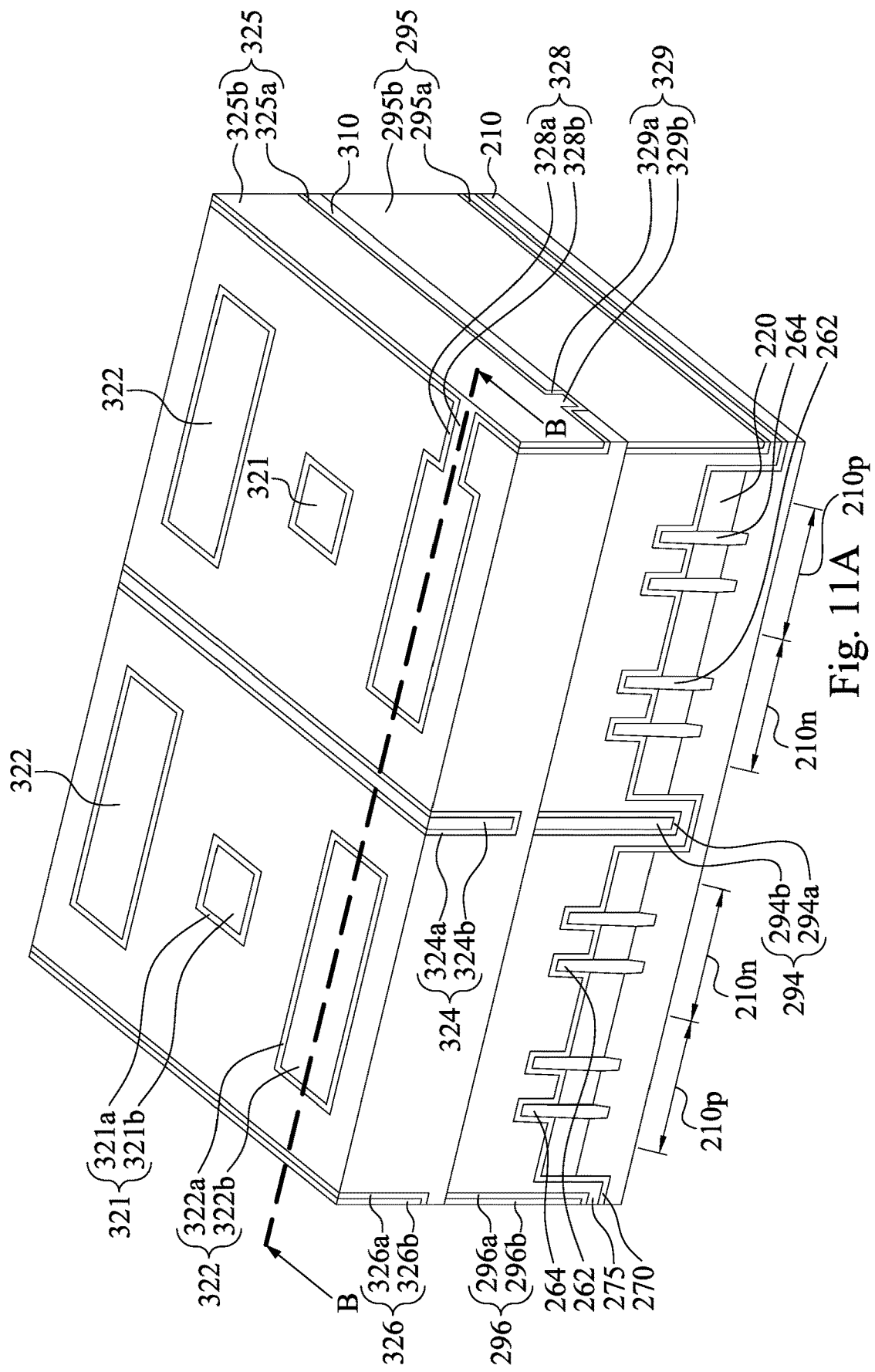
Figure 11B:
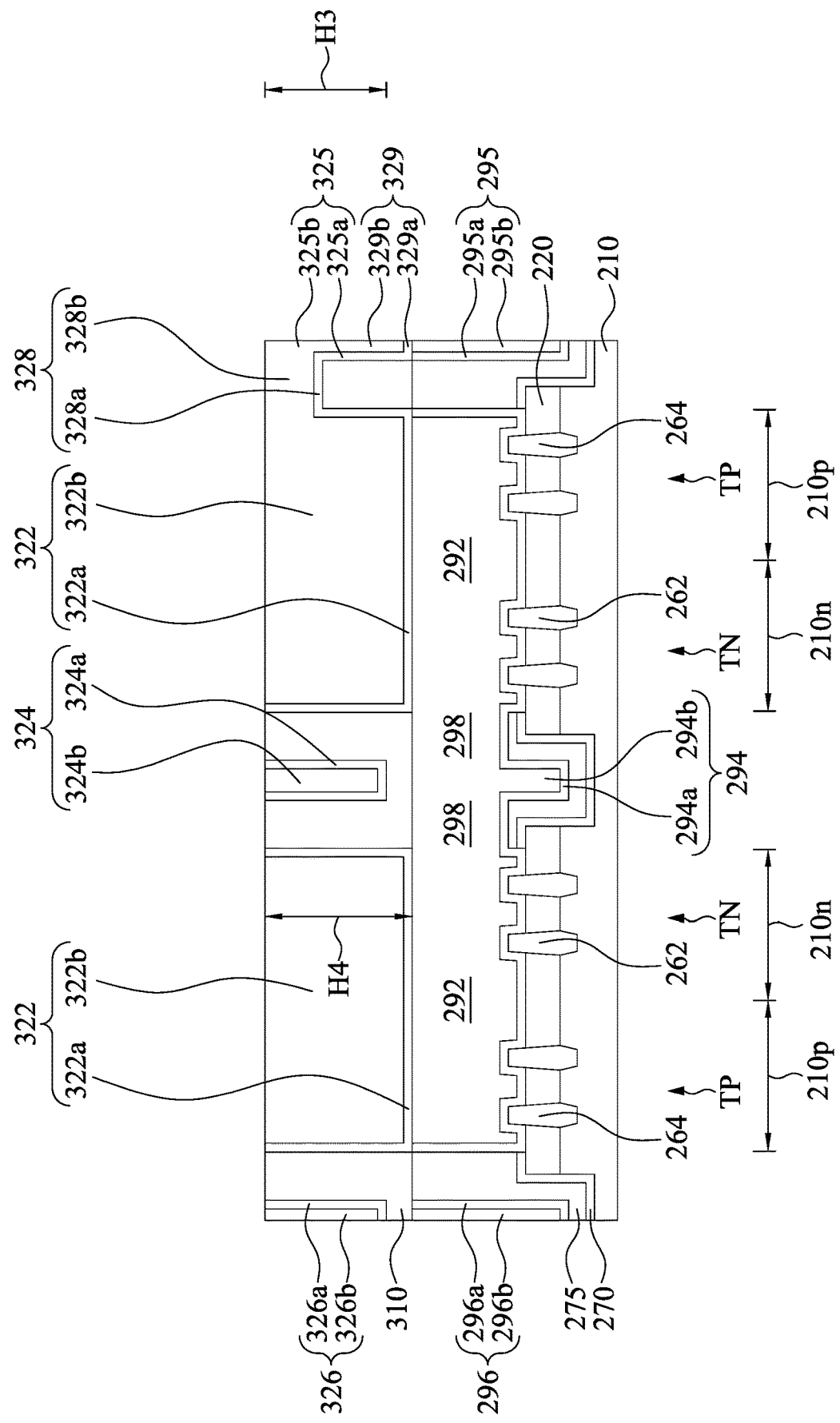

Reference is made to FIGS. 11A and 11B, where FIG. 11B is a cross-sectional view taken along line B-B in FIG. 11A. Gate vias 321, source/drain contacts 322, top buried conductive lines 324, 325, 326, and buried vias 328 and 329 are respectively formed in the gate openings 314, the contact openings 316, the trenches 317a, 317b, 317c, and the interconnection openings 312, 318 (see FIGS. 10A-10B). Each of the gate vias 321, source/drain contacts 322, top buried conductive lines 324, 325, 326, and buried vias 328 and 329 includes an optional barrier layer 321a, 322a, 324a, 325a, 326a, 328a, and 329a and a filling material 321b, 322b, 324b, 325b, 326b, 328b, and 329b.

In some embodiments, the barrier layers 321a, 322a, 324a, 325a, 326a, 328a, and 329a are respectively formed in the gate openings 314, the contact openings 316, the trenches 317a, 317b, 317c, and the interconnection openings 312, 318 (see FIGS. 10A and 10B). The barrier layers 321a, 322a, 324a, 325a, 326a, 328a, and 329a may include metal nitride materials. For example, the barrier layers 321a, 322a, 324a, 325a, 326a, 328a, and 329a include Ti, TiN, or combination thereof. In some embodiments, the barrier layers 321a, 322a, 324a, 325a, 326a, 328a, and 329a include a single layer or multiple layers. For a multiple-layer configuration, the layers include different compositions of metal nitride from each other. For example, the barrier layers 321a, 322a, 324a, 325a, 326a, 328a, and 329a have a first metal nitride layer including Ti and a second metal nitride layer including TiN.

Filling material 321b, 322b, 324b, 325b, 326b, 328b, and 329b are formed in the contact openings 276, the trenches 277a, 277b, 277c, and the interconnection openings 278 and over the barrier layers 321a, 322a, 324a, 325a, 326a, 328a, and 329a. The filling materials 321b are electrically connected to the metal gate structures 280, and the filling materials 322b are electrically connected to the source/drain contacts 292. In some embodiments, metal materials can be filled in the openings, and excessive portions of the metal materials and the barrier layer are removed by performing a planarization (e.g., CMP) process to form the filling materials 321b, 322b, 324b, 325b, 326b, 328b, and 329b and the barrier layers 321a, 322a, 324a, 325a, 326a, 328a, and 329a. The filling materials 321b, 322b, 324b, 325b, 326b, 328b, and 329b can be made of tungsten, aluminum, copper, or other suitable materials.

In FIG. 11B, because of the planarization process mentioned above, the top surfaces of the gate vias 321, the source/drain contacts 322, the top buried conductive lines 324, 325, 326, and the buried via 328 are substantially coplanar. A height H3 of each of the top buried conductive lines 324, 325, and 326 is less than a height H4 of each of the source/drain contacts 322. In FIG. 11B, the barrier layers 322a, 325a, 328a, and 329a are connected to each other, and the filling materials 322b, 325b, 328b, and 329a are connected to each other, such that one of the source/drain contacts 322, the top buried conductive line 325, the buried vias 328, 329, one of the source/drain contacts 292, and the bottom buried conductive line 295 shown in FIG. 11B are electrically connected to each other.

Figure 12A:
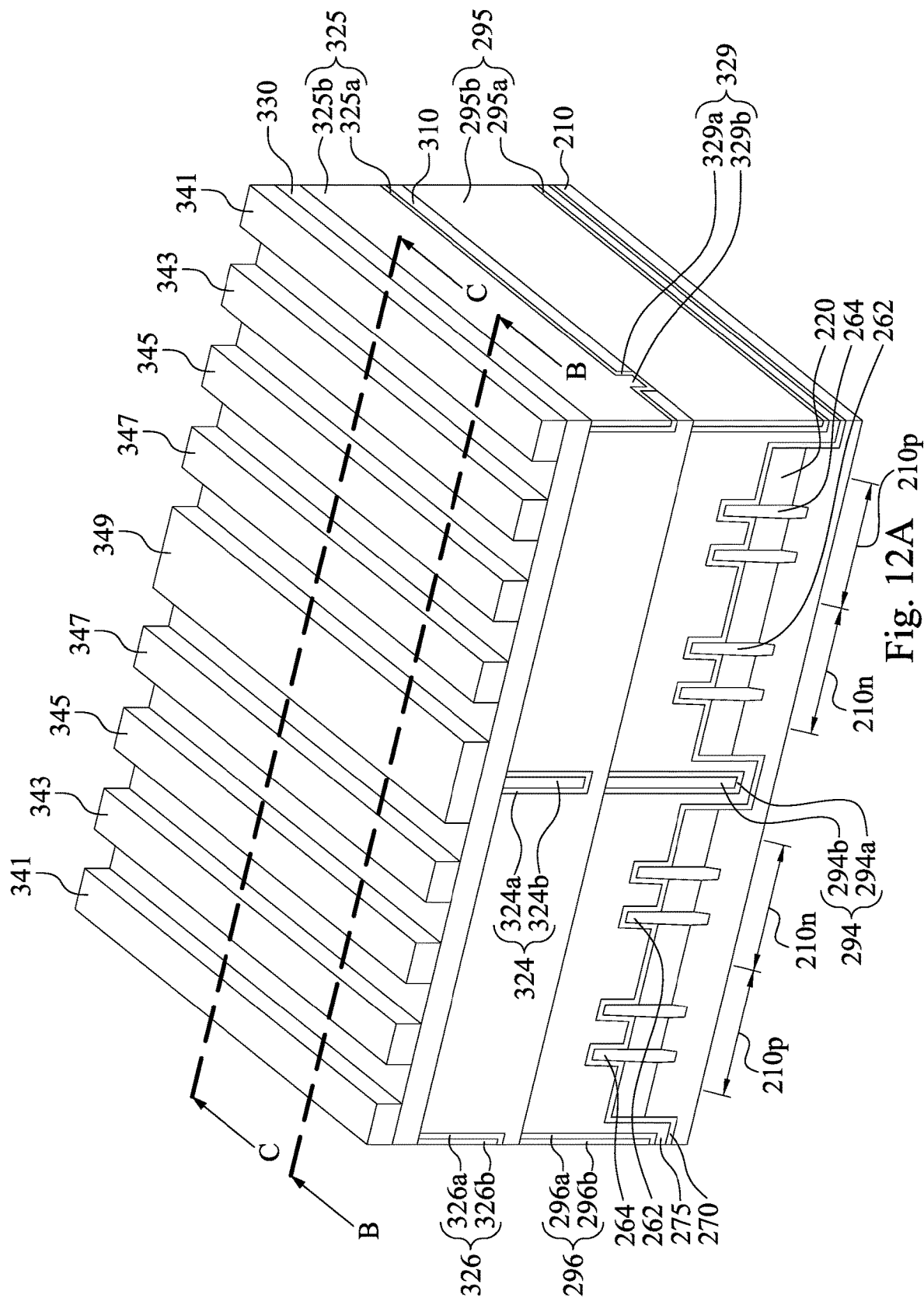
Figure 12B:
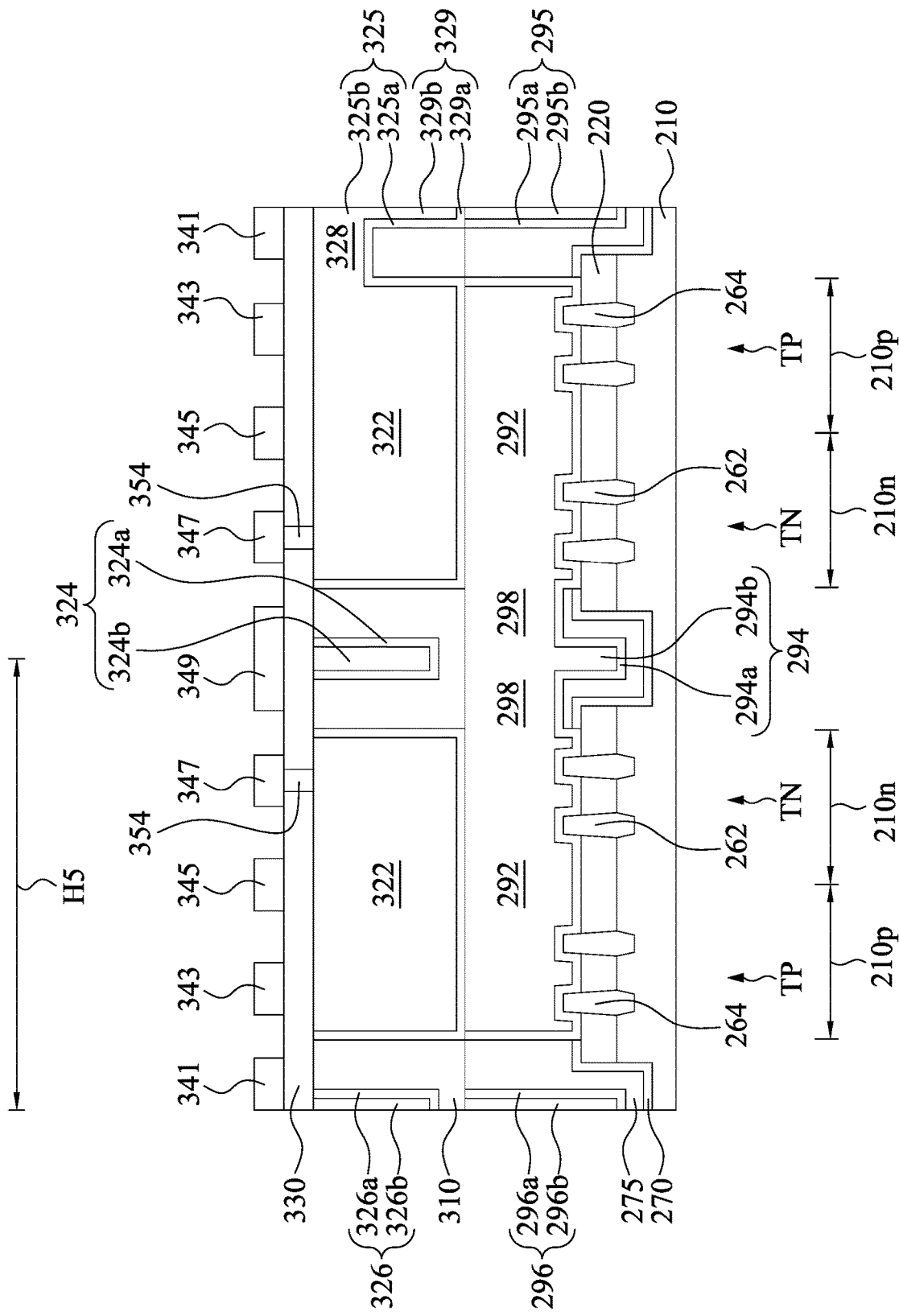
Figure 12C:
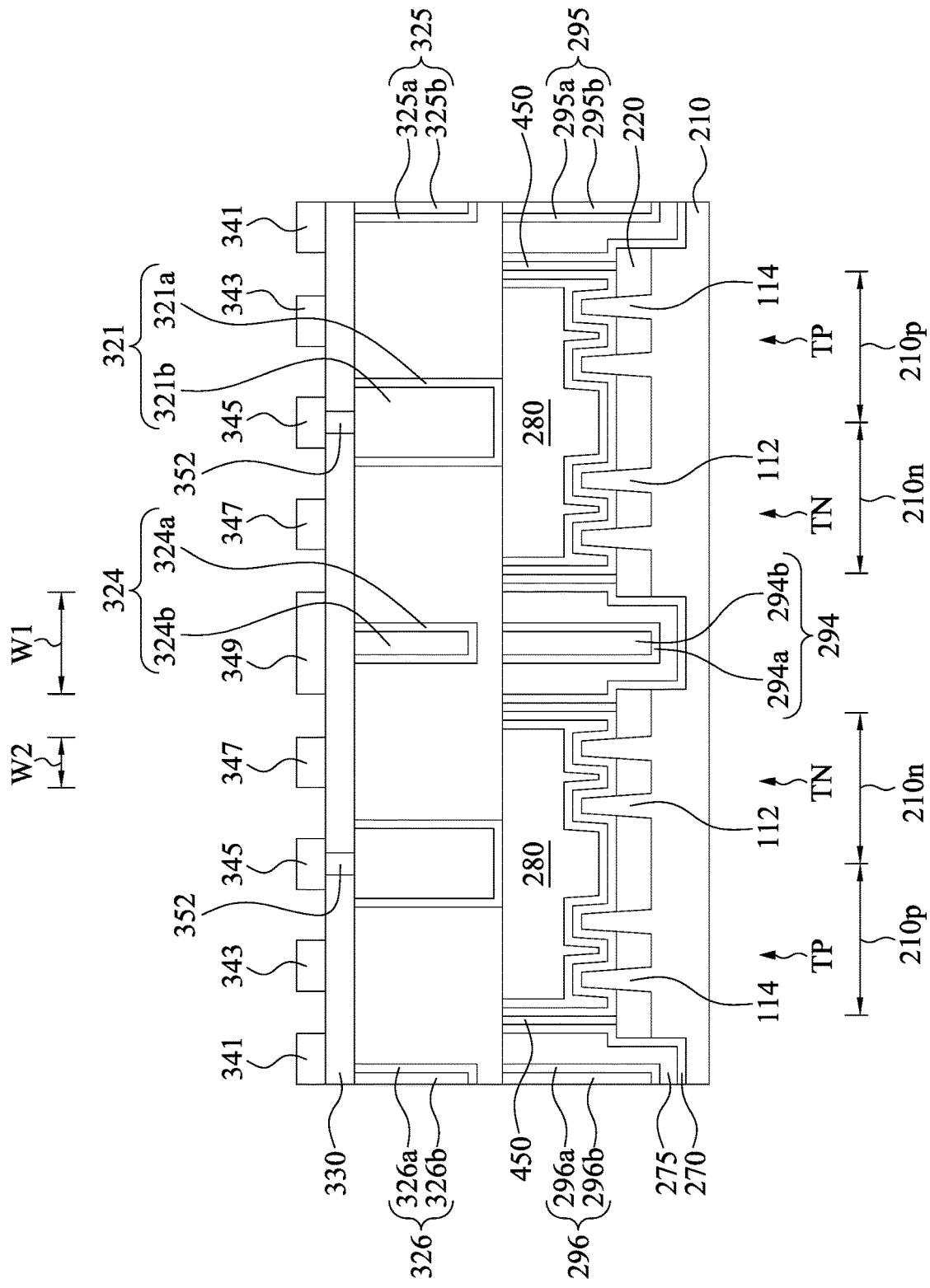

Reference is made to FIGS. 12A-12C, where FIG. 12B is a cross-sectional view taken along line B-B in FIG. 12A, and FIG. 12C is a cross-sectional view taken along line C-C in FIG. 12A. A third ILD 330 is then formed on the structure of FIG. 11A. The third ILD 330 may be formed by chemical vapor deposition (CVD), high-density plasma CVD, spin-on, sputtering, or other suitable methods. In some embodiments, the third ILD 330 includes silicon oxide. In some other embodiments, the third ILD 330 may include silicon oxy-nitride, silicon nitride, or a low-k material.

A plurality of conductive lines 341, 343, 345, 347, and 349 are formed above the third ILD 330. In some embodiments, the formation of the conductive lines 341, 343, 345, 347, and 349 includes damascene process, and may be electrically connected to the N-type devices TN and/or P-type devices TP through vias formed in the third ILD 330. For example, the conductive line 345 is coupled to the gate structure 280 through a via 352 and the gate via 321, and/or the conductive line 347 is coupled to the epitaxial structures 262 and 264 through a via 354 and the source/drain contacts 322 and 292. It is noted that the formations and/or configurations of the conductive lines 341, 343, 345, 347, and 349 are an example, and should not limit the present disclosure. In some embodiments, each of the conductive lines 341, 343, 345, 347, and 349 includes a barrier layer and a filling material over the barrier layer. In some embodiments, the conductive lines 341 and 349 may be power lines, and the conductive lines 343, 345, and 347 may be signal lines. In some embodiments, the width W1 of the conductive line 349 is greater than a width W2 of the conductive line 347 (or 345 or 343). The conductive line 341 may be shared with a cell adjacent to the structure shown in FIGS. 12A-12C, such that the conductive line 341 may have a width substantially the same as the width W1 of the conductive line 349.

In FIGS. 12A-12C, since the semiconductor device includes the top and/or bottom buried conductive lines 324, 325, 326, 294, 295, and/or 296, internal electrically connection between the N-type devices TN and the P-type devices TP can be achieved by using the top and/or bottom buried conductive lines 324, 325, 326, 294, 295, and/or 296. The top and/or bottom buried conductive lines 324, 325, 326, 294, 295, and/or 296 are directly under the conductive lines 341 and 349 (e.g., the power lines), such that the top and/or bottom buried conductive lines 324, 325, 326, 294, 295, and/or 296 do not occupy the layout area of the semiconductor device. With such configuration, the numbers of the conductive lines (e.g., the conductive lines 341, 343, 345, 347, and 349) above the third ILD 330 can be reduced, and the cell height H5 of the semiconductor device can be reduced. Further, the buried conductive lines 294, 295, and/or 296 have a benefits for relieve of pressure or tension of the first ILD 275 (and the isolation structures 220).

Figure 13A:
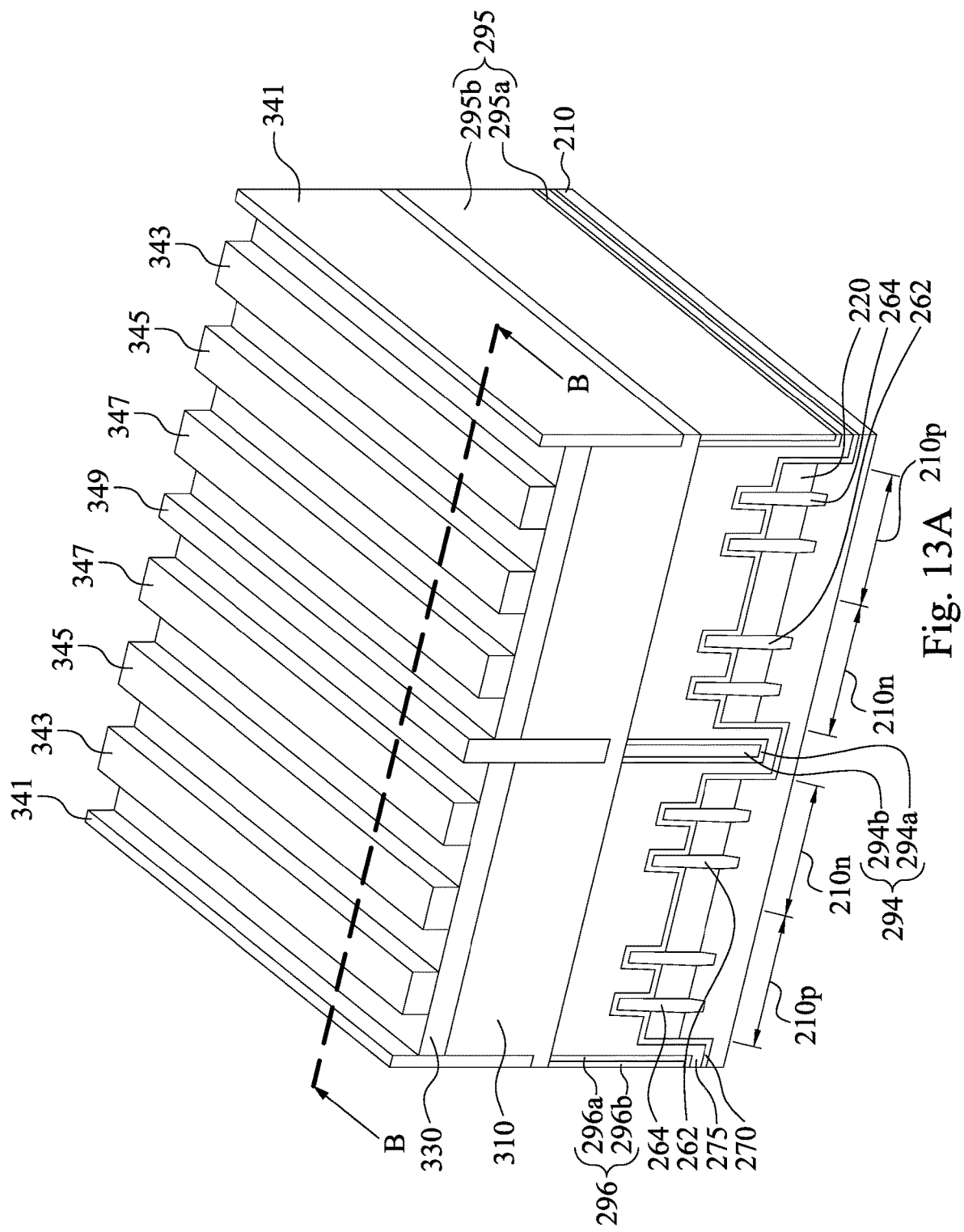
FIG. 13A is a perspective view of a semiconductor device in accordance with some embodiments of the present disclosure.
Figure 13B:
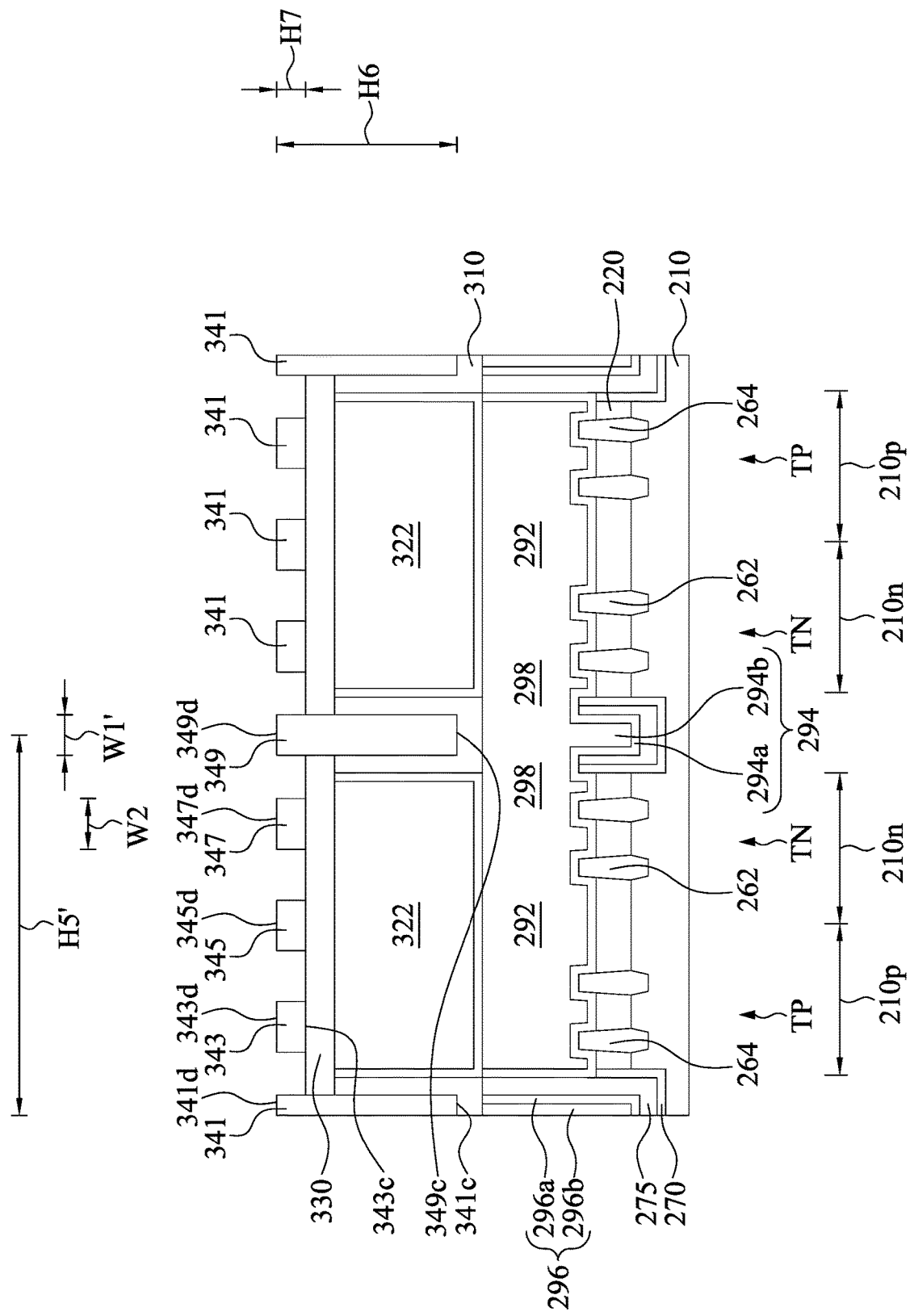
FIG. 13B is a cross-sectional view taken along line B-B in FIG. 13A.

FIG. 13A is a perspective view of a semiconductor device in accordance with some embodiments of the present disclosure, and FIG. 13B is a cross-sectional view taken along line B-B in FIG. 13A. The difference between the semiconductor devices in FIGS. 13A-13B and FIGS. 12A-12C pertains to the configuration of the conductive lines 341 and 349. In FIGS. 13A and 13B, the top buried conductive lines 324, 325, and 326 (see FIG. 12B) are omitted, and the conductive lines 341 and 349 extend into the second ILD 310. That is, a height H6 of each of the conductive lines 341 and 349 is greater than a height H7 of each of the conductive lines 343, 345, and 347. The top surfaces 341d, 343d, 345d, 347d, and 349d of the conductive lines 341, 343, 345, 347, and 349 are substantially coplanar, and the bottom surfaces 341c and 349c of the conductive lines 341 and 349 is lower than the bottom surfaces of 343c of the conductive line 343 (and the bottom surfaces of the conductive lines 345 and 347). The buried conductive line 294 is directly under the conductive line 349, and the buried conductive lines 295 and 296 are respectively and directly under the conductive lines 341, such that the buried conductive lines 294, 295, and 296 do not occupy the layout area of the semiconductor device. In some embodiments, a buried via (e.g., the buried via 328 in FIG. 12B) can be formed in the second ILD 310 to interconnect the conductive line 341 (or 349) and the source/drain contact 322 (or the gate via 321 in FIG. 12C). In some embodiments, another buried via (e.g., the buried via 329 in FIG. 12B) can be formed in the second ILD 310 to interconnect the conductive line 341 (or 349) and the bottom buried conductive line 295 (or 294 or 296). In FIGS. 13A and 13B, since the conductive lines 341 and 349 extend into the second ILD 310, the electrically conductivity thereof can be increased, and the width W1' of the conductive lines 341 and 349 can be reduced. In some embodiments, the width W1' of the conductive lines 341 and 349 is not greater than the width W2 of the conductive lines 343, 345, and/or 347. With such configuration, the cell height H5' of the semiconductor device can be further reduced. Other relevant structural details of the semiconductor device in FIGS. 13A and 13B are substantially the same as or similar to the semiconductor device in FIGS. 12A-12C, and, therefore, a description in this regard will not be repeated hereinafter.

Figure 14A:
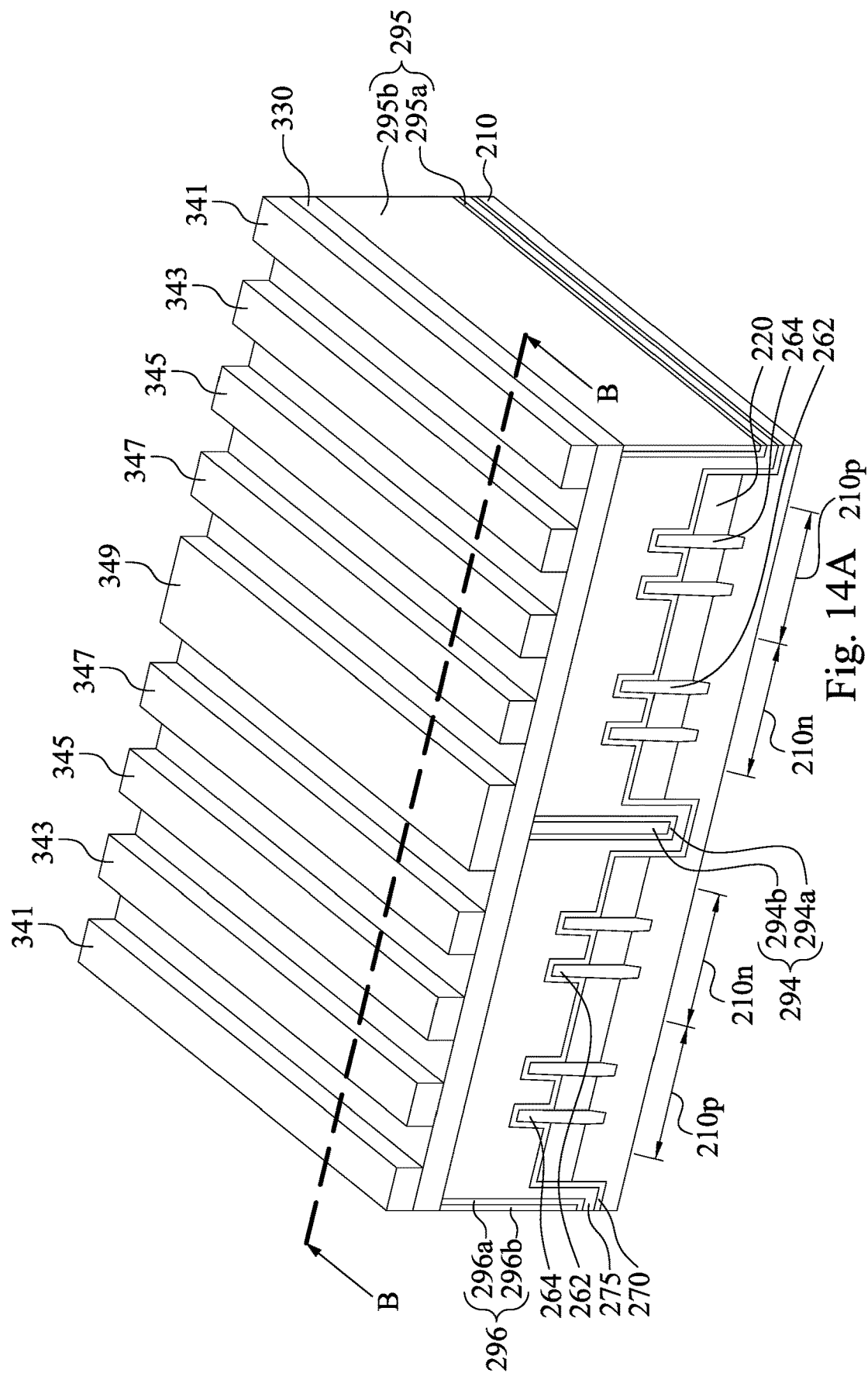
FIG. 14A is a perspective view of a semiconductor device in accordance with some embodiments of the present disclosure.
Figure 14B:
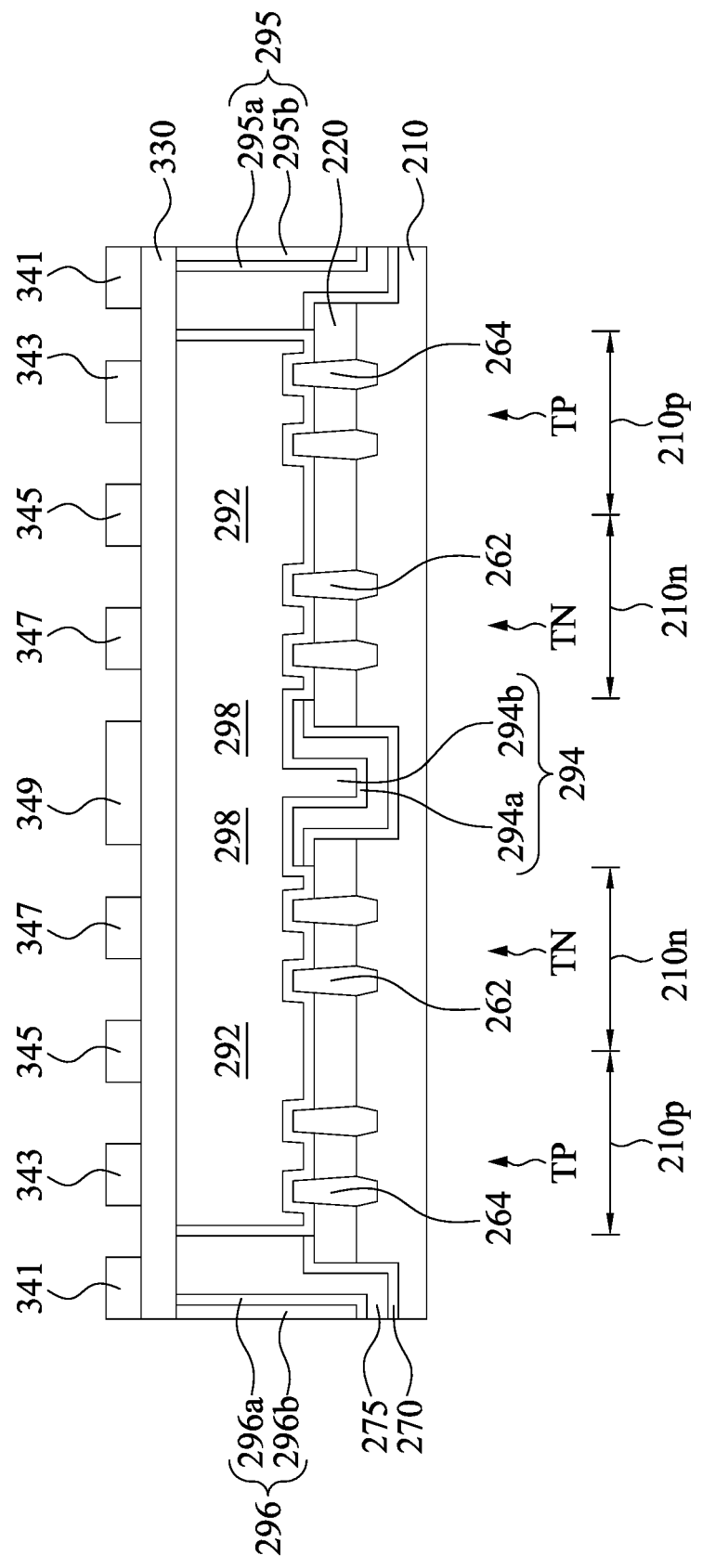
FIG. 14B is a cross-sectional view taken along line B-B in FIG. 14A.

FIG. 14A is a perspective view of a semiconductor device in accordance with some embodiments of the present disclosure, and FIG. 14B is a cross-sectional view taken along line B-B in FIG. 14A. The difference between the semiconductor devices in FIGS. 14A-14B and FIGS. 12A-12C pertains to the presence of the second ILD 310, the top buried conductive lines 324, 325, and 326, and the source/drain contacts 322. In FIGS. 14A and 14B, the second ILD 310, the top buried conductive lines 324, 325, and 326, and the source/drain contacts 322 (see FIG. 12B) are omitted, and the third ILD 330 is in direct contact with the first ILD 275. That is, there is only one level of the buried conductive lines. Other relevant structural details of the semiconductor device in FIGS. 14A and 14B are substantially the same as or similar to the semiconductor device in FIGS. 12A-12C, and, therefore, a description in this regard will not be repeated hereinafter.

It is noted that the levels of the buried conductive lines mentioned above (e.g., two levels in FIGS. 12A-12C and one level in FIGS. 14A-14B) are illustrative, and should not limit the present disclosure. In some other embodiments, the semiconductor device may include more than two levels of the buried conductive lines.

Figure 15A:
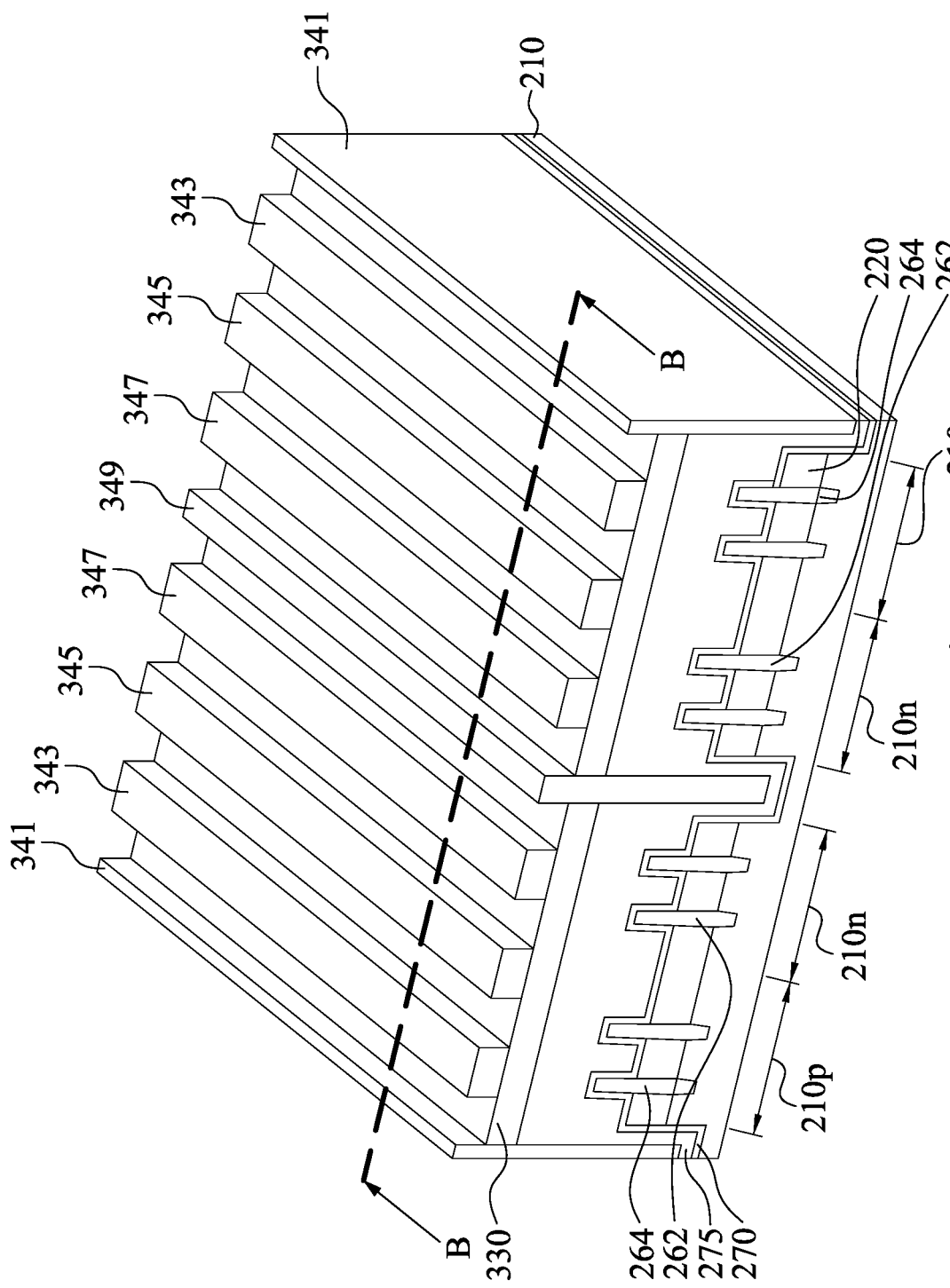
FIG. 15A is a perspective view of a semiconductor device in accordance with some embodiments of the present disclosure.

FIG. 15A is a perspective view of a semiconductor device in accordance with some embodiments of the present disclosure, and FIG. 15B is a cross-sectional view taken along line B-B in FIG. 15A. The difference between the semiconductor devices in FIGS. 15A-15B and FIGS. 14A-14B pertains to the configuration of the conductive lines 341 and 349. In FIGS. 15A and 15B, the bottom buried conductive lines 294, 295, and 296 (see FIG. 14B) are omitted, and the conductive lines 341 and 349 extend into the first ILD 275. That is, a height H6' of each of the conductive lines 341 and 349 is greater than a height H7' of each of the conductive lines 343, 345, and 347. The top surfaces of the conductive lines 341, 343, 345, 347, and 349 are substantially coplanar, and the bottom surfaces 341c and 349c of the conductive lines 341 and 349 is lower than the bottom surfaces of 343c of the conductive line 343 (and the bottom surfaces of the conductive lines 345 and 347). In some embodiments, a buried via (e.g., the buried via 298 in FIG. 12B) can be formed in the first ILD 275 to interconnect the conductive line 341 (or 349) and the source/drain contact 292 (or the metal gate structure 280 in FIG. 7A). In FIGS. 15A and 15B, since the conductive lines 341 and 349 extend into the first ILD 275, the electrically conductivity thereof can be increased, and the width W l' of the conductive lines 341 and 349 can be reduced. With such configuration, the cell height H5' of the semiconductor device can be reduced. Other relevant structural details of the semiconductor device in FIGS. 15A and 15B are substantially the same as or similar to the semiconductor device in FIGS. 14A and 14B, and, therefore, a description in this regard will not be repeated hereinafter.

Figure 16A:
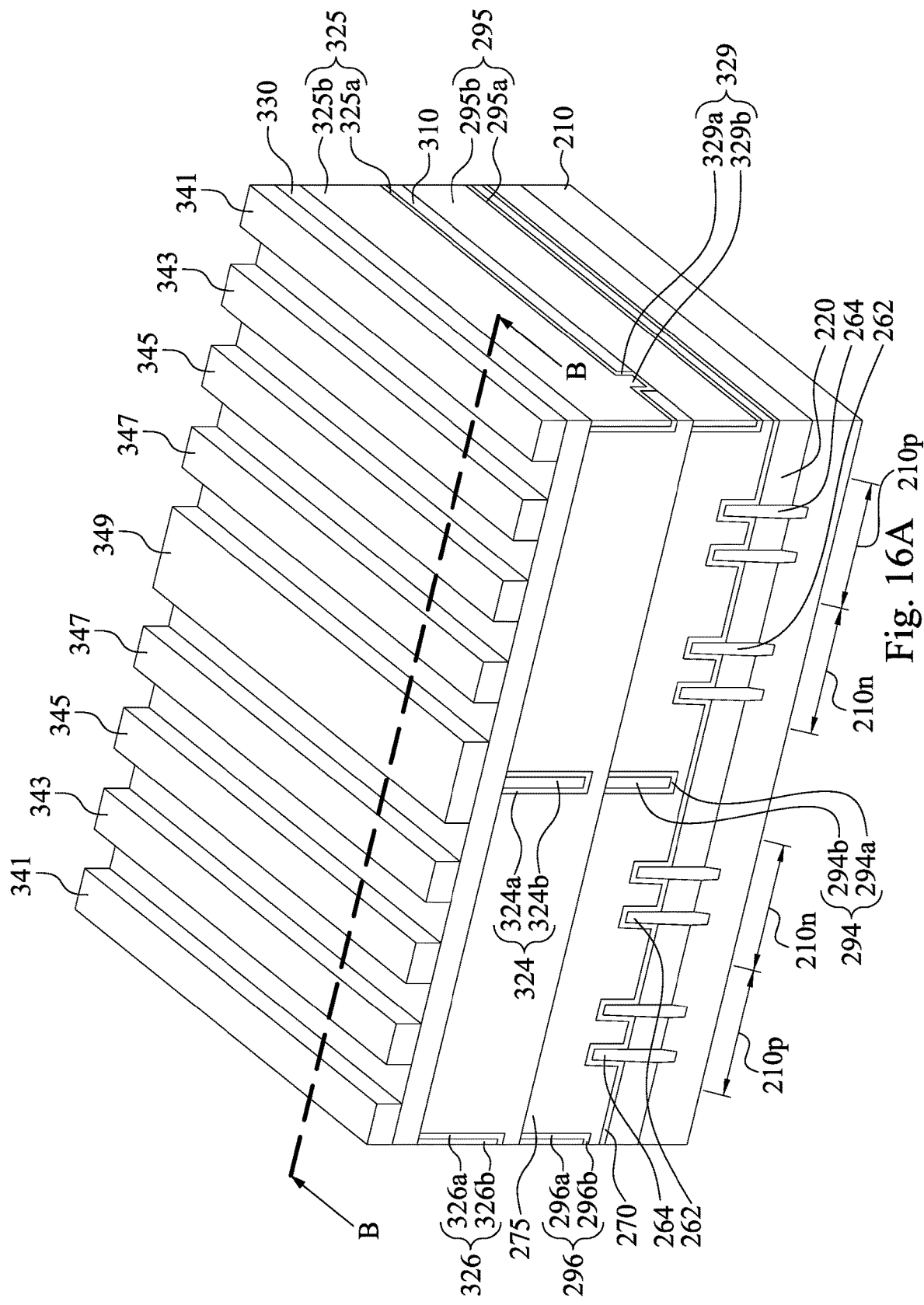
FIG. 16A is a perspective view of a semiconductor device in accordance with some embodiments of the present disclosure.
Figure 16B:
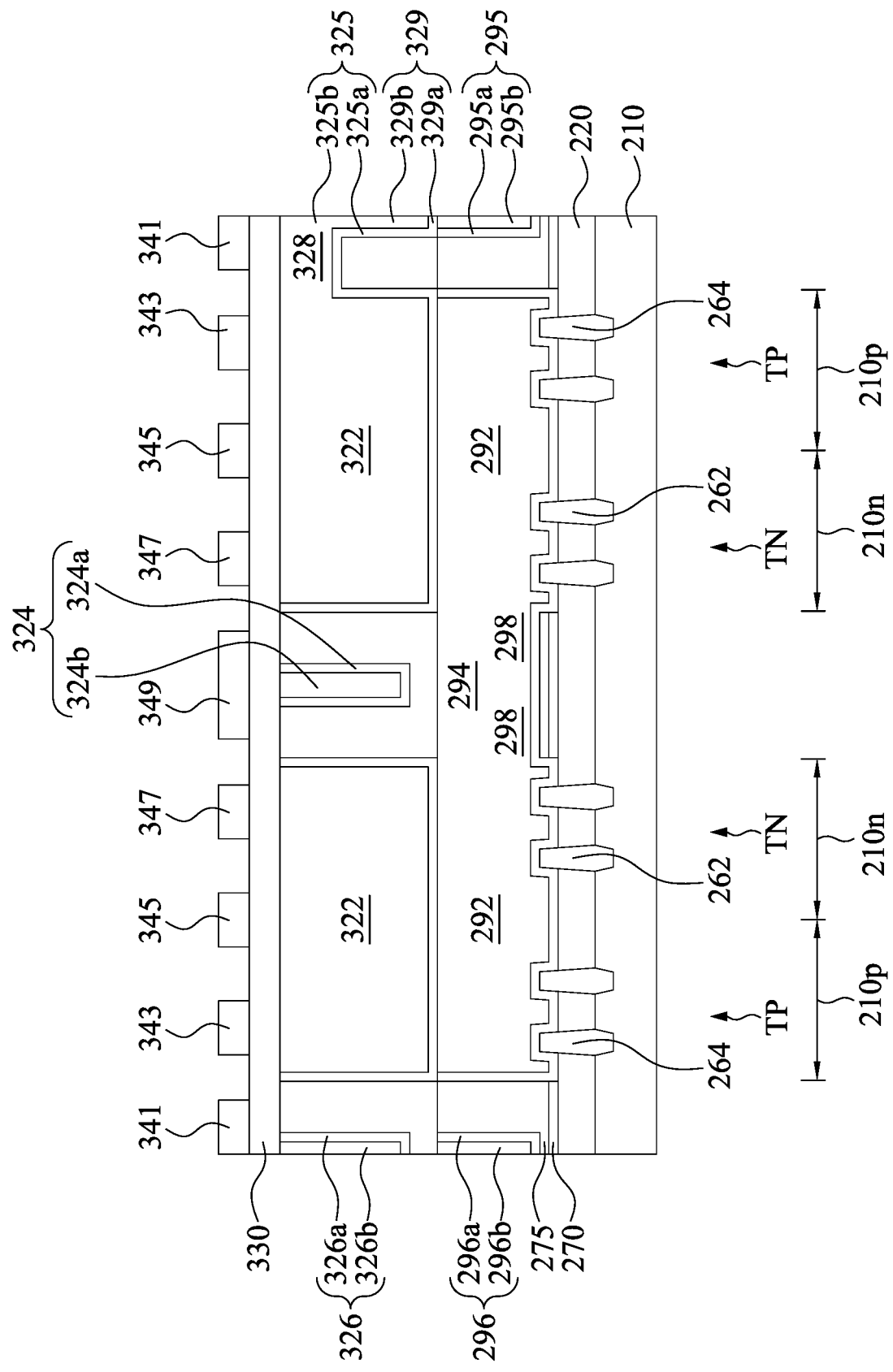
FIG. 16B is a cross-sectional view taken along line B-B in FIG. 16A.

FIG. 16A is a perspective view of a semiconductor device in accordance with some embodiments of the present disclosure, and FIG. 16B is a cross-sectional view taken along line B-B in FIG. 16A. The difference between the semiconductor devices in FIGS. 16A-16B and FIGS. 12A-12C pertains to the depth of the bottom buried conductive lines 294, 295, and 296. In FIGS. 16A and 16B, the etching process shown in FIG. 6 is omitted, such that the bottom buried conductive lines 294, 295, and 296 are formed above the isolation structures 220. Other relevant structural details of the semiconductor device in FIGS. 16A and 16B are substantially the same as or similar to the semiconductor device in FIGS. 12A-12C, and, therefore, a description in this regard will not be repeated hereinafter.

FIGS. 17A-20C illustrate a method for manufacturing a semiconductor device at various stages in accordance with some embodiments of the present disclosure. In some embodiments, the semiconductor device shown in FIGS. 17A-20C may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 17A:
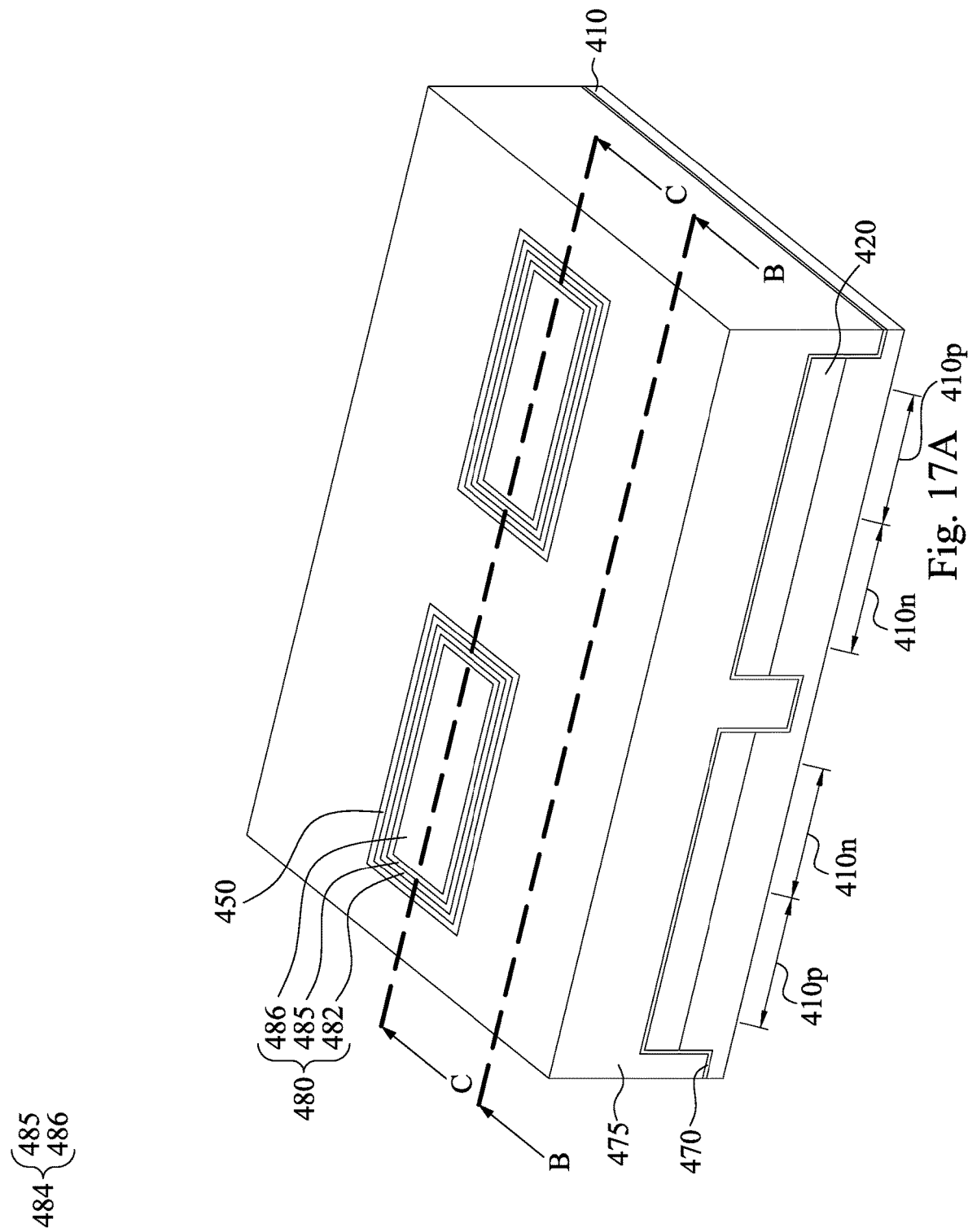
FIGS. 17A-20C illustrate a method for manufacturing a semiconductor device at various stages in accordance with some embodiments of the present disclosure.
Figure 17B:
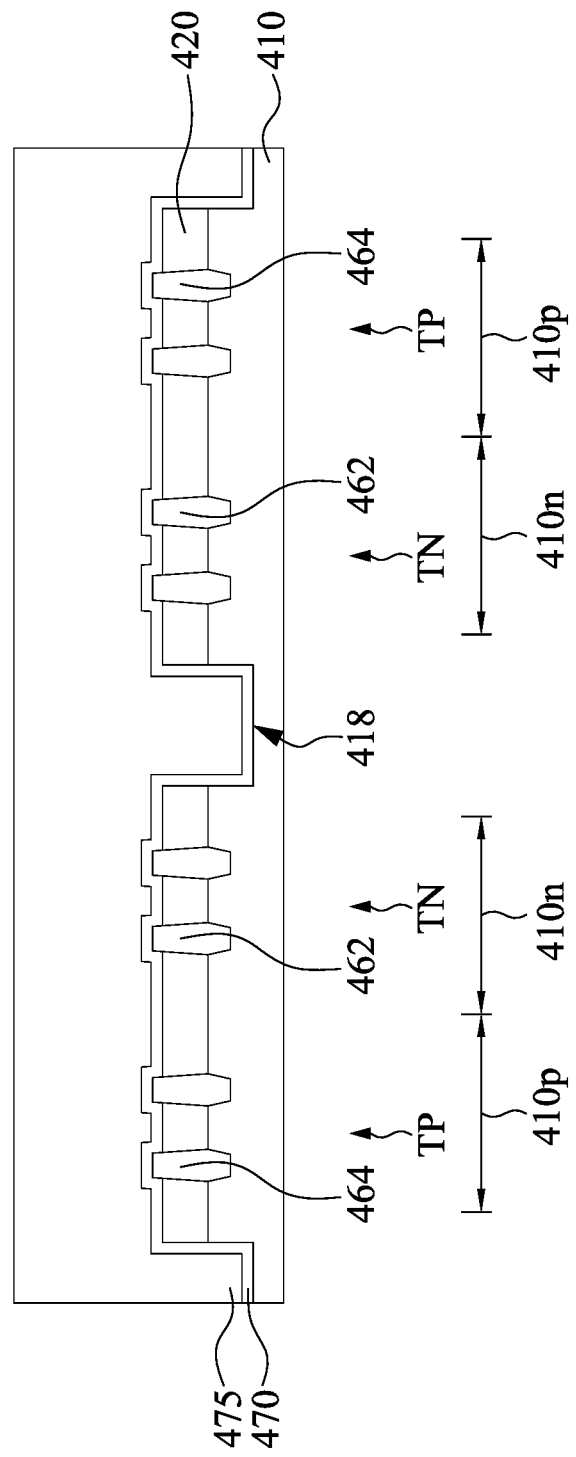
Figure 17C:
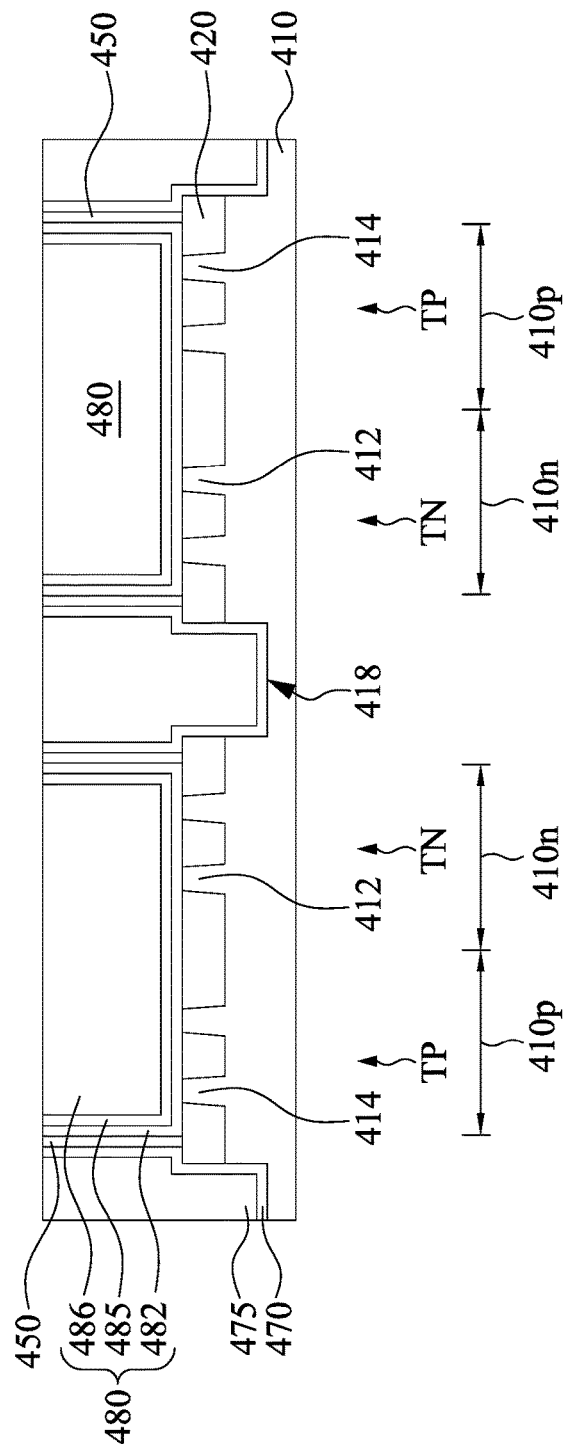

Reference is made to FIGS. 17A-17C, where FIG. 17B is a cross-sectional view taken along line B-B in FIG. 17A, and FIG. 17C is a cross-sectional view taken along line C-C in FIG. 17A. At least one N-type device TN and at least one P-type device TP are formed above a substrate 410. The N-type device TN and the P-type device TP are planar FETs in FIGS. 17A-17C. Specifically, the substrate 410 includes at least one N-type region 410n and at least one P-type region 410p. The N-type devices TN are formed on the N-type regions 410n, and the P-type devices TP are formed on the P-type regions 410p. For ease of explanation, it is assumed that in FIGS. 17A-20C, the substrate 410 includes two N-type regions 410n and two P-type regions 410p.

In some embodiments, the substrate 410 and the substrate 210 in FIG. 2 may have the same or similar material, and, therefore, a description in this regard will not be repeated hereinafter. In some embodiments, isolation structures 420 are formed in the substrate 410 to separate various devices. The isolation structures 420 and the isolation structures 220 in FIG. 3 may have the same or similar material, and, therefore, a description in this regard will not be repeated hereinafter.

Each of the N-type devices TN and P-type devices TP includes active regions 412 and 414 as channels of the N-type devices TN and P-type devices TP. The isolation structures 420 define the active regions 412 and 414 in the substrate 410. For example, the isolation structures 420 surround the active regions 412 and 414, and the active regions 412 and 414 are separated from each other by the isolation structures 420. The active regions 412 are formed in the N-type regions 410p, and the active regions 414 are formed in the P-type regions 410n. It is noted that the arrangement of the active regions 412 and 414 in FIGS. 17A-17C is illustrative, and should not limit the scope of the present disclosure.

A gate structure 480 is formed above the substrate 410 and the active regions 412 and 414. Spacer structures 450 are disposed on opposite sides of the gate structure 480. In some embodiments, the spacer structures 450 and the spacer structures 250 in FIG. 5 may have the same or similar material, and, therefore, a description in this regard will not be repeated hereinafter. The gate structure 480 includes a high-k gate dielectric layer 482, one or more work function metal layer 485, and a fill layer 486. The work function metal layer 485 and the fill layer 486 are referred to as a gate electrode 484. In some embodiments, the high-k gate dielectric layer 482 includes a material such as hafnium oxide ($HfO_2$), zirconium oxide ($ZrO_2$) or lanthanum oxide ($La_2O_3$). In some embodiments, the high-k gate dielectric layer 482 may be formed by performing an ALD process or other suitable process.

The work function metal layer 485 is conformally formed on the high-k gate dielectric layer 482. The work function metal layer 485 may include materials such as TiN, TaN, TiAlSi, TiSiN, TiAl, TaAl, or other suitable materials. In some embodiments, the work function metal layer 485 may be formed by performing an ALD process or other suitable process. The fill layer 486 is formed above the work function metal layer 485. The fill layer 486 may include material such as tungsten or aluminum.

Epitaxial structures 462 and 464 are formed on opposite sidewalls of the gate structures 480 and respectively above the N-type regions 410n and P-type regions 410p by performing, for example, a selectively growing process. In some embodiments, the epitaxial structures 462 and 464 and the epitaxial structures 262 and 264 in FIG. 5 may have the same or similar material, and, therefore, a description in this regard will not be repeated hereinafter.

In some embodiments, trenches 418 are formed in the isolation structures 420 and the substrate 410, and a contact etching stop layer (CESL) 470 and a first interlayer dielectric (ILD) 475 are sequentially formed on the isolation structures 420, the epitaxial structures 462 and 464 and surrounds the gate structure 480. In some embodiments, the first ILD 475 and the first ILD 275 in FIGS. 7A-7B may have the same or similar material, and the CESL 470 and the CESL 270 in FIGS. 7A-7B may have the same or similar material, and, therefore, a description in this regard will not be repeated hereinafter.

Figure 18A:
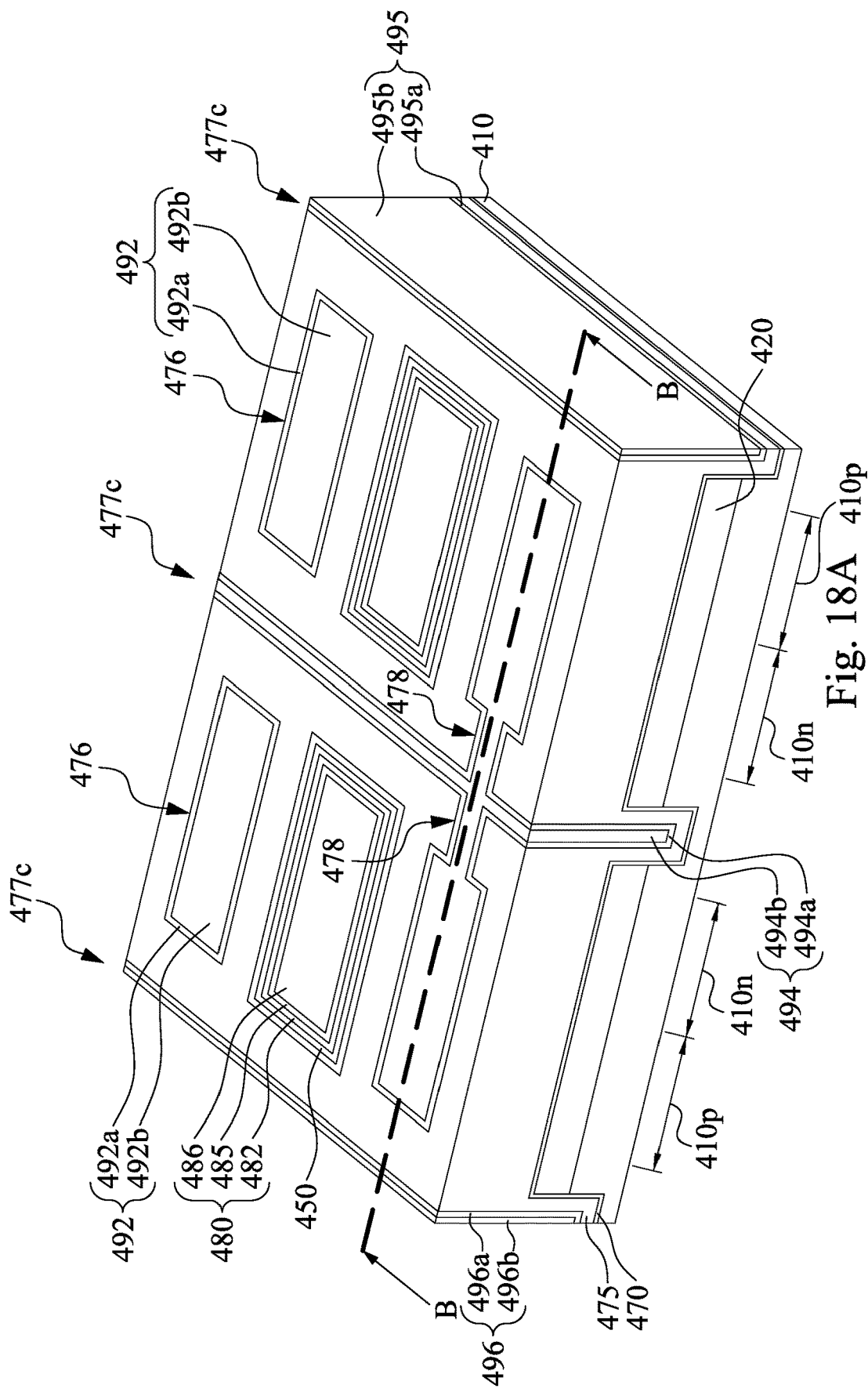
Figure 18B:
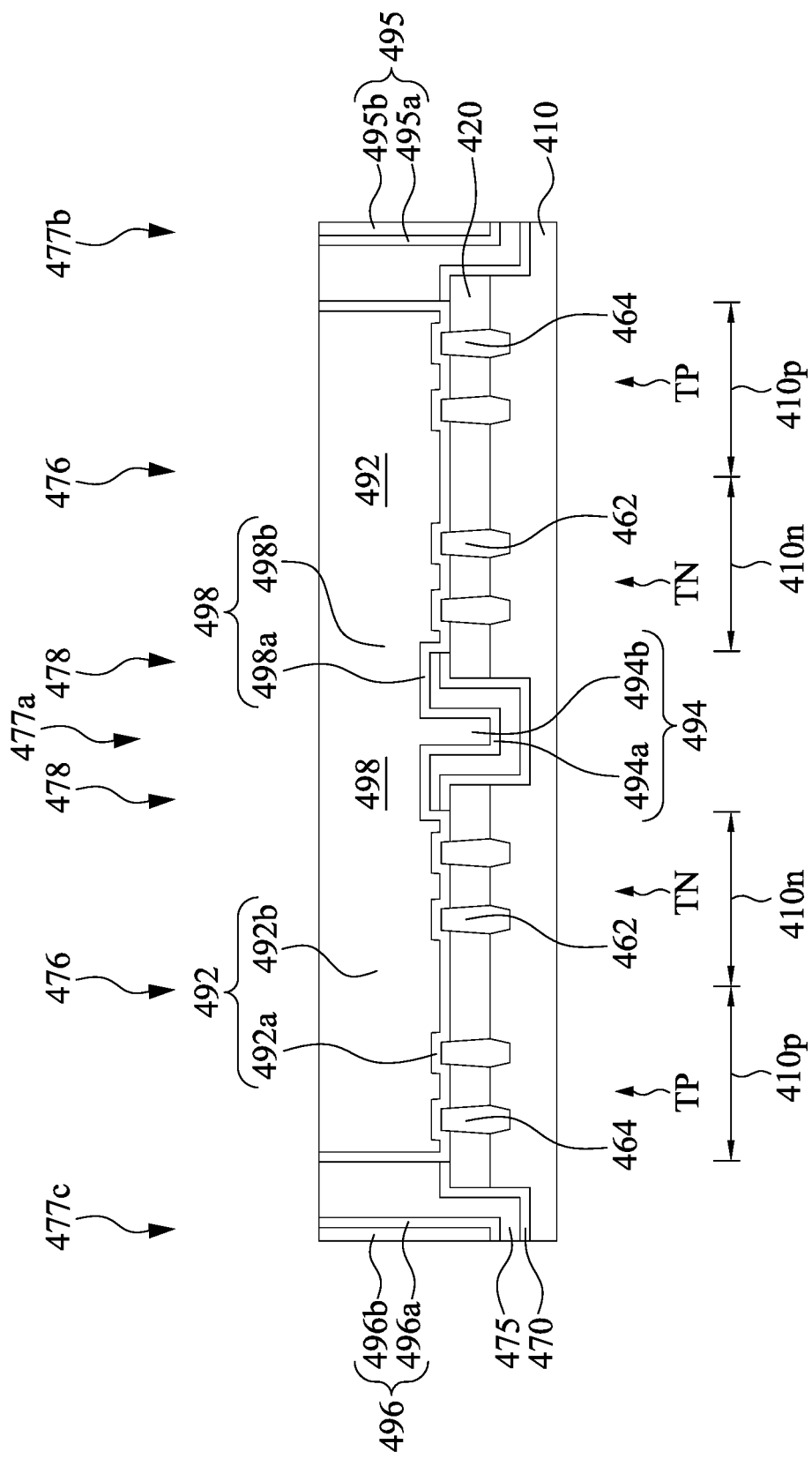

Reference is made to FIGS. 18A and 18B, where FIG. 18B is a cross-sectional view taken along line B-B in FIG. 18A. The first ILD 475 is etched to form a plurality of contact openings 476, a plurality of trenches 477a, 477b, 477c, and a plurality of interconnection openings 478, and source/drain contacts 492, bottom buried conductive lines 494, 495, 496, and buried vias 498 are respectively formed in the contact openings 476, the trenches 477a, 477b, 477c, and the interconnection openings 478. Each of the source/drain contacts 492, bottom buried conductive lines 494, 495, 496, and buried vias 498 includes an optional barrier layer 492a, 494a, 495a, 496a, and 498a and a filling material 492b, 494b, 495b, 496b, and 498b. The aforementioned processes may be the same or similar to the processes shown in FIGS. 8A-9B, and, therefore, a description in this regard will not be repeated hereinafter.

Figure 19A:
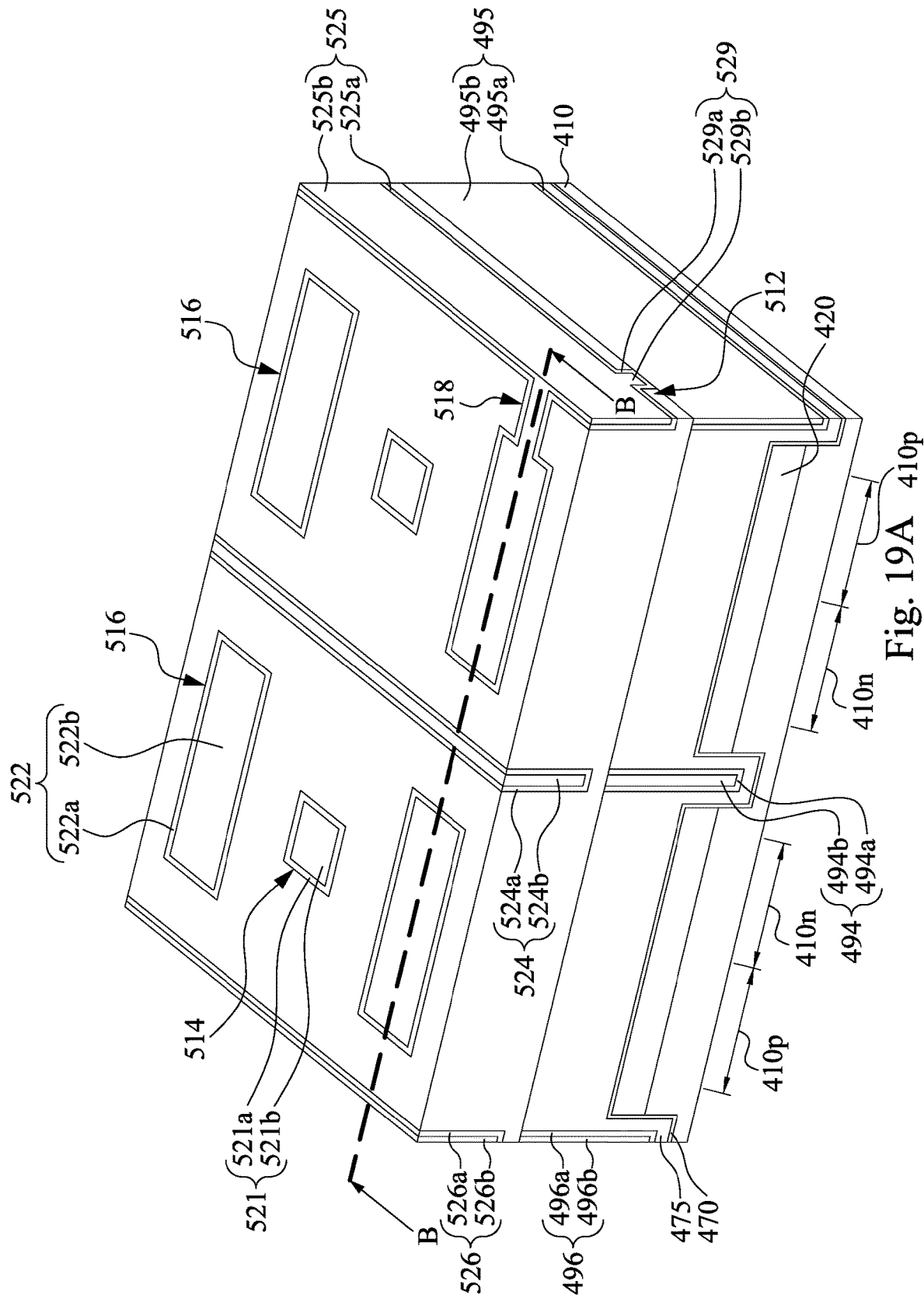
Figure 19B:
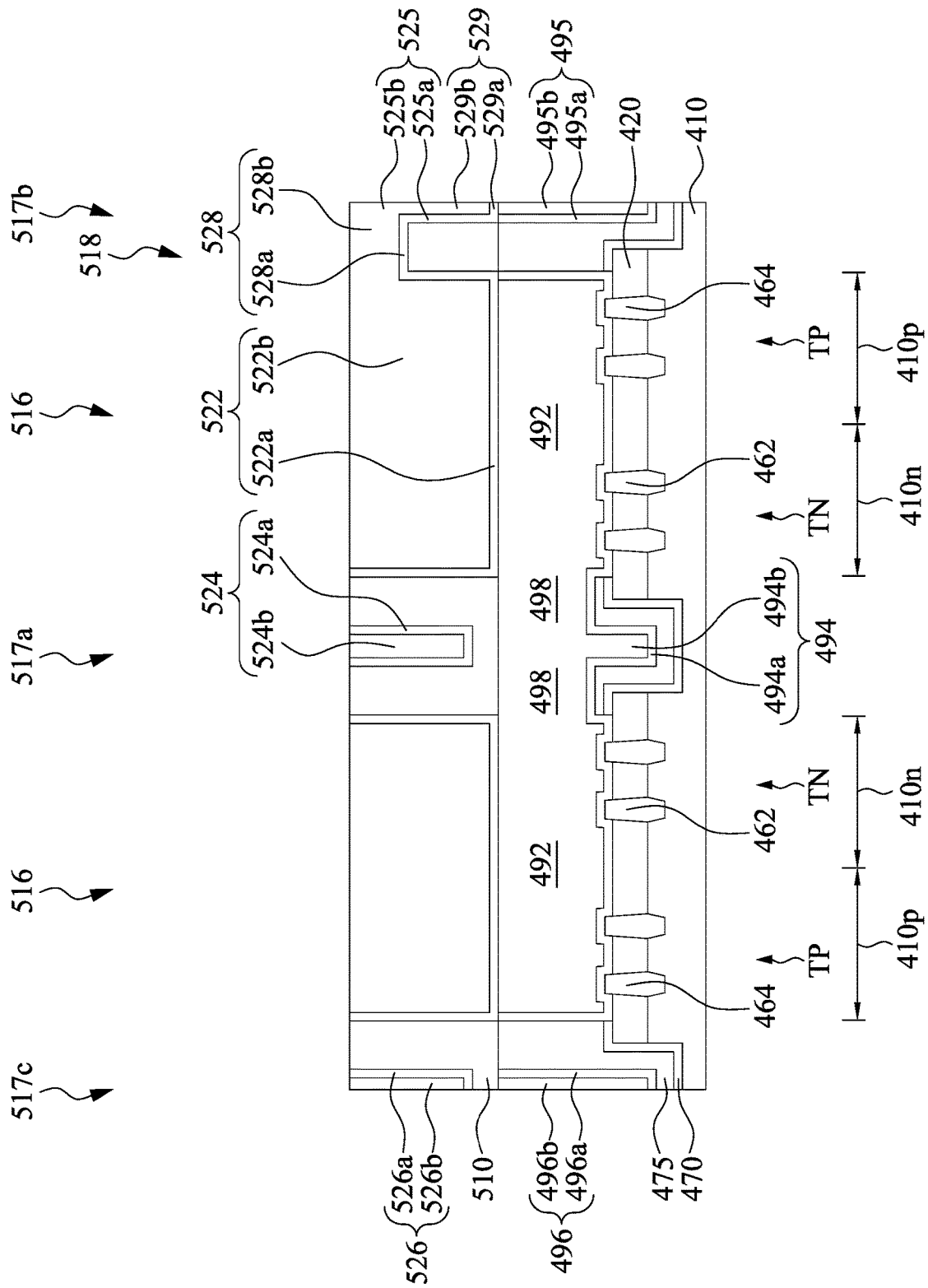

Reference is made to FIGS. 19A and 19B, where FIG. 19B is a cross-sectional view taken along line B-B in FIG.

19A. A second interlayer dielectric (ILD) 510 is then formed on the structure of FIG. 18A. Subsequently, the second ILD 510 is etched to form a plurality of gate openings 514, a plurality of contact openings 516, a plurality of trenches 517a, 517b, 517c, and a plurality of interconnection openings 518, 512. Gate vias 521, source/drain contacts 522, top buried conductive lines 524, 525, 526, and buried vias 528 and 529 are respectively formed in the gate openings 514, the contact openings 516, the trenches 517a, 517b, 517c, and the interconnection openings 512, 518. The aforementioned processes may be the same or similar to the processes shown in FIGS. 10A-11B, and, therefore, a description in this regard will not be repeated hereinafter.

Figure 20A:
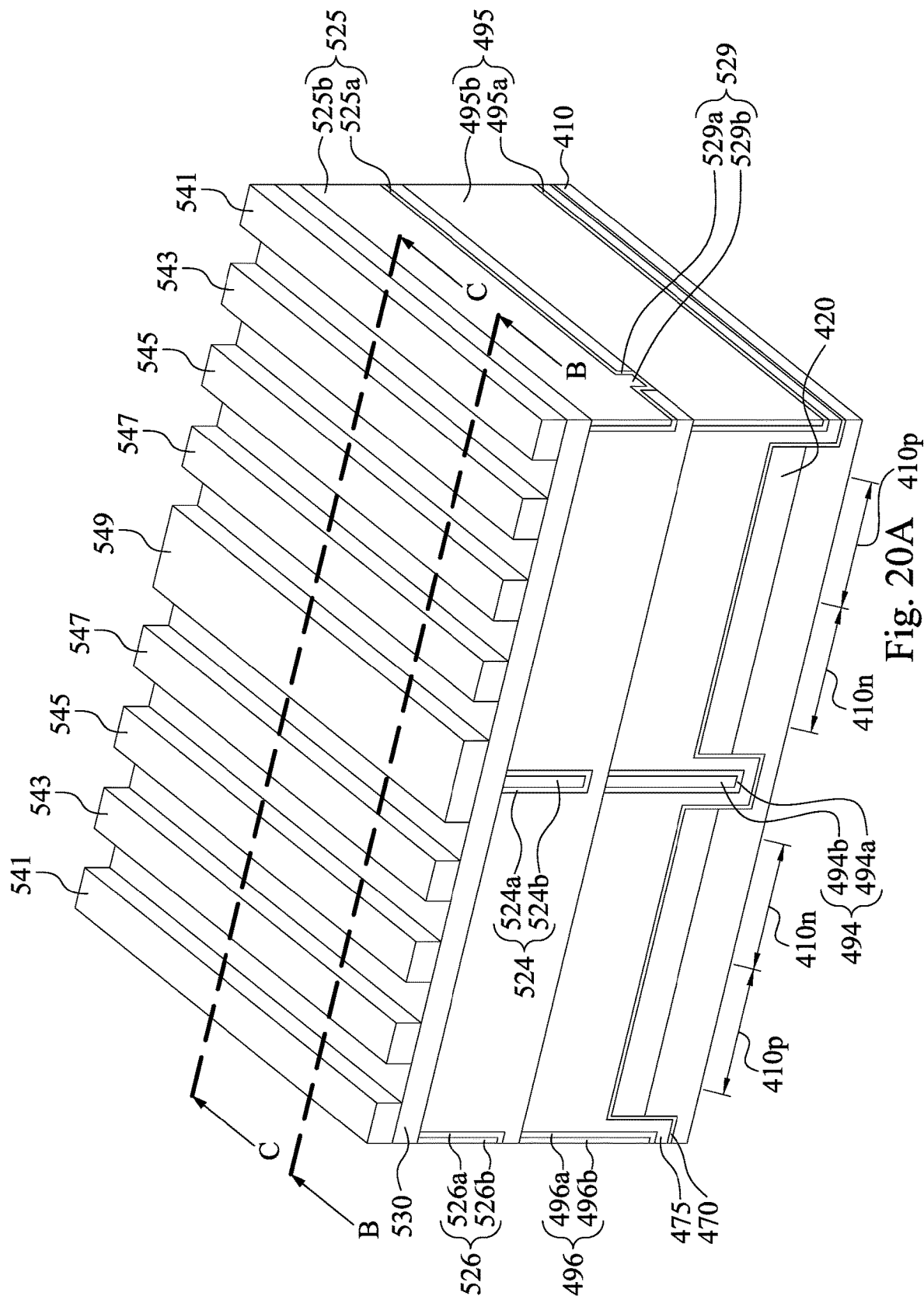
Figure 20B:
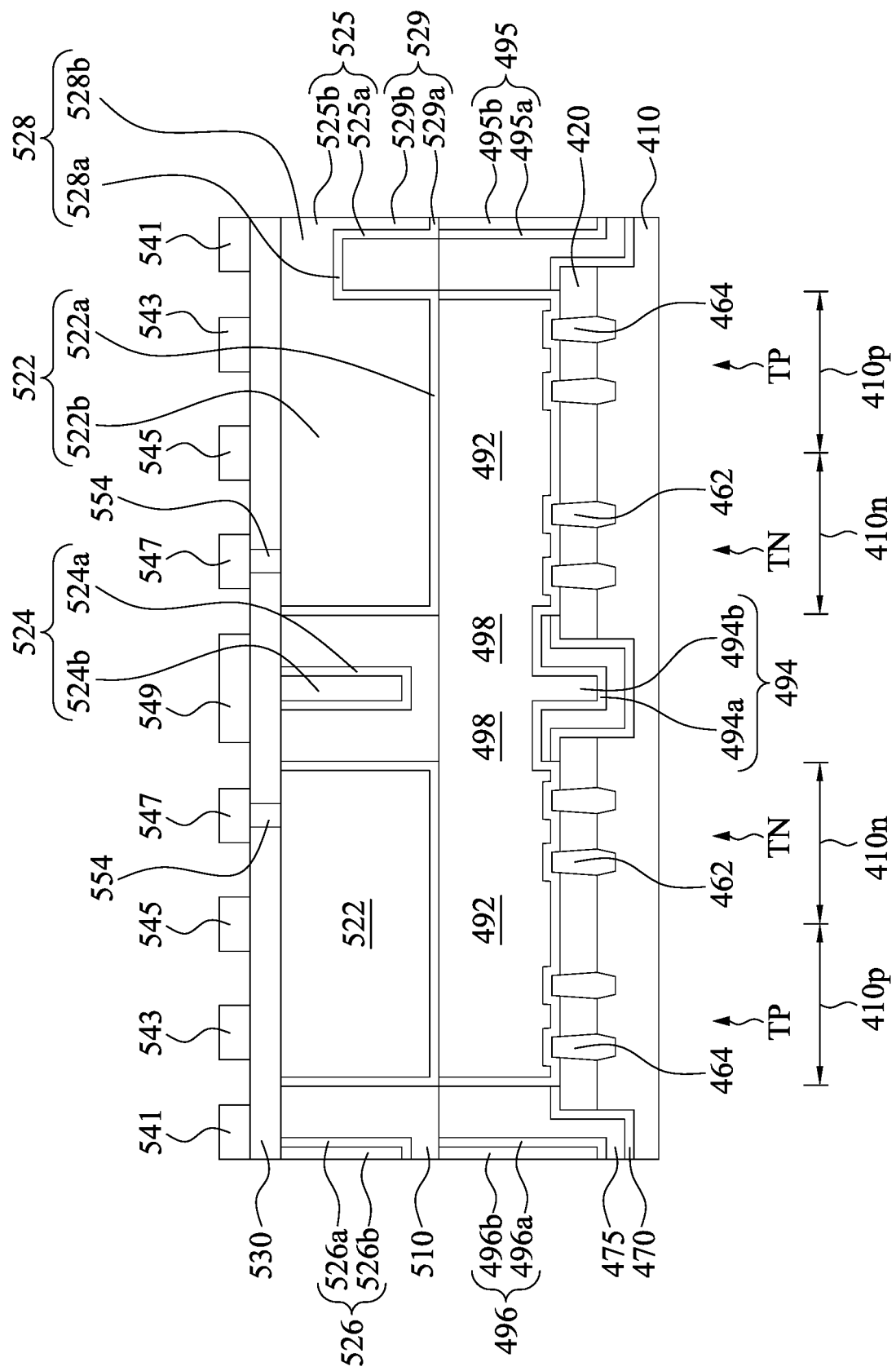
Figure 20C:
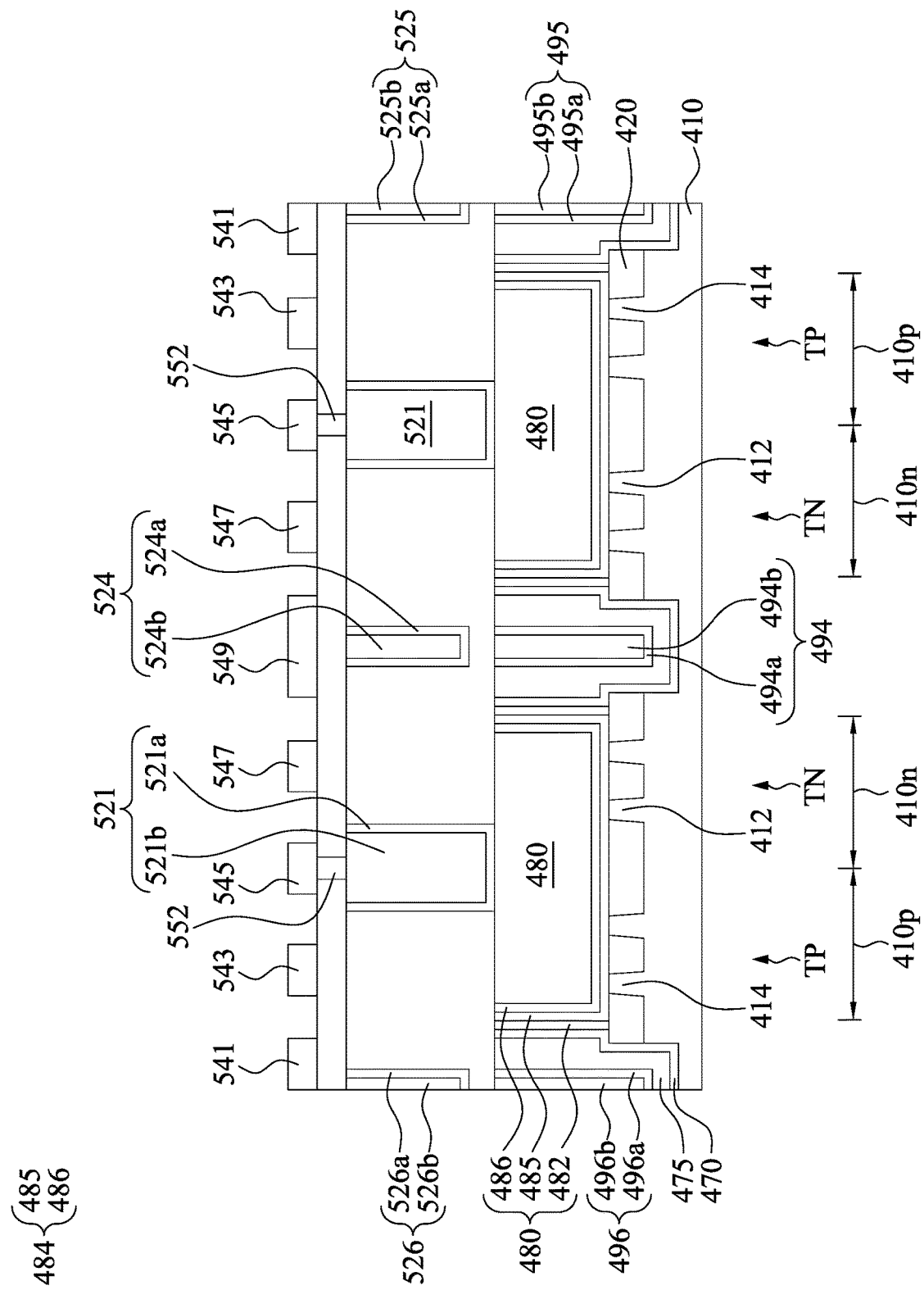

Reference is made to FIGS. 20A-20C, where FIG. 20B is a cross-sectional view taken along line B-B in FIG. 20A, and FIG. 20C is a cross-sectional view taken along line C-C in FIG. 20A. A third ILD 530 is then formed on the structure of FIG. 19A. A plurality of conductive lines 541, 543, 545, 547, and 549 are formed above the third ILD 530. In some embodiments, the conductive line 545 is coupled to the gate structure 480 through a via 552 and the gate via 521, and/or the conductive line 547 is coupled to the epitaxial structures 462 and 464 through a via 554 and the source/drain contacts 522 and 492. The aforementioned processes may be the same or similar to the processes shown in FIGS. 12A-12B, and, therefore, a description in this regard will not be repeated hereinafter.

Figure 21A:
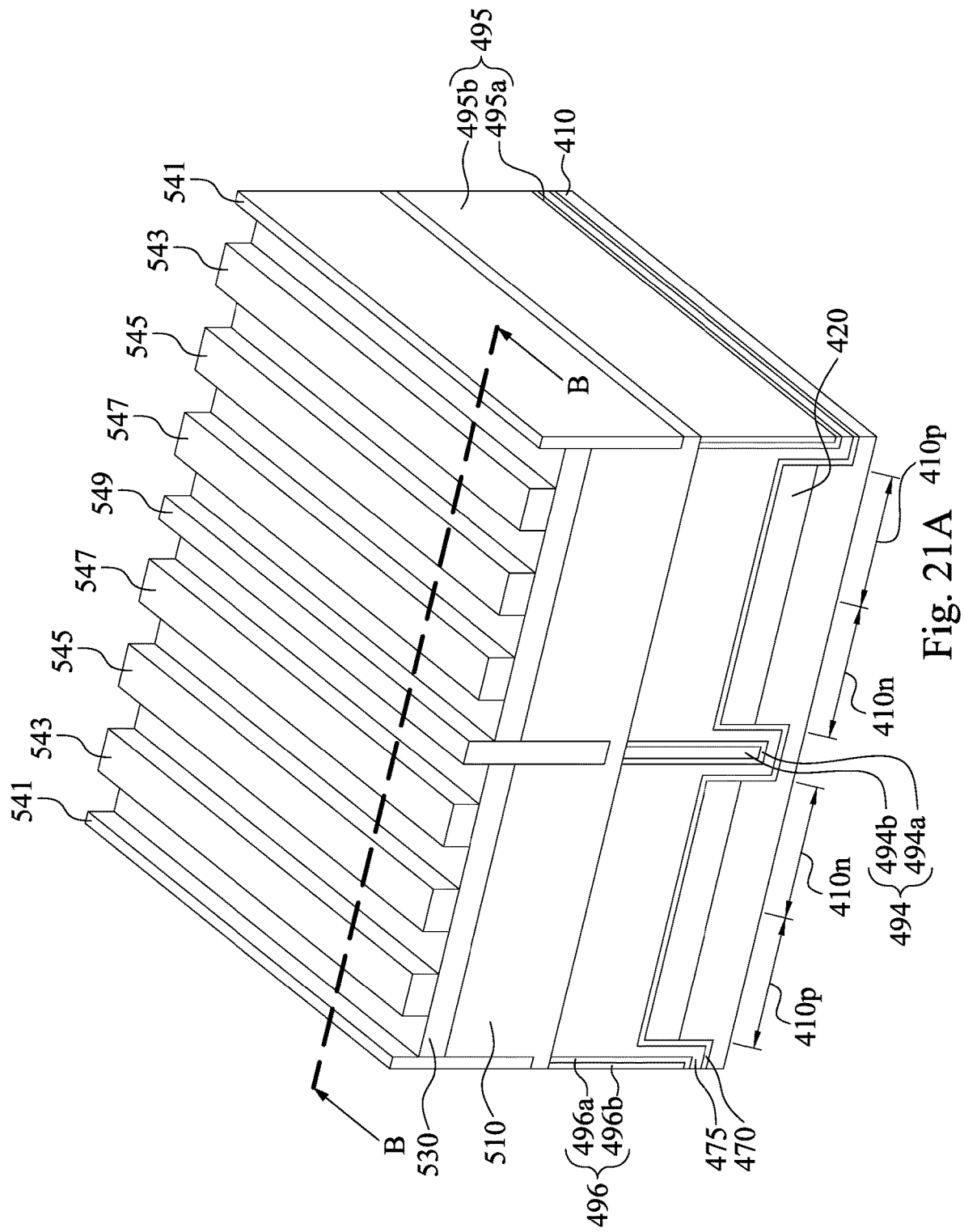
FIG. 21A is a perspective view of a semiconductor device in accordance with some embodiments of the present disclosure.
Figure 21B:
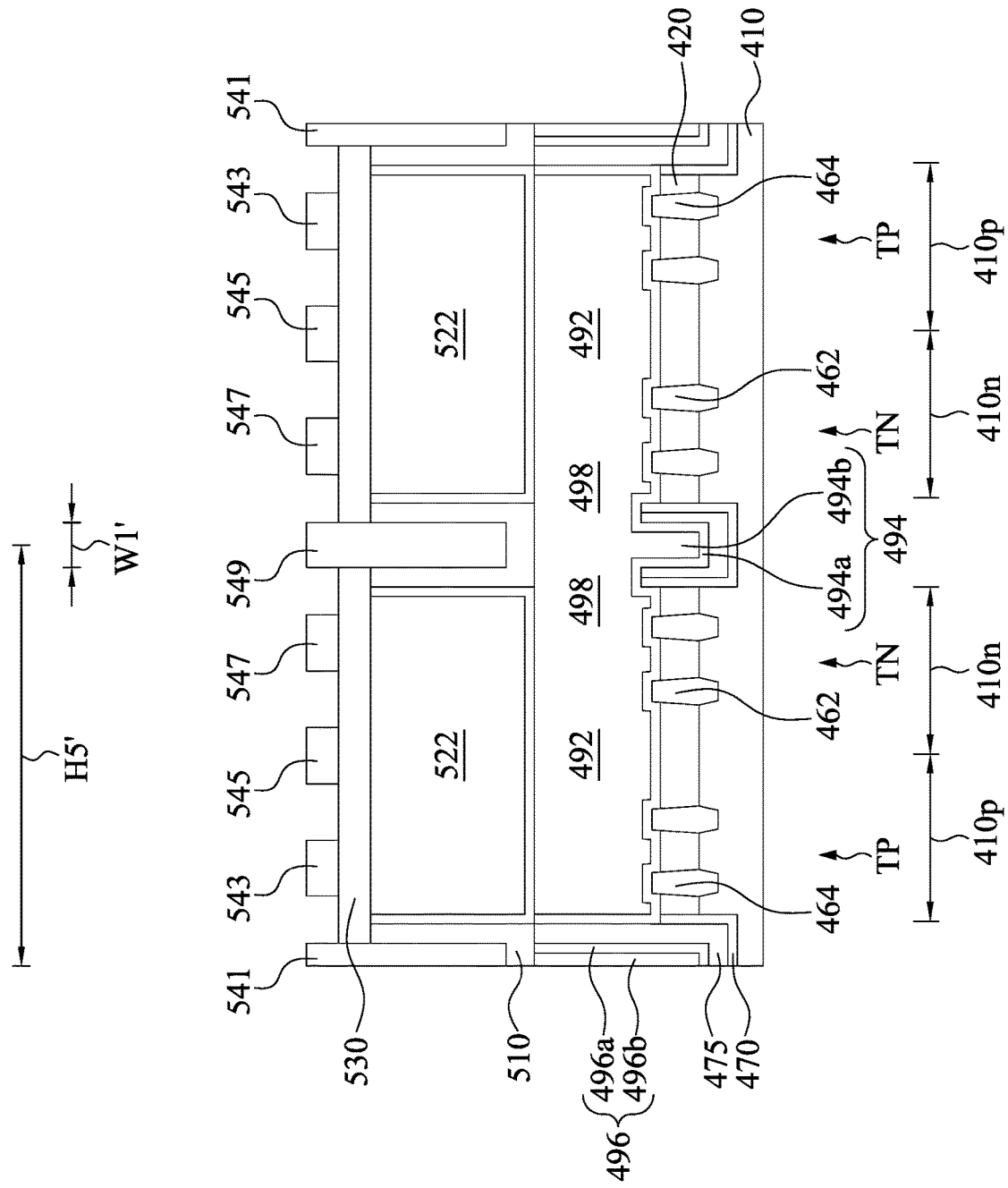
FIG. 21B is a cross-sectional view taken along line B-B in FIG. 21A.

FIG. 21A is a perspective view of a semiconductor device in accordance with some embodiments of the present disclosure, and FIG. 21B is a cross-sectional view taken along line B-B in FIG. 21A. The difference between the semiconductor devices in FIGS. 21A-21B and FIGS. 20A-20C pertains to the configuration of the conductive lines 541 and 549. In FIGS. 21A and 21B, the top buried conductive lines 524, 525, and 526 (see FIG. 20B) are omitted, and the conductive lines 541 and 549 extend into the second ILD 510. In FIGS. 21A and 21B, since the conductive lines 541 and 549 extend into the second ILD 510, the electrically conductivity thereof can be increased, and the width W1' of the conductive lines 541 and 549 can be reduced. With such configuration, the cell height H5' of the semiconductor device can be reduced. Other relevant structural details of the semiconductor device in FIGS. 21A and 21B are substantially the same as or similar to the semiconductor device in FIGS. 20A and 20B, and, therefore, a description in this regard will not be repeated hereinafter.

Figure 22A:
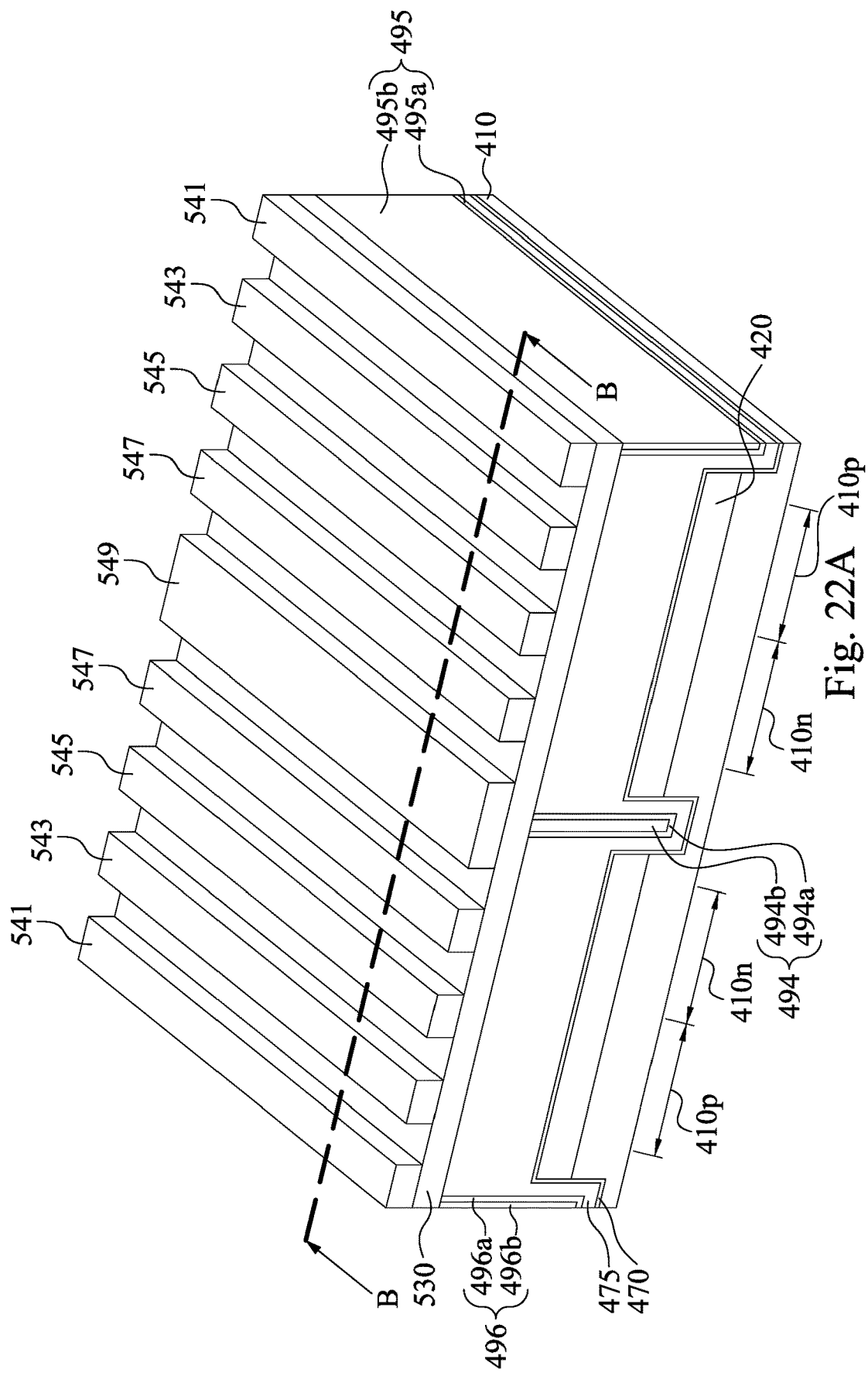
FIG. 22A is a perspective view of a semiconductor device in accordance with some embodiments of the present disclosure.
Figure 22B:
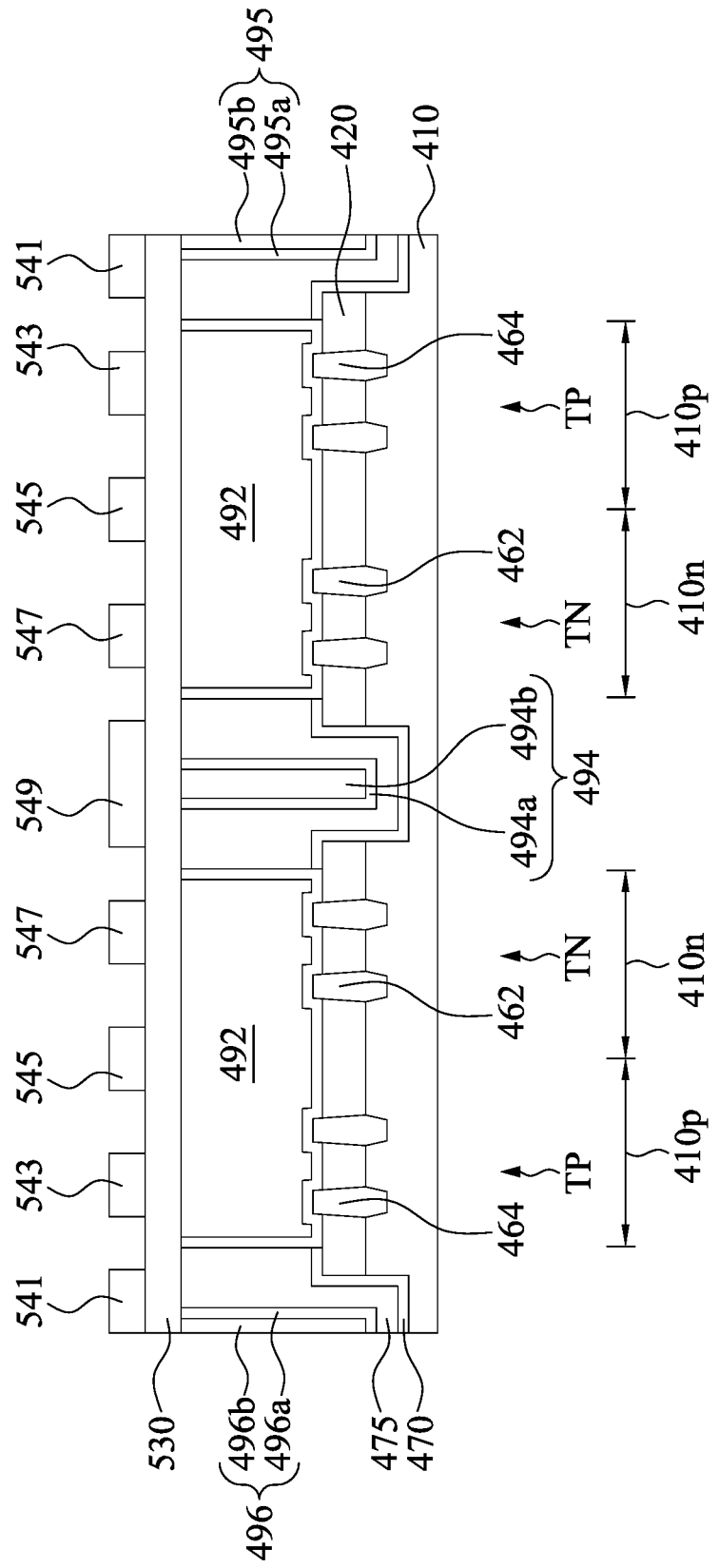
FIG. 22B is a cross-sectional view taken along line B-B in FIG. 22A.

FIG. 22A is a perspective view of a semiconductor device in accordance with some embodiments of the present disclosure, and FIG. 22B is a cross-sectional view taken along line B-B in FIG. 22A. The difference between the semiconductor devices in FIGS. 22A-22B and FIGS. 20A-20C pertains to the presence of the second ILD 510, the top buried conductive lines 524, 525, and 526, and the source/drain contacts 522. In FIGS. 22A and 22B, the second ILD 510, the top buried conductive lines 524, 525, and 526, and the source/drain contacts 522 (see FIG. 20B) are omitted, and the third ILD 530 is in direct contact with the first ILD 475. That is, there is only one level of the buried conductive lines. Other relevant structural details of the semiconductor device in FIGS. 22A and 22B are substantially the same as or similar to the semiconductor device in FIGS. 20A-20C, and, therefore, a description in this regard will not be repeated hereinafter.

Figure 23A:
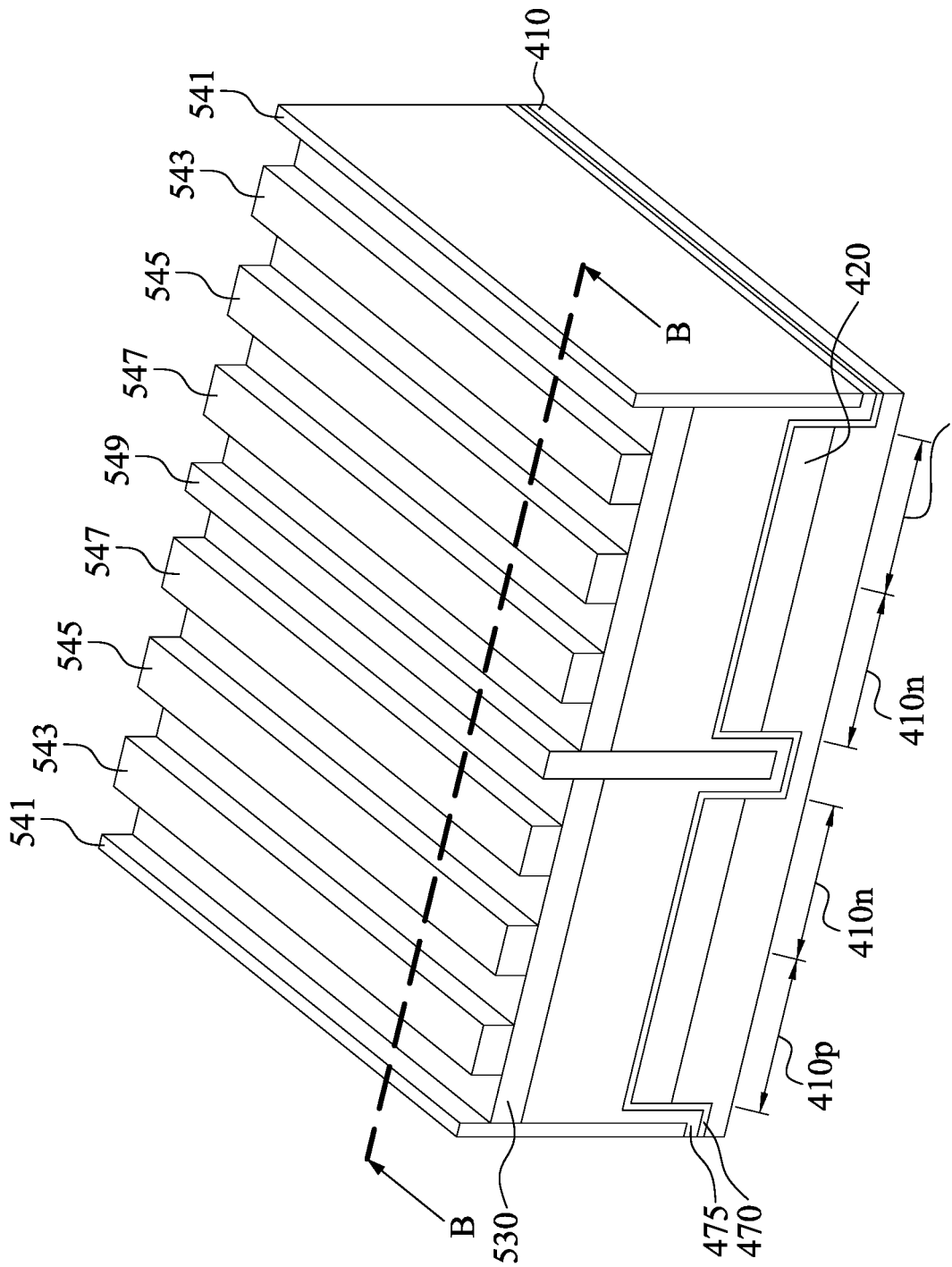
FIG. 23A is a perspective view of a semiconductor device in accordance with some embodiments of the present disclosure.
Figure 23B:
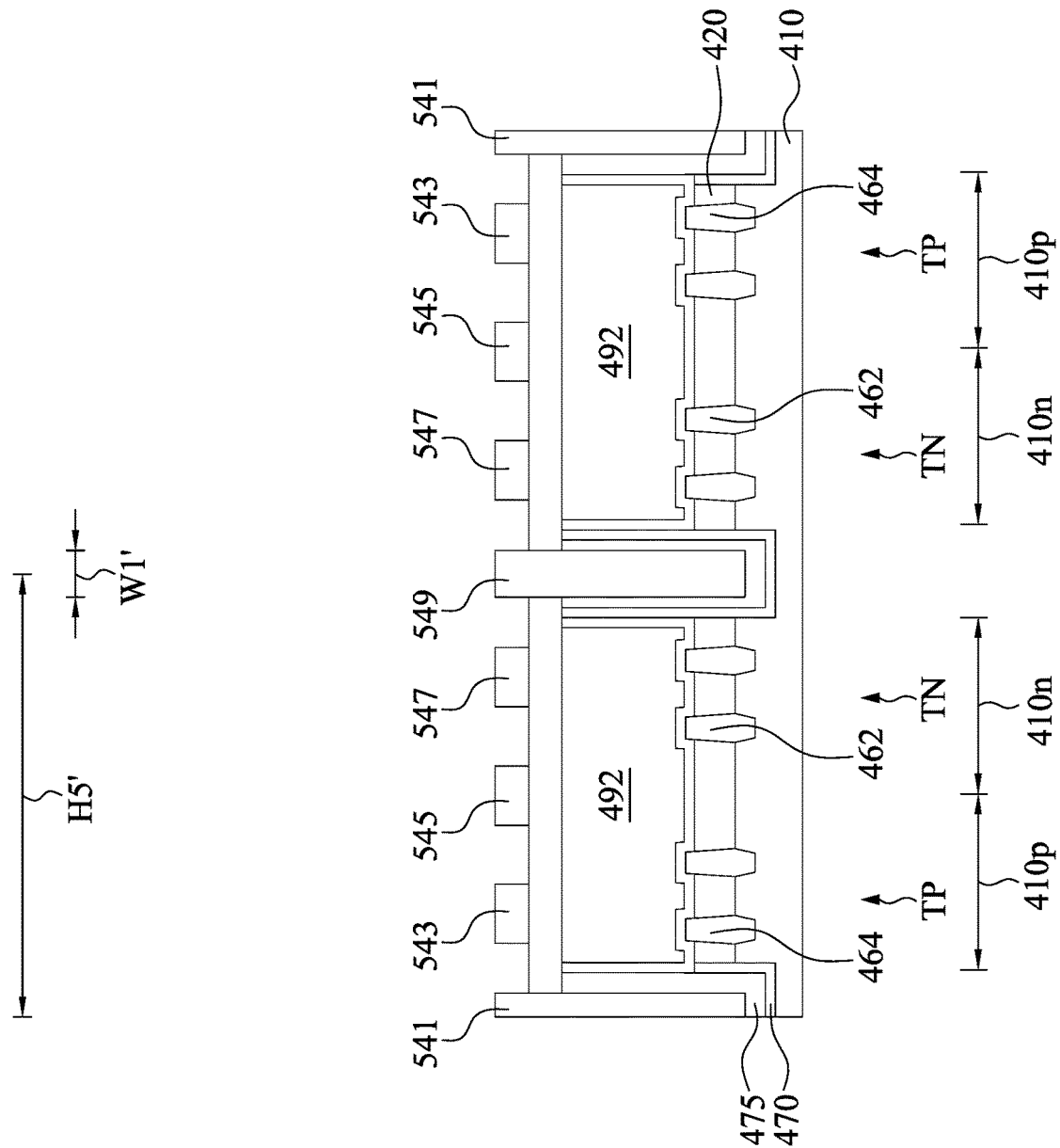
FIG. 23B is a cross-sectional view taken along line B-B in FIG. 23A.

FIG. 23A is a perspective view of a semiconductor device in accordance with some embodiments of the present disclosure, and FIG. 23B is a cross-sectional view taken along line B-B in FIG. 23A. The difference between the semiconductor devices in FIGS. 23A-23B and FIGS. 22A-22B pertains to the configuration of the conductive lines 541 and 549. In FIGS. 23A and 23B, the bottom buried conductive lines 494, 495, and 496 (see FIG. 22B) are omitted, and the conductive lines 541 and 549 extend into the first ILD 475. In FIGS. 23A and 23B, since the conductive lines 541 and 549 extend into the first ILD 475, the electrically conductivity thereof can be increased, and the width W1' of the conductive lines 541 and 549 can be reduced. With such configuration, the cell height H5' of the semiconductor device can be reduced. Other relevant structural details of the semiconductor device in FIGS. 23A and 23B are substantially the same as or similar to the semiconductor device in FIGS. 22A and 22B, and, therefore, a description in this regard will not be repeated hereinafter.

Figure 24A:
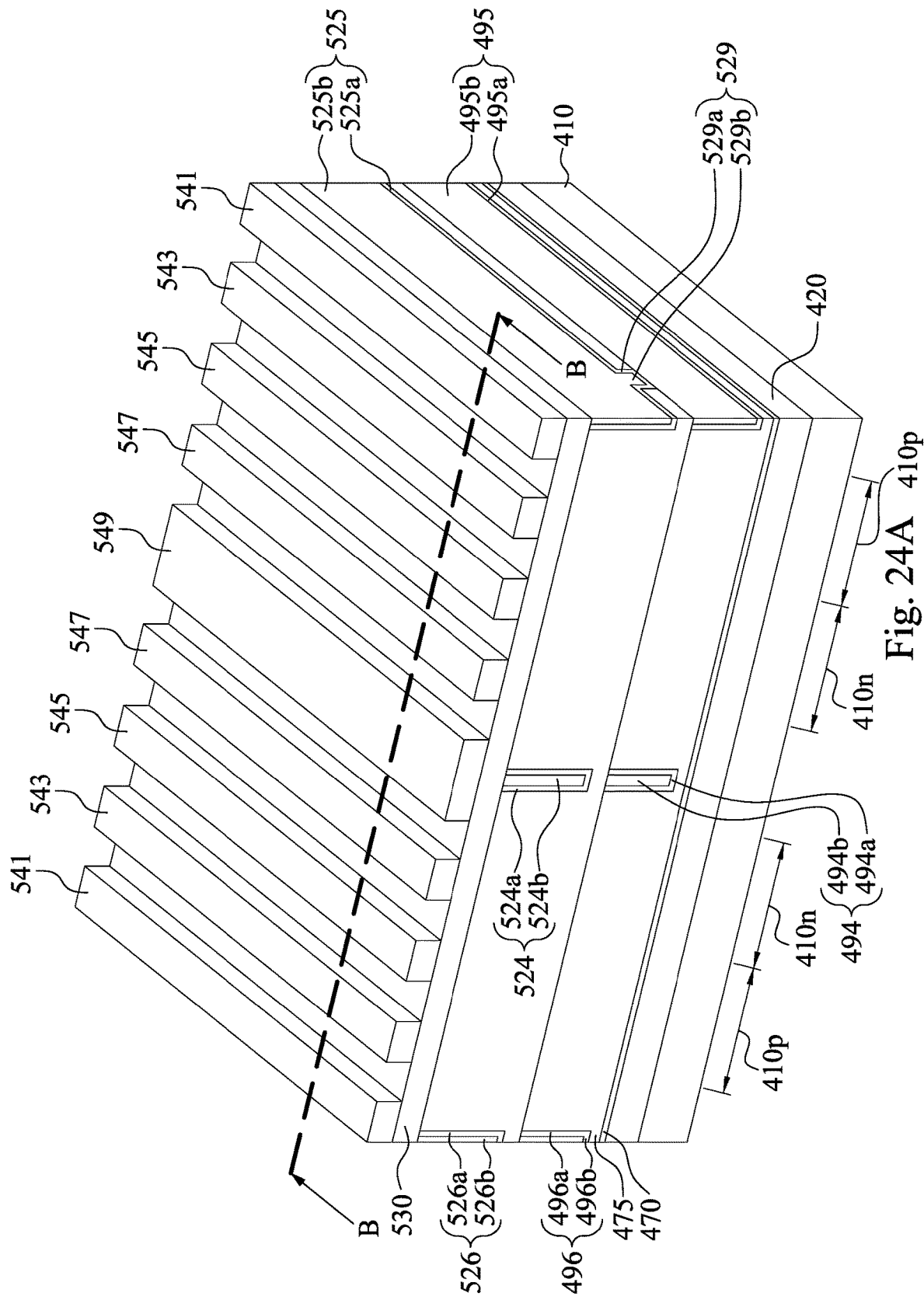
FIG. 24A is a perspective view of a semiconductor device in accordance with some embodiments of the present disclosure.
Figure 24B:
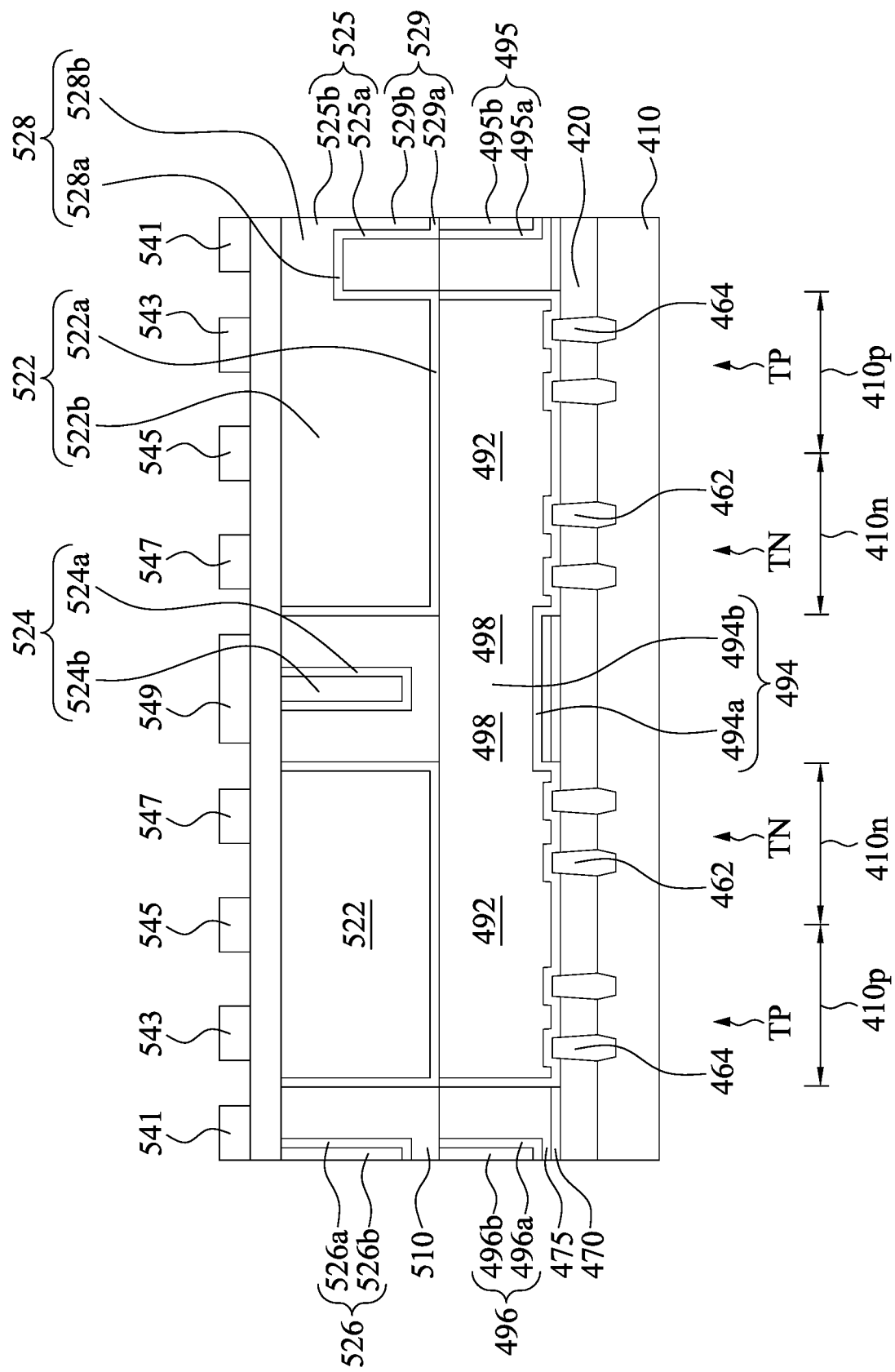
FIG. 24B is a cross-sectional view taken along line B-B in FIG. 24A.

FIG. 24A is a perspective view of a semiconductor device in accordance with some embodiments of the present disclosure, and FIG. 24B is a cross-sectional view taken along line B-B in FIG. 24A. The difference between the semiconductor devices in FIGS. 24A-24B and FIGS. 20A-20C pertains to the depth of the bottom buried conductive lines 494, 495, and 496. In FIGS. 24A and 24B, the etching process of the isolation structures 420 is omitted, such that the bottom buried conductive lines 494, 495, and 496 are formed above the isolation structures 420. Other relevant structural details of the semiconductor device in FIGS. 24A and 24B are substantially the same as or similar to the semiconductor device in FIGS. 20A-20C, and, therefore, a description in this regard will not be repeated hereinafter.

FIGS. 25A-28C illustrate a method for manufacturing a semiconductor device at various stages in accordance with some embodiments of the present disclosure. In some embodiments, the semiconductor device shown in FIGS. 25A-28C may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 25A:
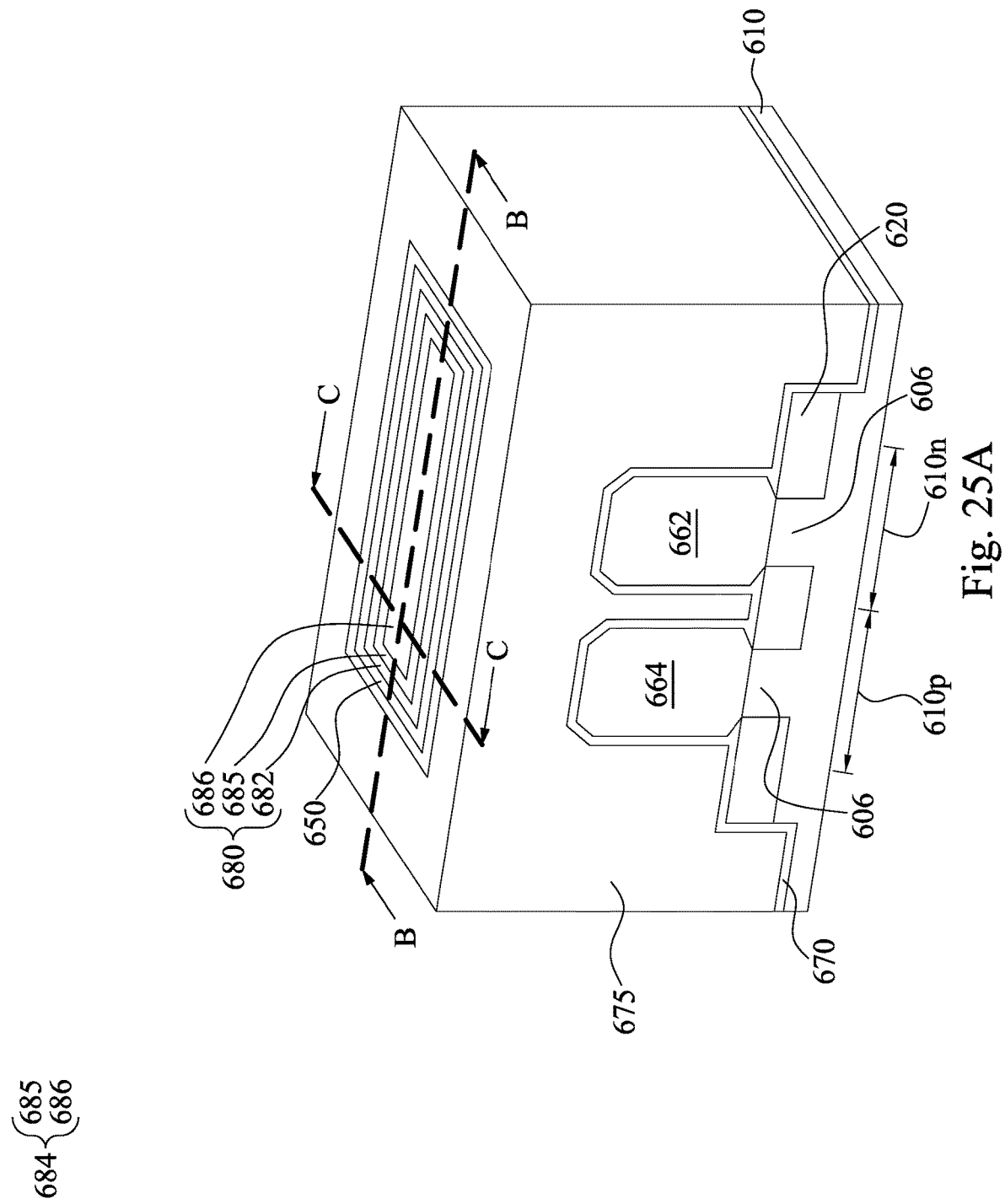
FIGS. 25A-28C illustrate a method for manufacturing a semiconductor device at various stages in accordance with some embodiments of the present disclosure.
Figure 25B:
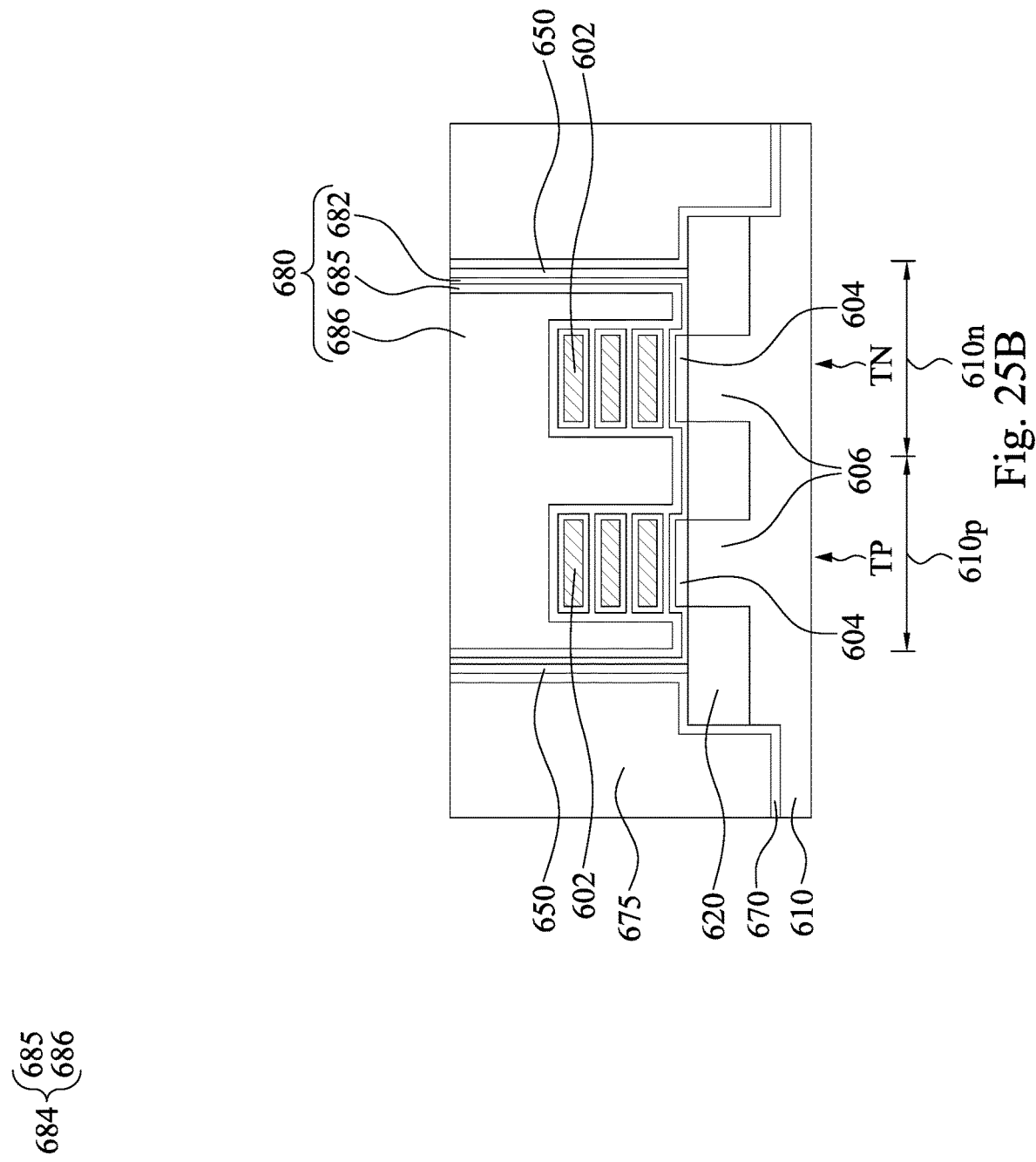
Figure 25C:
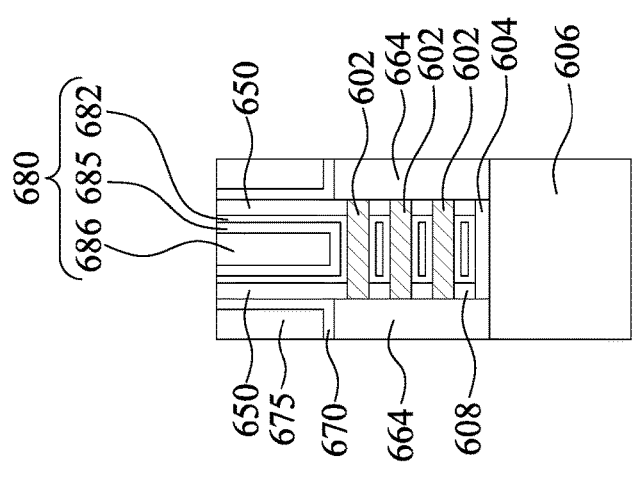

Reference is made to FIGS. 25A-25C, where FIG. 25B is a cross-sectional view taken along line B-B in FIG. 25A, and FIG. 25C is a cross-sectional view taken along line C-C in FIG. 25A. At least one N-type device TN and at least one P-type device TP are formed above a substrate 610. The N-type device TN and the P-type device TP are horizontal gate-all-around (HGAA) FETs in FIGS. 25A-25C. Specifically, the substrate 610 includes at least one N-type region 610n and at least one P-type region 610p. The N-type device TN is formed on the N-type region 610n, and the P-type device TP is formed on the P-type region 610p. For ease of explanation, it is assumed that in FIGS. 25A-28C, the substrate 610 includes a single one N-type region 610n and a single one P-type region 610p. The substrate 610 further includes base portions 606 extending upwards, and the base portions 606 may be fin structures.

In some embodiments, the substrate 610 and the substrate 210 in FIG. 2 may have the same or similar material, and, therefore, a description in this regard will not be repeated hereinafter. In some embodiments, isolation structures 620 are formed in the substrate 610 to separate various devices. The isolation structures 620 and the isolation structures 220 in FIG. 3 may have the same or similar material, and, therefore, a description in this regard will not be repeated hereinafter.

Each of the N-type device TN and P-type device TP includes semiconductor layers (or nanosheets or nanorods or nano-columns) 602 as channels of the N-type device TN and P-type device TP. The semiconductor layers 602 are above the substrate 610 and spaced apart from each other. In some embodiments, the semiconductor layers 602 may be pure silicon layers that are free from germanium. The semiconductor layers 602 may also be substantially pure silicon layers, for example, with a germanium percentage lower than about 1 percent. Furthermore, the semiconductor layers 602 may be intrinsic, which are not doped with p-type and n-type impurities. There may be two, three, four, or more of the semiconductor layers 602. In some other embodiments, however, the semiconductor layers 602 can be silicon germanium or germanium for p-type semiconductor device, or can be III-V materials, such as InAs, InGaAs, InGaAsSb, GaAs, InPSb, or other suitable materials.

In some embodiments, a bottom insulating layer 604 is formed between the bottommost semiconductor layer 602 and the base portion 606 of the substrate 610 to prevent current leakage from the semiconductor layer 602 to the substrate 610. The bottom insulating layer 604 may be made of silicon nitride, oxide, metal oxide, or other dielectric such as $SiC_xO_yN_z$. In some embodiments, the bottom insulating layer 604 may be formed by performing an ALD process or other suitable process.

A gate structure 680 is formed above the substrate 610 and encircles (wraps) the semiconductor layers 602. Spacer structures 650 are disposed on opposite sides of the gate structure 680. In some embodiments, the spacer structures 650 and the spacer structures 250 in FIG. 5 may have the same or similar material, and, therefore, a description in this regard will not be repeated hereinafter. The gate structure 680 includes a high-k gate dielectric layer 682, one or more work function metal layer 685, and a fill layer 686. The work function metal layer 685 and the fill layer 686 are referred to as a gate electrode 684. The high-k gate dielectric layer 682 conformally wraps the semiconductor layers 602. In some embodiments, the high-k gate dielectric layer 682 includes a material such as hafnium oxide ($HfO_2$), zirconium oxide ($ZrO_2$) or lanthanum oxide ($La_2O_3$). In some embodiments, the high-k gate dielectric layer 682 may be formed by performing an ALD process or other suitable process.

The work function metal layer 685 is conformally formed on the high-k gate dielectric layer, and the work function metal layer 685 surrounds the semiconductor layers 602 in some embodiments. The work function metal layer 685 may include materials such as TiN, TaN, TiAlSi, TiSiN, TiAl, TaAl, or other suitable materials. In some embodiments, the work function metal layer 685 may be formed by performing an ALD process or other suitable process. The fill layer 686 is formed above the work function metal layer 685. The fill layer 686 may include material such as tungsten or aluminum.

Epitaxial structures 662 and 664 are formed on opposite sidewalls of the semiconductor layers 602 and respectively above the N-type region 610n and P-type region 610p by performing, for example, a selectively growing process. In some embodiments, the epitaxial structures 662 and 664 and the epitaxial structures 262 and 264 in FIG. 5 may have the same or similar material, and, therefore, a description in this regard will not be repeated hereinafter.

In some embodiments, inner sidewall spacers 608 are formed between the gate structure 680 and the epitaxial structures 662 (664) to isolate the gate structure 680 from the epitaxial structures 662 (664). The inner sidewall spacers 608 may be made of silicon nitride, oxide, metal oxide, or other dielectric such as $SiC_xO_yN_z$. In some embodiments, the sidewall spacers 608 are formed by performing an ALD process or other suitable process. In some embodiments, a trimming process can be performed after the sidewall spacers 608 are deposited in order to remove portions of the sidewall spacers 608 external to the gate spacers 420.

A first interlayer dielectric (ILD) 675 is formed on the isolation structures 620, the epitaxial structures 662 and 664 and surrounds the gate structure 680. In some embodiments, the first ILD 675 and the first ILD 275 in FIGS. 7A-7B may have the same or similar material, and, therefore, a description in this regard will not be repeated hereinafter. In some other embodiments, a contact etching stop layer (CESL) 670 may be formed before the formation of the first ILD 675.

Figure 26:
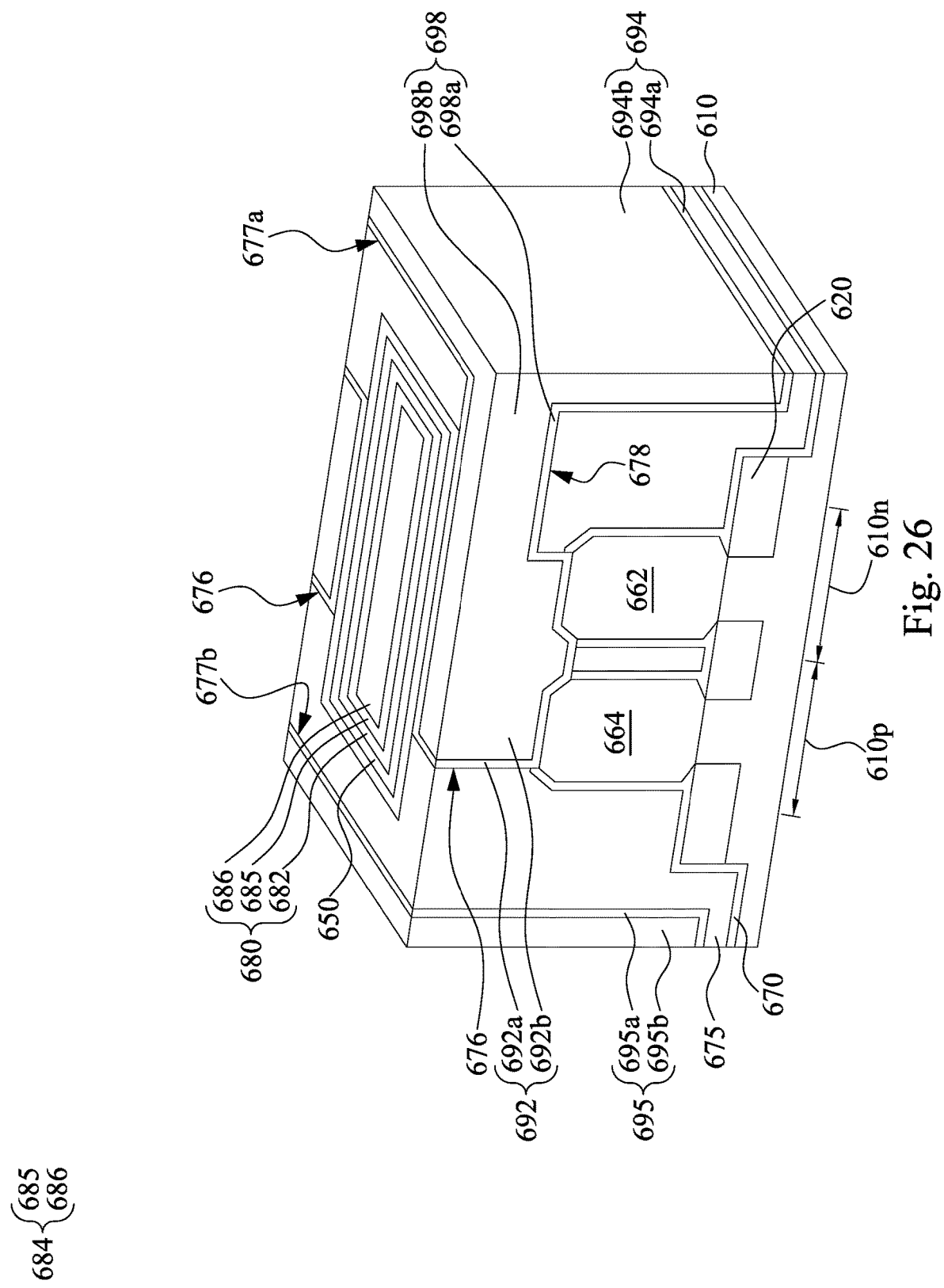

Reference is made to FIG. 26. The first ILD 675 is etched to form a plurality of contact openings 676, a plurality of trenches 677a, 677b, and at least one interconnection opening 678. Source/drain contacts 692, bottom buried conductive lines 694, 695, and at least one buried via 698 are respectively formed in the contact openings 676, the trenches 677a, 677b, and the interconnection opening 678. The aforementioned processes may be the same or similar to the processes shown in FIGS. 8A-9B, and, therefore, a description in this regard will not be repeated hereinafter.

Figure 27:
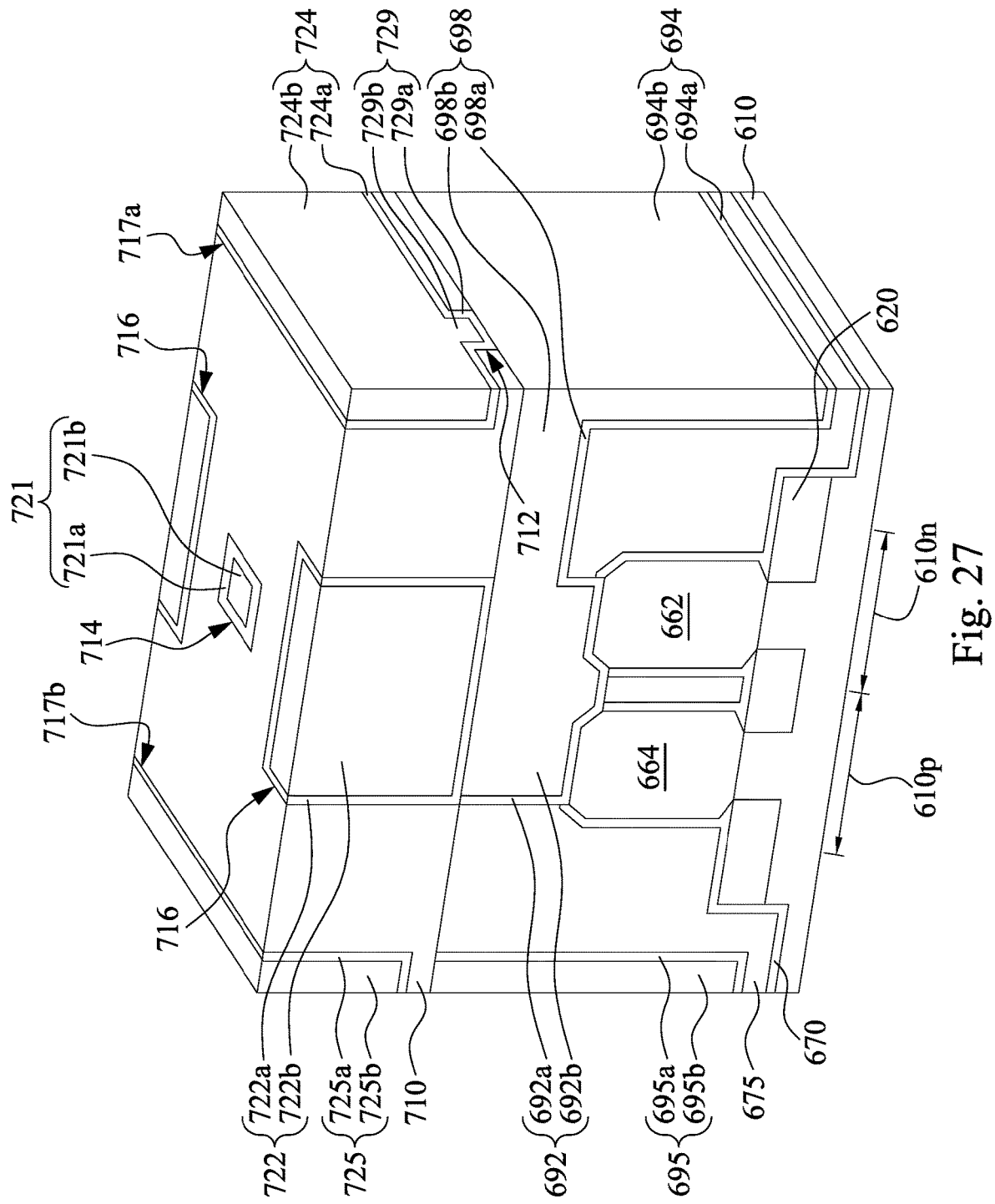

Reference is made to FIG. 27. A second interlayer dielectric (ILD) 710 is then formed on the structure of FIG. 26. Subsequently, the second ILD 710 is etched to form a plurality of gate openings 714, a plurality of contact openings 716, a plurality of trenches 717a, 717b, and at least one interconnection opening 712. Gate vias 721, source/drain contacts 722, top buried conductive lines 724, 725, and buried via 729 are respectively formed in the gate openings 714, the contact openings 716, the trenches 717a, 717b, and the interconnection opening 712. The aforementioned processes may be the same or similar to the processes shown in FIGS. 10A-11B, and, therefore, a description in this regard will not be repeated hereinafter.

Figure 28B:
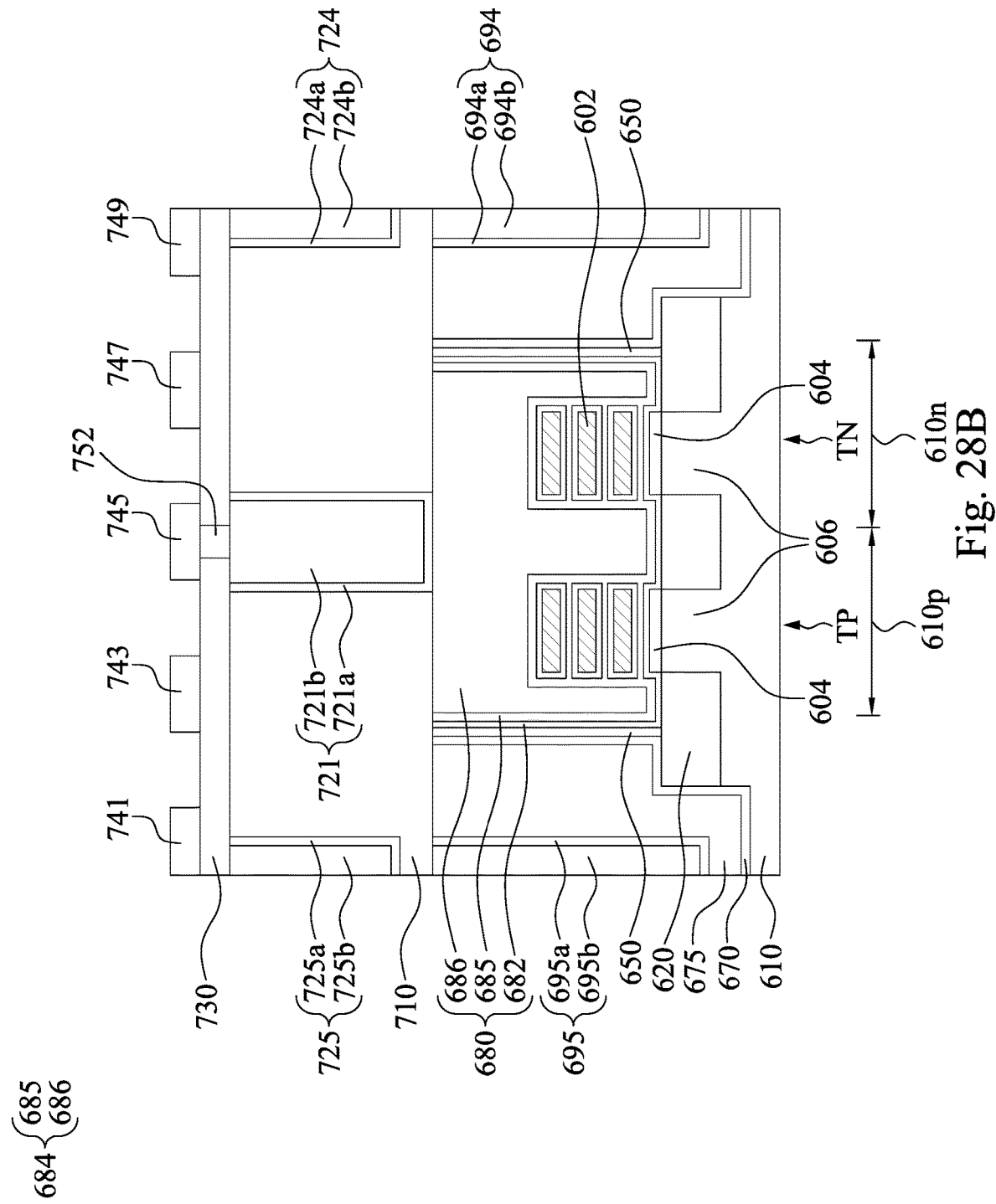
Figure 28C:
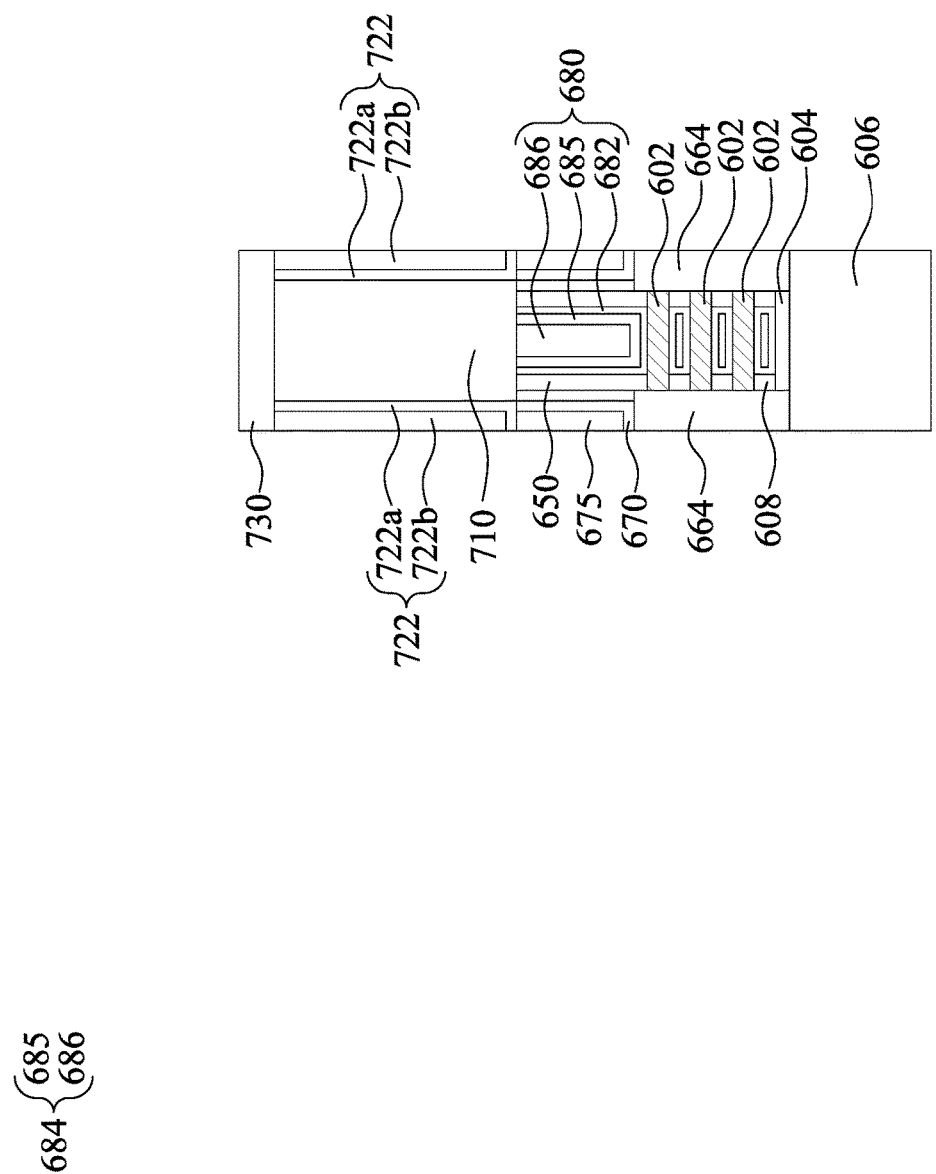

Reference is made to FIGS. 28A-28C, where FIG. 28B is a cross-sectional view taken along line B-B in FIG. 28A, and FIG. 28C is a cross-sectional view taken along line C-C in FIG. 28A. A third ILD 730 is then formed on the structure of FIG. 27A. A plurality of conductive lines 741, 743, 745, 747, and 749 are formed above the third ILD 730. The aforementioned processes may be the same or similar to the processes shown in FIGS. 12A-12B, and, therefore, a description in this regard will not be repeated hereinafter.

In some embodiments, the conductive lines 741 and 749 are power lines, and the conductive lines 743, 745, and 747 are signal lines. The conductive lines 741 and 749 may be shared with a cell adjacent the structure shown in FIG. 28A. The conductive lines 741, 743, 745, 747, and 749 may be electrically connected to the N-type device TN and/or P-type device TP through vias (e.g., the via 752) in the third ILD 730.

Figure 29:
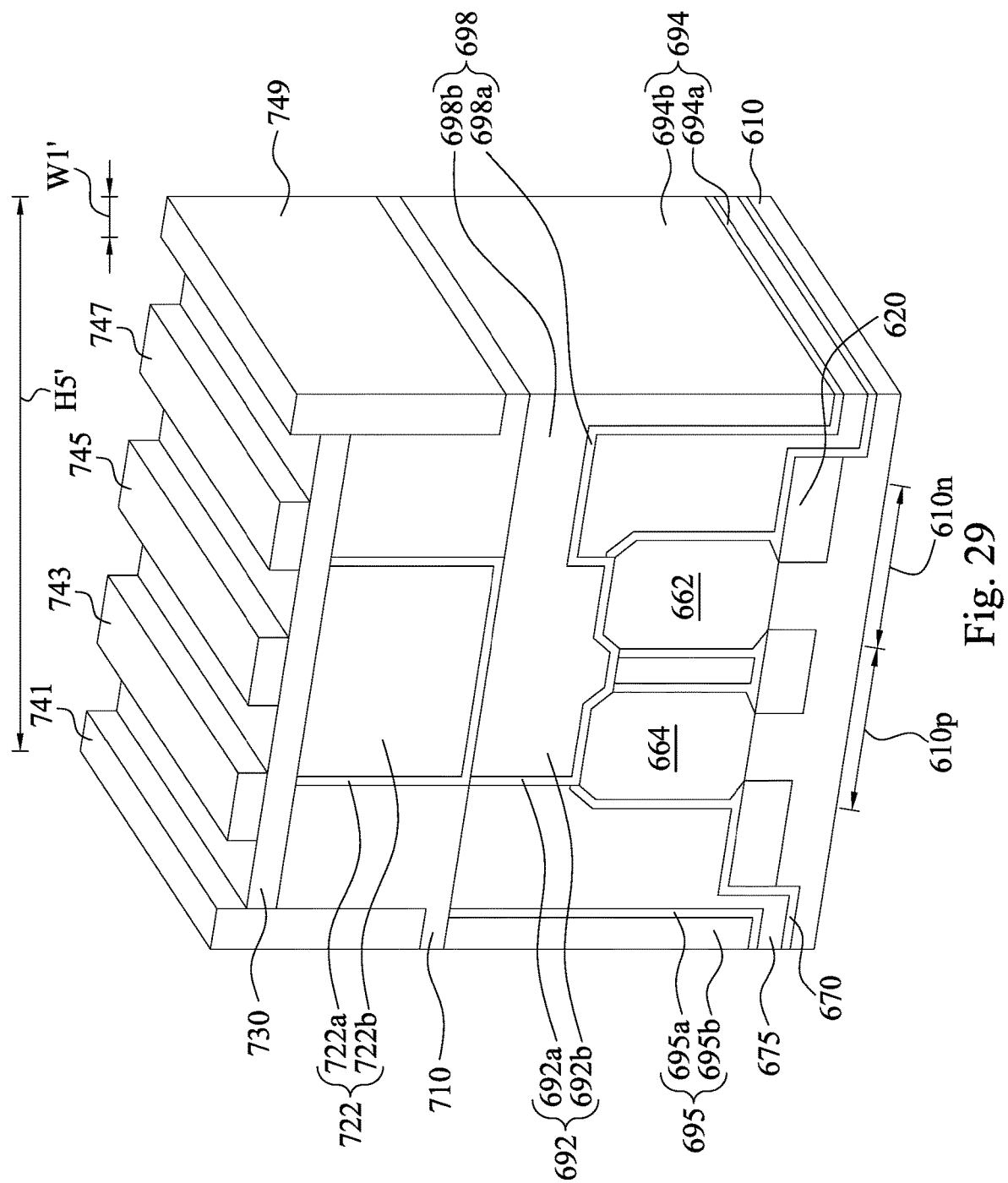
FIG. 29 is a perspective view of a semiconductor device in accordance with some embodiments of the present disclosure.

FIG. 29 is a perspective view of a semiconductor device in accordance with some embodiments of the present disclosure. The difference between the semiconductor devices in FIG. 29 and FIGS. 28A-28C pertains to the configuration of the conductive lines 741 and 749. In FIG. 29, the top buried conductive lines 724 and 725 (see FIG. 28B) are omitted, and the conductive lines 741 and 749 extend into the second ILD 710. In FIG. 29, since the conductive lines 741 and 749 extend into the second ILD 710, the electrically conductivity thereof can be increased, and the width W1' of the conductive lines 741 and 749 can be reduced. With such configuration, the cell height H5' of the semiconductor device can be reduced. Other relevant structural details of the semiconductor device in FIG. 29 are substantially the same as or similar to the semiconductor device in FIGS. 28A-28C, and, therefore, a description in this regard will not be repeated hereinafter.

Figure 30:
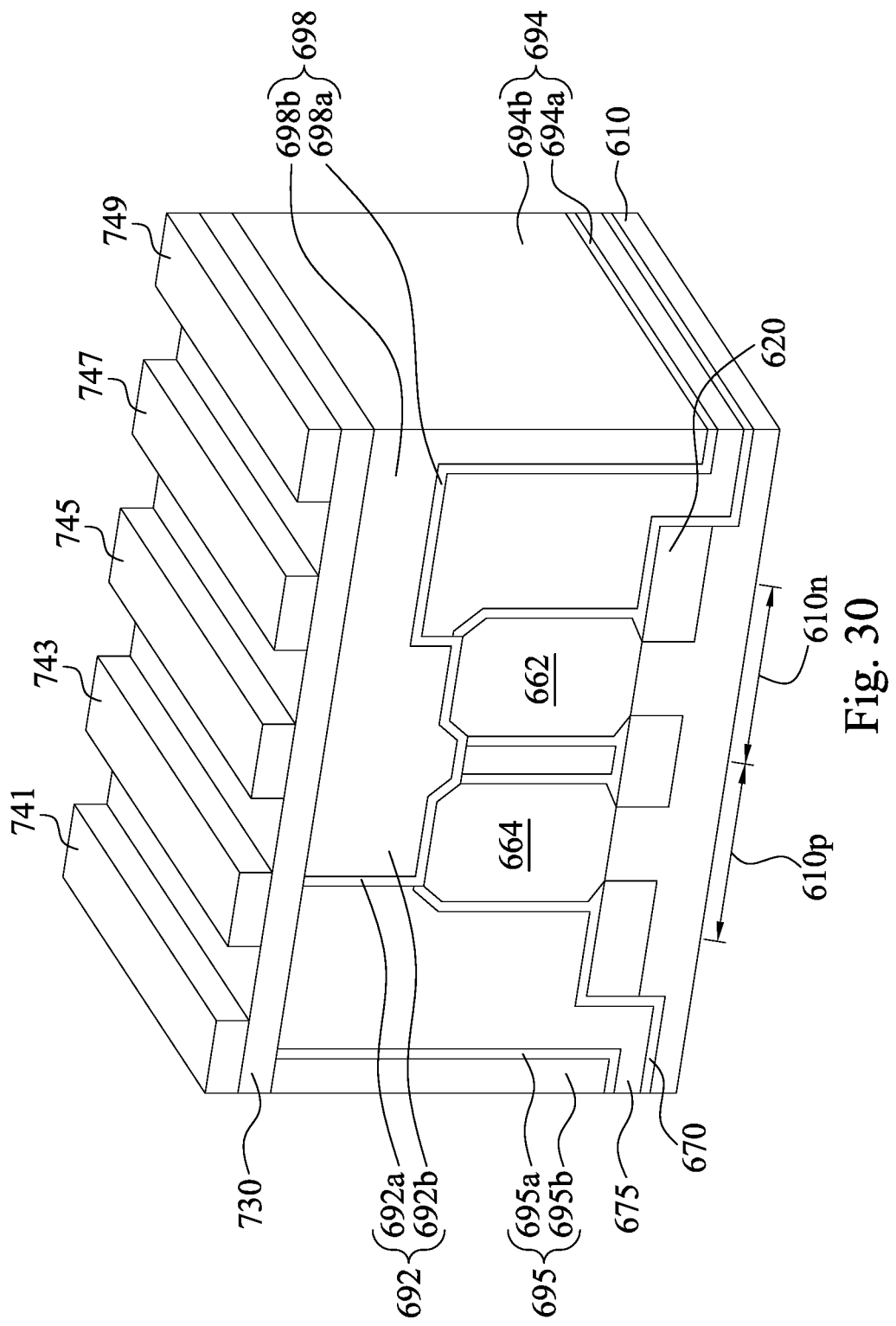
FIG. 30 is a perspective view of a semiconductor device in accordance with some embodiments of the present disclosure.

FIG. 30 is a perspective view of a semiconductor device in accordance with some embodiments of the present disclosure. The difference between the semiconductor devices in FIG. 30 and FIGS. 28A-28C pertains to the presence of the second ILD 710, the top buried conductive lines 724 and 725, and the source/drain contacts 722. In FIG. 30, the second ILD 710, the top buried conductive lines 724 and 725, and the source/drain contacts 722 (see FIG. 28B) are omitted, and third ILD 730 is in direct contact with the first ILD 675. That is, there is only one level of the buried conductive lines. Other relevant structural details of the semiconductor device in FIG. 30 are substantially the same as or similar to the semiconductor device in FIGS. 28A-28C, and, therefore, a description in this regard will not be repeated hereinafter.

Figure 31:
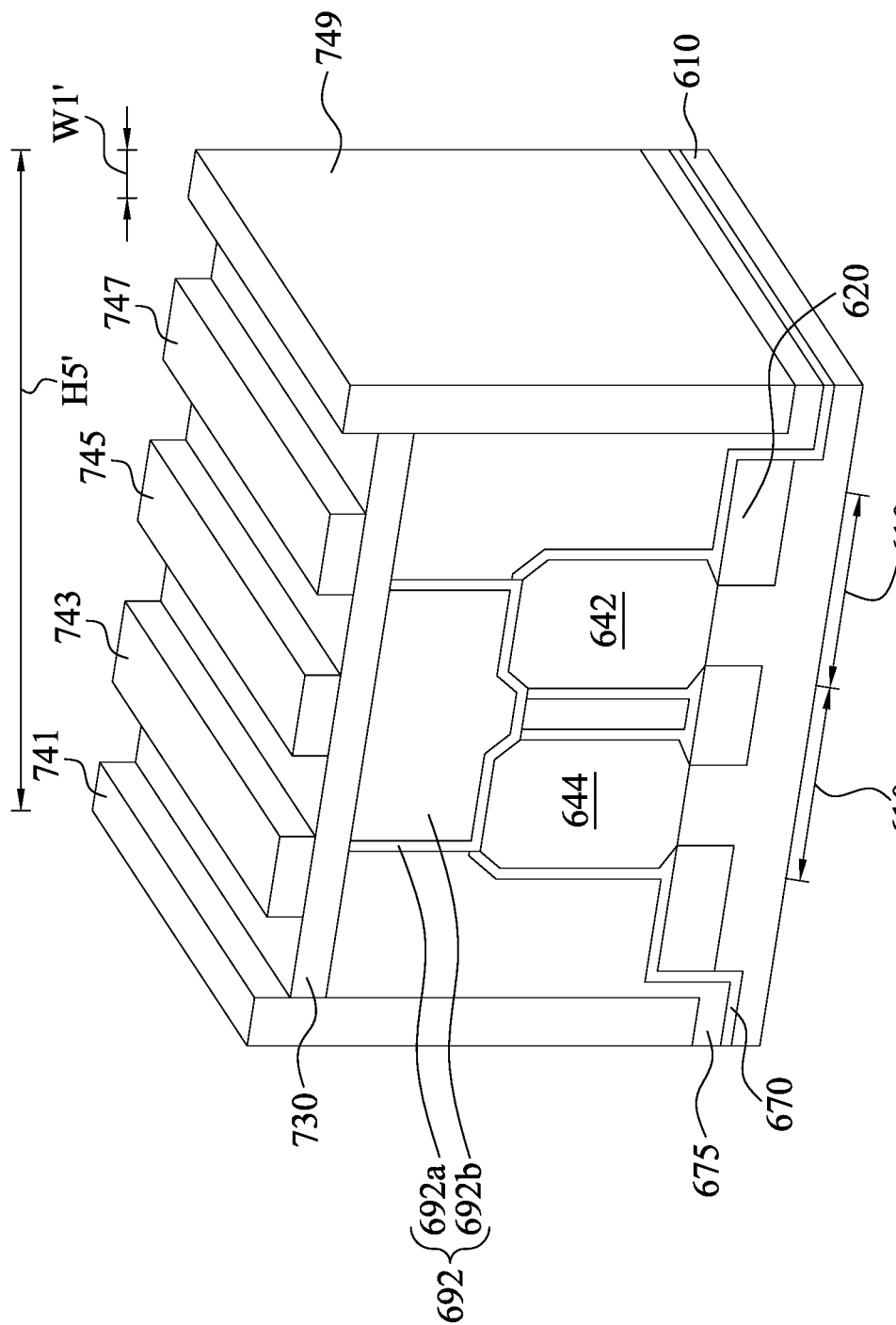
FIG. 31 is a perspective view of a semiconductor device in accordance with some embodiments of the present disclosure.

FIG. 31 is a perspective view of a semiconductor device in accordance with some embodiments of the present disclosure. The difference between the semiconductor devices in FIG. 31 and FIG. 30 pertains to the configuration of the conductive lines 741 and 749. In FIG. 31, the bottom buried conductive lines 694 and 695 (see FIG. 30B) are omitted, and the conductive lines 741 and 749 extend into the first ILD 675. In FIG. 31, since the conductive lines 741 and 749 extend into the first ILD 675, the electrically conductivity thereof can be increased, and the width W1' of the conductive lines 741 and 749 can be reduced. With such configuration, the cell height H5' of the semiconductor device can be reduced. Other relevant structural details of the semiconductor device in FIG. 31 are substantially the same as or similar to the semiconductor device in FIG. 30, and, therefore, a description in this regard will not be repeated hereinafter.

Figure 32:
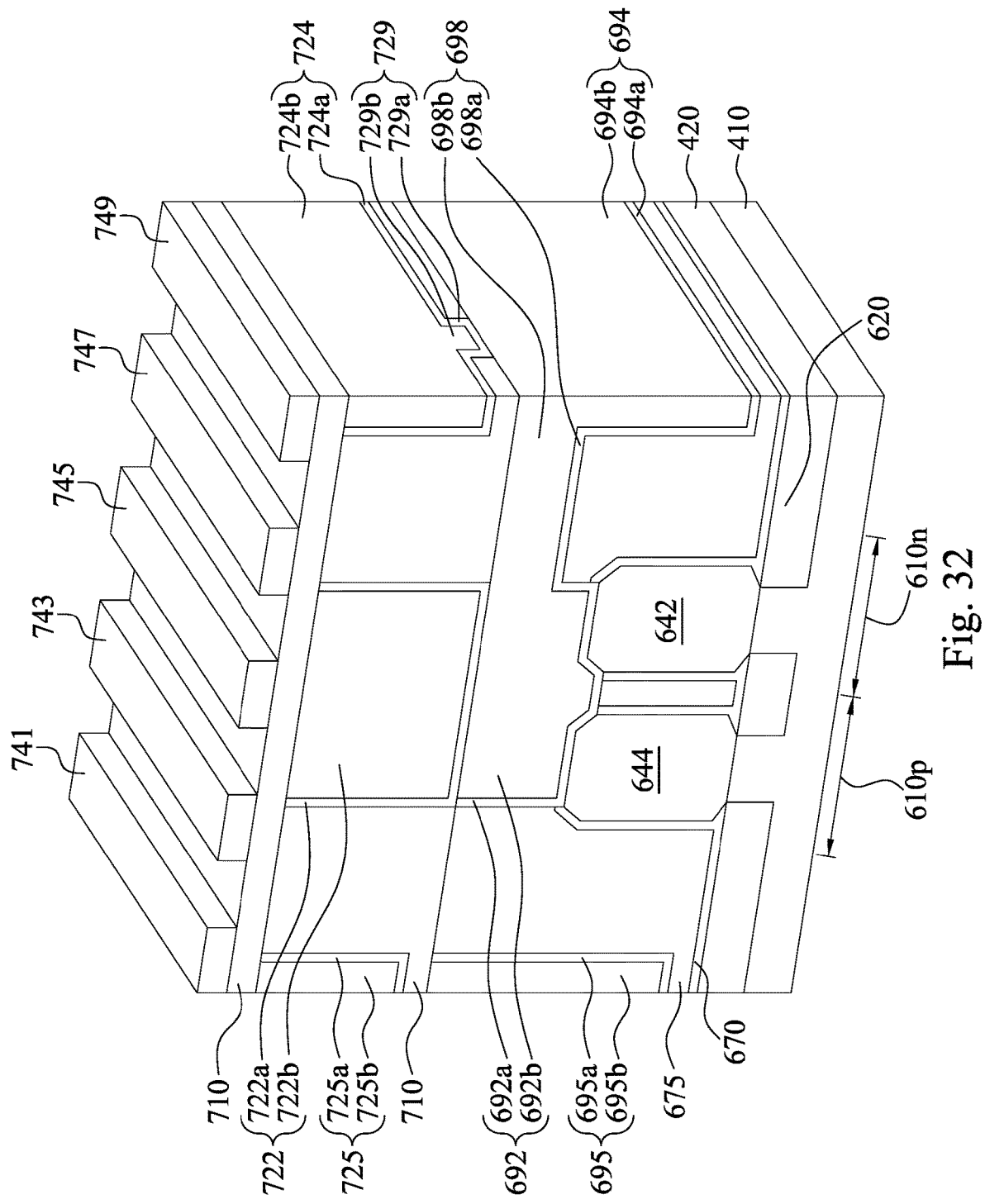
FIG. 32 is a perspective view of a semiconductor device in accordance with some embodiments of the present disclosure.

FIG. 32 is a perspective view of a semiconductor device in accordance with some embodiments of the present disclosure. The difference between the semiconductor devices in FIG. 32 and FIGS. 28A-28C pertains to the depth of the bottom buried conductive lines 694 and 695. In FIG. 32, the etching process of the isolation structures 620 is omitted, such that the bottom buried conductive lines 694 and 695 are formed above the isolation structures 620. Other relevant structural details of the semiconductor device in FIG. 32 are substantially the same as or similar to the semiconductor device in FIGS. 28A-28C, and, therefore, a description in this regard will not be repeated hereinafter.

Figure 33:
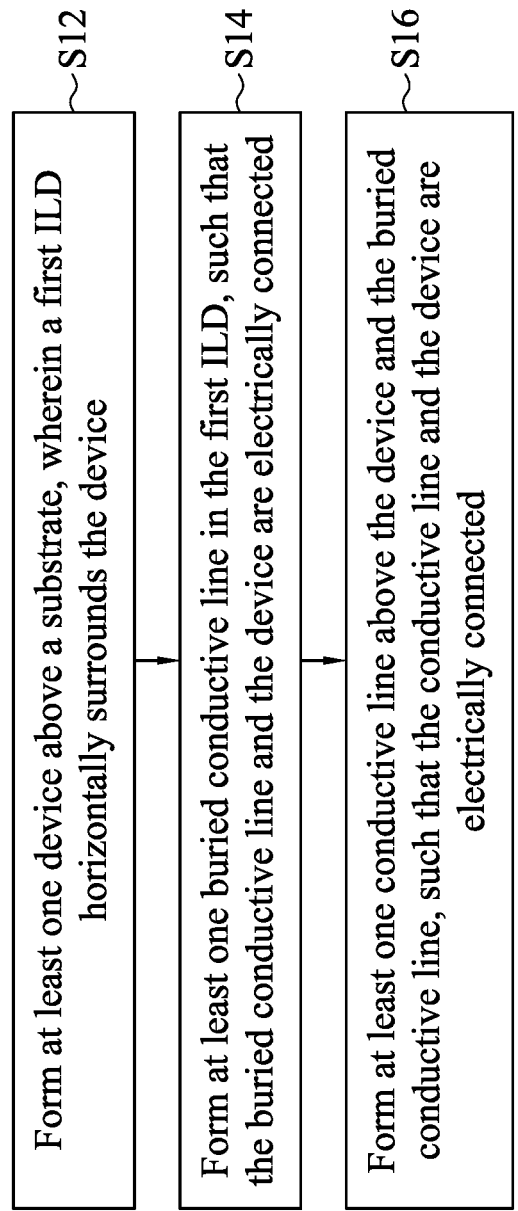
FIG. 33 is a flow chart of a method for forming a semiconductor device in accordance with some embodiments of the present disclosure.

FIG. 33 is a flow chart of a method M1 for forming a semiconductor device in accordance with some embodiments of the present disclosure. Although the method M1 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S12, at least one device is formed above a substrate, wherein a first ILD horizontally surrounds the device. FIGS. 7A, 17A, and 25A illustrate perspective views of some embodiments corresponding to act in block S12. In some embodiments, the device may be a transistor, e.g., the N-type device TN in FIGS. 7A, 17A, and 25A and/or the P-type device TP in FIGS. 7A, 17A, and 25A. At block S14, at least one buried conductive line is formed in the first ILD, such that the buried conductive line and the device are electrically connected. FIGS. 9A, 18A, and 26 illustrate perspective views of some embodiments corresponding to act in block S14. At block S16, at least one conductive line is formed above the device and the buried conductive line, such that the conductive line and the device are electrically connected. FIGS. 12A, 20A, and 28A illustrate perspective views of some embodiments corresponding to act in block S16.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that since the semiconductor device includes the top and/or bottom buried conductive lines, internal electrically connection between transistors can be achieved by using the top and/or bottom buried conductive lines. Another advantage is that the top and/or bottom buried conductive lines are directly under the power lines, the top and/or bottom buried conductive lines does not occupy the layout area of the semiconductor device, and a cell height of the semiconductor device can be reduced. Furthermore, the cell height can be further reduced when the power lines extend into the underneath ILD.

According to some embodiments, a device includes a transistor, an insulating structure, a buried conductive line, and a buried via. The transistor is above a substrate and includes a source/drain region and a source/drain contact above the source/drain region. The insulating structure is above the substrate and laterally surrounds the transistor. The buried conductive line is in the insulating structure and spaced apart from the transistor. The buried via is in the insulating structure and interconnects the transistor and the buried conductive line. A height of the buried conductive line is greater than a height of the source/drain contact.

According to some embodiments, a device includes a transistor, an insulating structure, a first conductive line, and a second conductive line. The transistor is above a substrate. The insulating structure is above the substrate and laterally surrounds the transistor. The first conductive line is above the insulating structure and the transistor. The second conductive line is above the substrate and partially buried in the insulating structure. The first and second conductive lines extend in a first direction. Top surfaces of the first and second conductive lines are substantially coplanar. A height of the second conductive line is greater than a height of the first conductive line.

According to some embodiments, a method for manufacturing a device includes forming a transistor above a substrate. A first trench is formed in the substrate. An insulating structure is formed above the substrate, surrounding the transistor, and partially in the first trench. A second trench is formed in the insulating structure. The second trench does not expose the transistor. A first buried conductive line is formed in the first trench and adjacent the transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a transistor above a substrate, wherein the transistor comprises:
      a source/drain region; and
      a source/drain contact above the source/drain region;
   an insulating structure above the substrate and laterally surrounding the transistor;
   a buried conductive line in the insulating structure and spaced apart from the transistor; and
   a buried via in the insulating structure and interconnecting the transistor and the buried conductive line, wherein a height of the buried conductive line is greater than a height of the source/drain contact, and a top surface of the buried conductive line is substantially coplanar with a top surface of the buried via.

2. The device of claim 1, wherein the source/drain contact is spaced apart from the buried conductive line.

3. The device of claim 1, wherein the buried via is in direct contact with the buried conductive line and the source/drain contact.

4. The device of claim 2, wherein a bottom surface of the buried conductive line is lower than a bottom surface of the source/drain contact.

5. The device of claim 2, wherein the top surface of the buried conductive line is higher than a top surface of the source/drain contact.

6. The device of claim 1, wherein the transistor further comprises a gate structure, and the buried via is in direct contact with the buried conductive line and the gate structure.

7. The device of claim 6, wherein the gate structure and the buried conductive line extend in different directions.

8. The device of claim 1, wherein the insulating structure comprises:
   an isolation structure above the substrate; and
   an interlayer dielectric above the isolation structure.

9. The device of claim 8, wherein a bottom surface of the buried conductive line is lower than a top surface of the isolation structure.

10. The device of claim 8, wherein the top surface of the buried conductive line and a top surface of the interlayer dielectric are substantially coplanar.

11. A device comprising:
    a transistor above a substrate, wherein the transistor comprises source and drain regions, a channel between the source and drain regions, and a gate structure, and at least a portion of the gate structure of the transistor is directly above the channel of the transistor;
    an insulating structure above the substrate and laterally surrounding the transistor, wherein the insulating structure comprises:
       an isolation structure above the substrate; and
       an interlayer dielectric above the isolation structure, and a portion of the interlayer dielectric is lower than the isolation structure;
    a first conductive line above the insulating structure and the transistor, wherein a bottom surface of the first conductive line is higher than a top surface of the gate structure of the transistor; and
    a second conductive line above the substrate and partially buried in the insulating structure, wherein the first and second conductive lines extend in a first direction, top surfaces of the first and second conductive lines are substantially coplanar, and a height of the second conductive line is greater than a height of the first conductive line.

12. The device of claim 11, wherein a width of the second conductive line is not greater than a width of the first conductive line.

13. The device of claim 11, wherein a bottom surface of the second conductive line is lower than a bottom surface of the insulating structure.

14. The device of claim 11, further comprising a buried conductive line directly under the second conductive line, wherein the buried conductive line is adjacent the transistor.

15. The device of claim 11, wherein the second conductive line extends into the interlayer dielectric of the insulating structure.

16. A method for manufacturing a device comprising:
    forming a transistor above a substrate;
    forming a first trench in the substrate;
    forming an insulating structure above the substrate, surrounding the transistor, and partially in the first trench;
    forming a second trench and a contact opening in the insulating structure, wherein the second trench does not expose the transistor, and the contact opening exposes a source/drain region of the transistor; and
    after forming the second trench and the contact opening, filling the second trench and the contact opening with a conductive material to form a first buried conductive line in the second trench and adjacent the transistor, and to form a source/drain contact above the source/drain region of the transistor.

17. The method of claim 16, wherein the first buried conductive line is directly formed above a portion of the insulating structure in the first trench.

18. The method of claim 16, further comprising:
    forming a first dielectric layer above the first buried conductive line; and
    forming a power line above the first dielectric layer and directly above the first buried conductive line.

19. The method of claim 18, further comprising:
    forming a second dielectric layer above the first buried conductive line prior to forming the first dielectric layer; and
    forming a second buried conductive line in the second dielectric layer and directly above the first buried conductive line.

20. The method of claim 16, further comprising:
    forming an opening in the insulating structure; and
    forming a buried via in the insulating structure such that the buried via interconnects the first buried conductive line and the transistor.

* * * * *